United States Patent
Suzuki et al.

[11] Patent Number: 6,035,111
[45] Date of Patent: Mar. 7, 2000

[54] MANUFACTURING METHOD AND APPARATUS OF A SEMICONDUCTOR INTEGRATED CIRCUIT DEVICE

[75] Inventors: Rieko Suzuki; Kiyoshi Saida; Kazushige Itazu; Eiji Fujine; Yoshihiro Kamiya; Yoshitaka Uchida; Takako Murakami; Teruhisa Tsuyuki; Kazunori Kawazoe; Takeshi Shimazaki; Yukimi Nishiwaki, all of Kasugai, Japan

[73] Assignees: Fujitsu Limited, Kawasaki; Fujitsu VLSI Limited, Kasugai, both of Japan

[21] Appl. No.: 08/748,534

[22] Filed: Nov. 13, 1996

Related U.S. Application Data

[62] Division of application No. 08/124,702, Sep. 22, 1993, Pat. No. 5,618,744.

[30] Foreign Application Priority Data

| Sep. 22, 1992 | [JP] | Japan | 4-253046 |
| Sep. 25, 1992 | [JP] | Japan | 4-257009 |
| Sep. 28, 1992 | [JP] | Japan | 4-258588 |
| Nov. 17, 1992 | [JP] | Japan | 4-307224 |
| Mar. 19, 1993 | [JP] | Japan | 5-60774 |
| May 18, 1993 | [JP] | Japan | 5-116168 |
| Jun. 14, 1993 | [JP] | Japan | 5-142347 |

[51] Int. Cl.[7] ............................................. G06F 17/50
[52] U.S. Cl. ......................... 395/500.12; 395/500.09
[58] Field of Search ............................ 364/488, 489, 364/490, 491, 578; 395/500

[56] References Cited

U.S. PATENT DOCUMENTS

| 4,516,312 | 5/1985 | Tomita | 438/128 |
| 4,593,363 | 6/1986 | Burstein et al. | 364/491 |
| 4,839,821 | 6/1989 | Murakata | 364/491 |
| 5,012,427 | 4/1991 | Kuribayashi | 364/490 |
| 5,062,067 | 10/1991 | Schaefer et al. | 364/578 |
| 5,075,753 | 12/1991 | Kozono | 257/207 |
| 5,081,059 | 1/1992 | Ohe | 438/128 |
| 5,212,107 | 5/1993 | Suzuki et al. | 437/51 |
| 5,212,403 | 5/1993 | Nakanishi et al. | 257/664 |
| 5,224,057 | 6/1993 | Igarashi et al. | 364/490 |
| 5,322,438 | 6/1994 | McNutt et al. | 364/489 |
| 5,397,749 | 3/1995 | Igarashi | 364/491 |

FOREIGN PATENT DOCUMENTS

| 22 46138 | 10/1990 | Japan . |
| 31 48132 | 6/1991 | Japan . |

*Primary Examiner*—Kevin J. Teska
*Assistant Examiner*—Vuthe Siek
*Attorney, Agent, or Firm*—Armstrong, Westerman, Hattori, McLeland & Naughton

[57] ABSTRACT

According to the present invention, using a computer aided design system for designing semiconductor integrated circuits wherein a plurality of logic cells forming a circuit net are disposed on a semiconductor chip according to a net list specifying a connection pattern assigned among input and output terminals of a plurality of logic cells and a wiring length connecting the terminals.

9 Claims, 67 Drawing Sheets

FIG. 5 Terminal information table

| Terminal name | Al poly-layer group number α | Al group number β | Unequal potential Al alloy line existing or non existing γ |
|---|---|---|---|
| TA11 | 1 | 1 | Non existing |
| TA12 | 1 | 1 | existing |
| TA13 | 1 | 1 | Non existing |
| TA14 | 1 | 2 | Non existing |
| TA15 | 1 | 3 | Non existing |
| TA16 | 1 | 3 | existing |
| TA21 | 1 | 1 | Non existing |
| TA22 | 2 | 2 | Non existing |
| TA23 | 2 | 2 | Non existing |
| ----- | ----- | ----- | ----- |

FIG. 7

Terminal information table

| Registered terminal name | Aℓ, poly-layer group number α | Aℓ group number β | Unequal potential Aℓ alloy line existing or non existing γ |
|---|---|---|---|
| A1 | 1 | 1 | Non existing |
| A2 | 1 | 1 | Non existing |
| L1ₐ | 1 | 1 | Non existing |
| L1ᵦ | 1 | 1 | Non existing |
| L1c | 1 | 1 | Non existing |
| L1d | 1 | 1 | Non existing |
| A3 | 1 | 2 | existing |
| A4 | 1 | 3 | Non existing |
| A5 | 1 | 3 | Non existing |
| L2 | 1 | 3 | Non existing |
| A6 | 1 | 4 | Non existing |
| A7 | 1 | 5 | Non existing |
| B1 | 2 | 6 | Non existing |
| B2 | 2 | 6 | Non existing |
| L3ₐ | 2 | 6 | Non existing |
| L3ᵦ | 2 | 6 | Non existing |
| L3c | 2 | 6 | Non existing |

| | 360A | 360B | 360C |
|---|---|---|---|
| 360A | | | |
| 360B | 20 | | |
| 360C | 100 | 40 | |

| | 360A | 360B | 360C |
|---|---|---|---|
| 360A | | | |
| 360B | 20 | | |
| 360C | 60 | 40 | |

| | 360A | 360B | 360C | 360D |
|---|---|---|---|---|
| 360A | | | | |
| 360B | 20 | | | |
| 360C | -1 | 40 | | |
| 360D | 50 | -1 | 50 | |

| | 360A | 360B | 360C | 360D |
|---|---|---|---|---|
| 360A | | | | |
| 360B | 20 | | | |
| 360C | 60 | 40 | | |
| 360D | 50 | 70 | 50 | |

FIG. 31
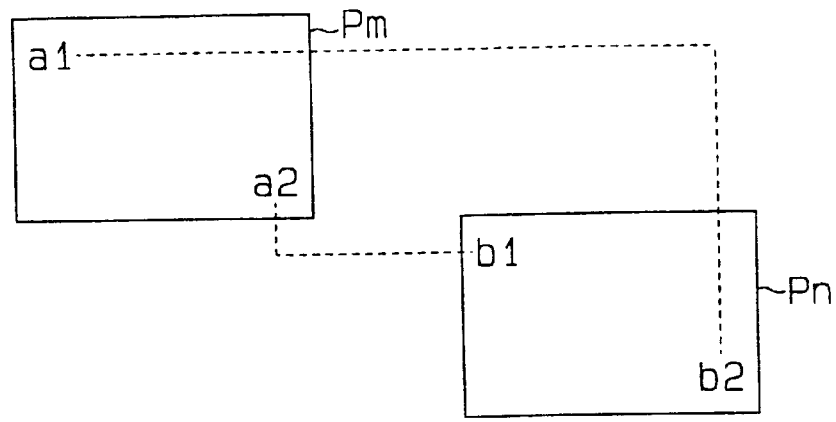
FIG. 32
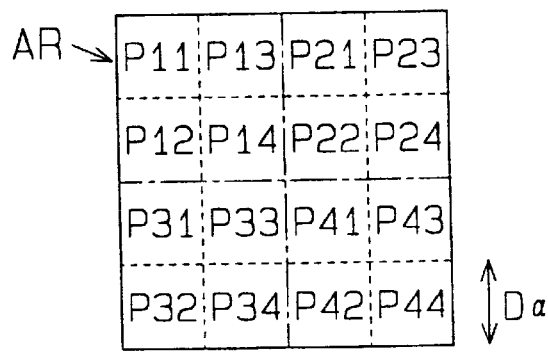
FIG. 33
| Objective region | Most shortened distance | Most lenghened distance |
|---|---|---|
| P1 | 0 | 90 |
| P2 | 0 | 60 |
| P3 | 0 | 120 |
| P4 | 0 | 90 |

FIG. 34
| Objective region | Shortest distance | Longest distance |
|---|---|---|
| P21 | 0 | 60 |
| P22 | 0 | 45 |
| P23 | 15 | 75 |
| P24 | 15 | 60 |
FIG. 35
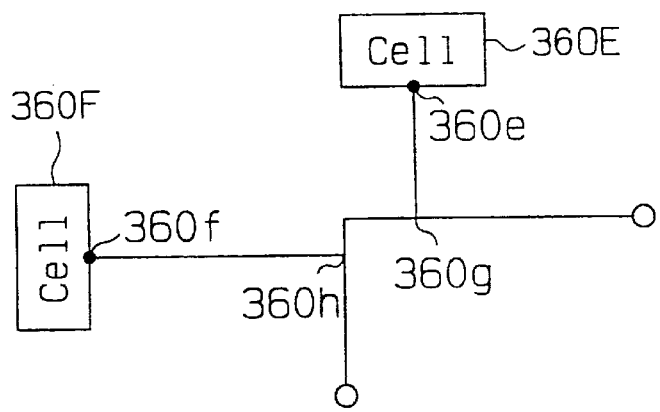
FIG. 36
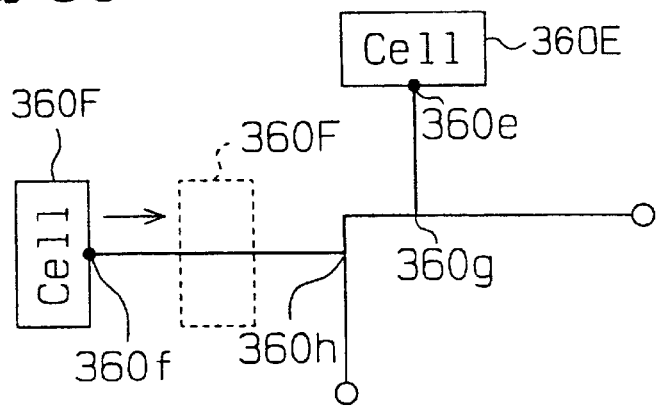

(Position determination diagram)

3 is set to the position G
in the determination diagram

FIG. 62
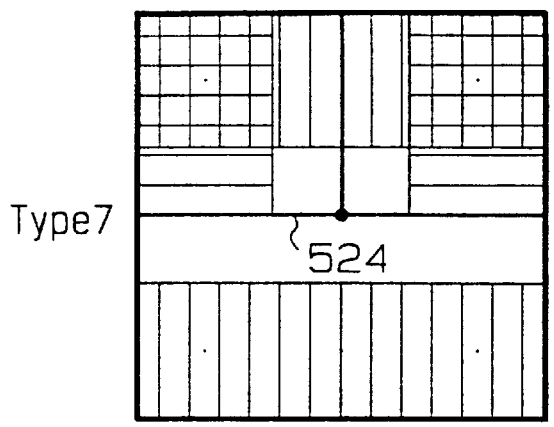
Type7  524
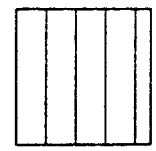 : First layer
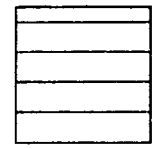 : Second layer
FIG. 63
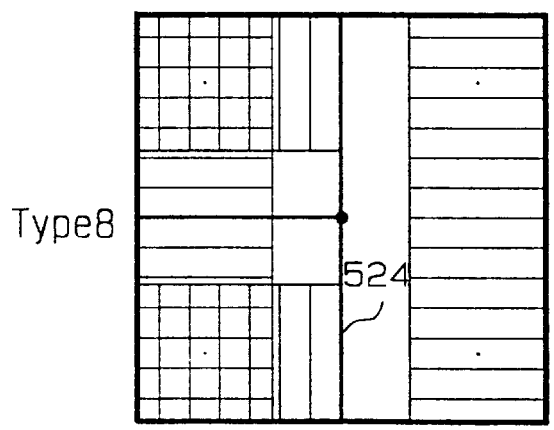
Type8  524
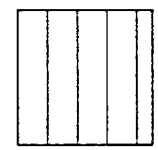 : First layer
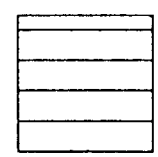 : Second layer
FIG. 64
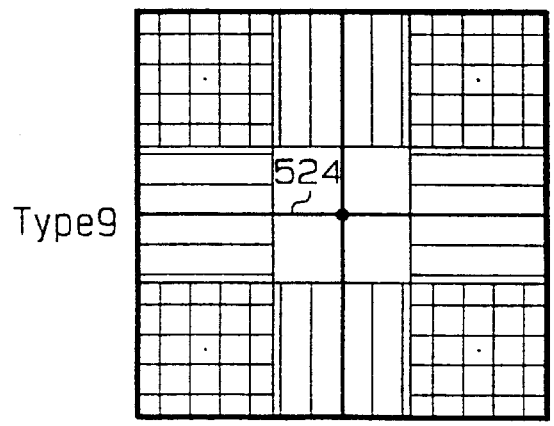
Type9  524
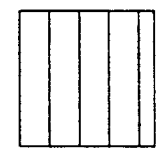 : First layer
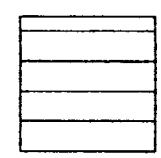 : Second layer FIG. 81
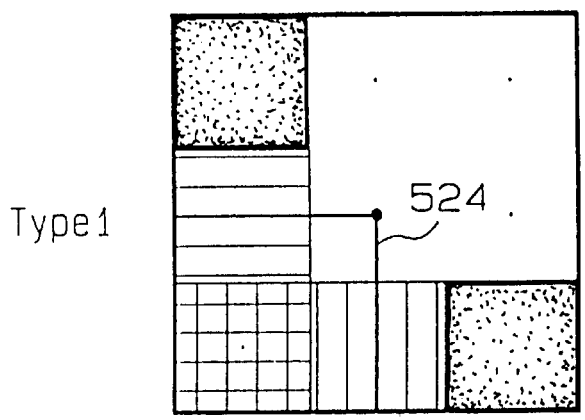
Type 1
 : First layer
 : Second layer
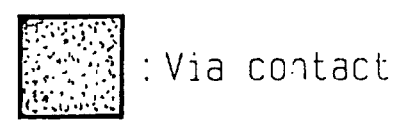 : Via contact
FIG. 82
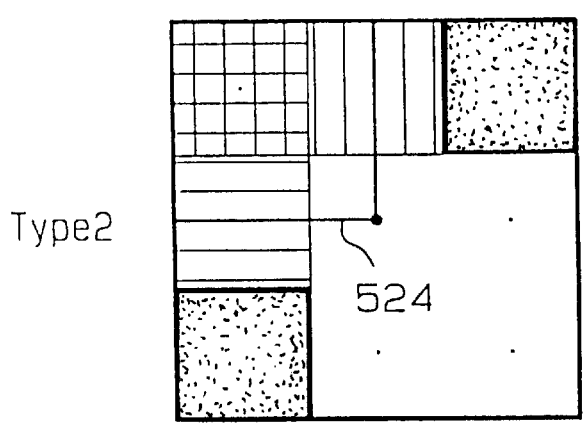
Type 2
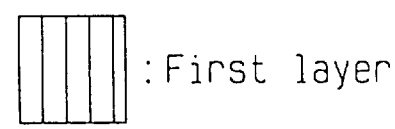 : First layer
 : Second layer
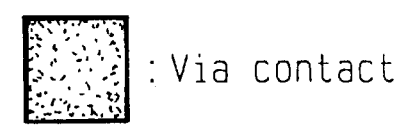 : Via contact
FIG. 83
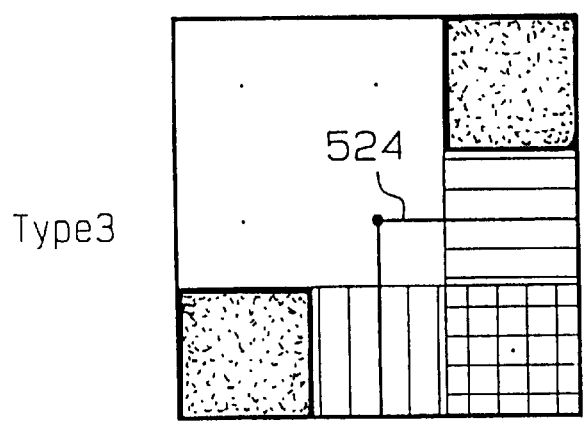
Type 3
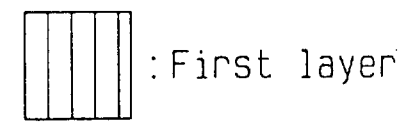 : First layer
 : Second layer
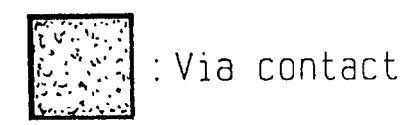 : Via contact

FIG. 84
Type4
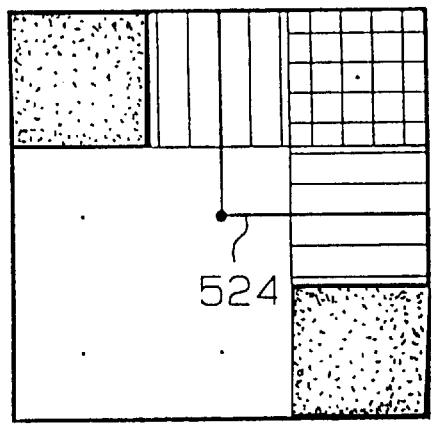
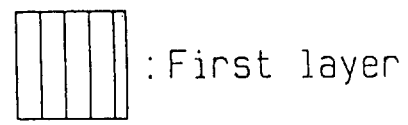
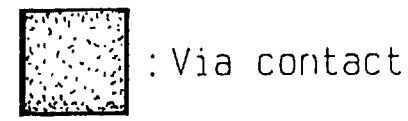
FIG. 85
Type5
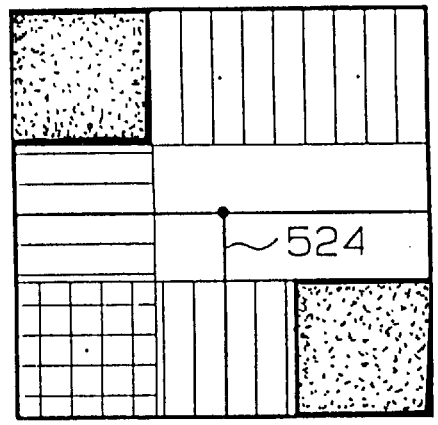
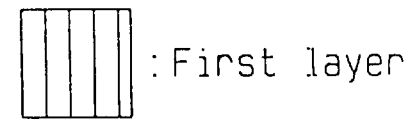
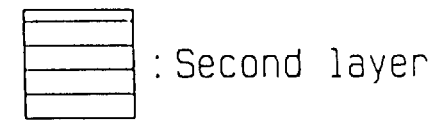
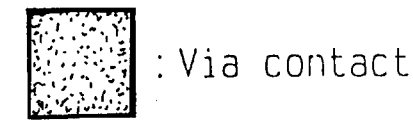
FIG. 86
Type6
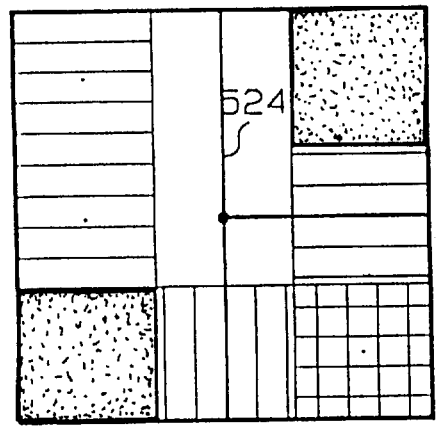
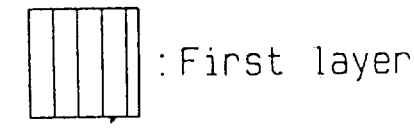
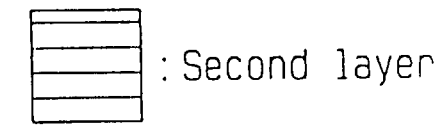
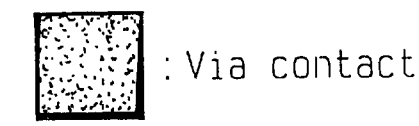

FIG. 87
Type7
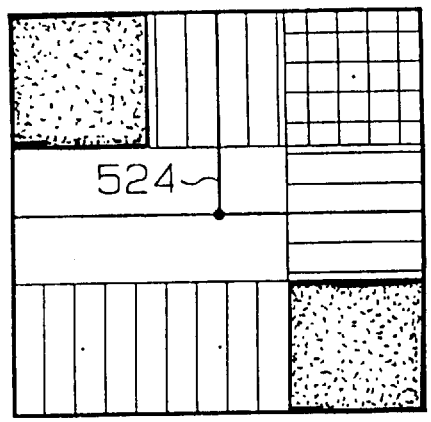 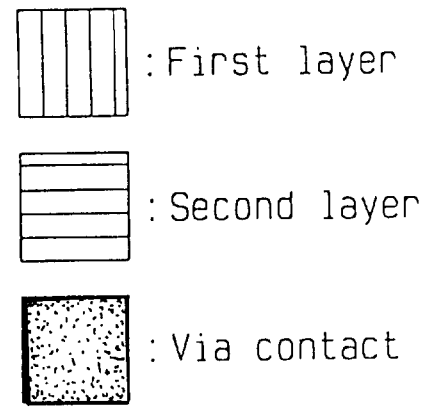
FIG. 88
Type8
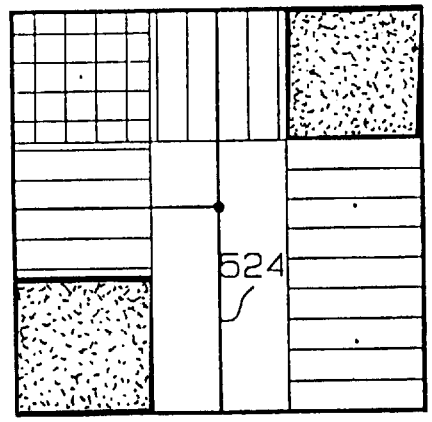 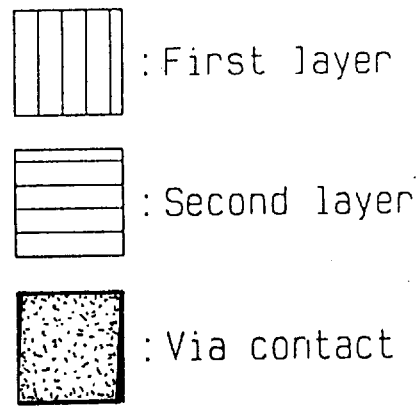

FIG. 89
Type9
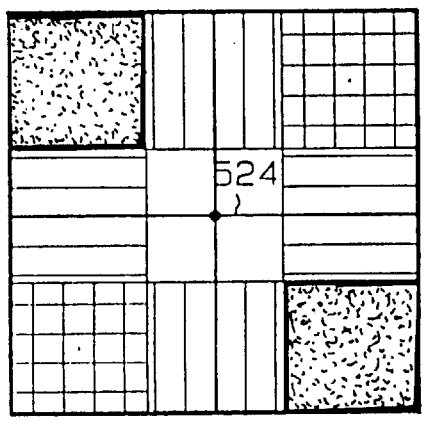
524
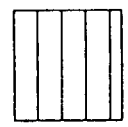 : First layer
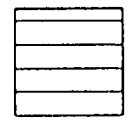 : Second layer
 : Via contact
FIG. 90
Type9
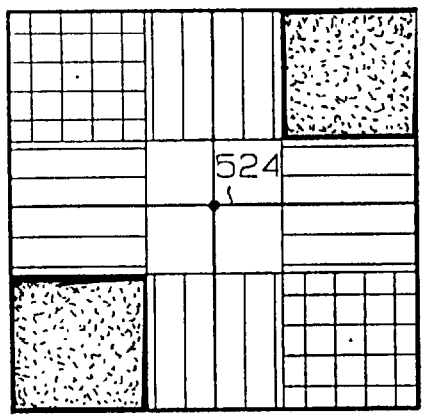
524
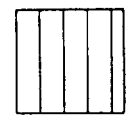 : First layer
 : Second layer
 : Via contact End point coordinate table End point coordinate table End point coordinate table End point coordinate table

MANUFACTURING METHOD AND APPARATUS OF A SEMICONDUCTOR INTEGRATED CIRCUIT DEVICE

This is a divisional of application Ser. No. 08/124,702 filed Sep. 22, 1993 now U.S. Pat. No. 5,618,744.

BACKGROUND OF THE INVENTION

1. Field of the Invention

The present invention relates to a manufacturing method and device of a semi conductor integrated circuit device.

2. Description of the Related Art

The manufacture of semiconductor integrated circuit devices requires meticulous and careful attention to circuit planning and production procedures. To assist in the development of semiconductor devices having greater circuit density and integration, a large scale integration design tool such as a computer aided design program (hereinafter referred to as CAD), etc., is utilized during a circuits's planning stage. During the planning stage, it is common for the CAD to automatically determine a particular circuit cell's location on a semiconductor chip. The CAD's positioning of numerous cells is usually determined as a function of cell terminal and input signal location. More particularly, cell placement is determined by the CAD's calculation of a maximum delay time misalignment value. This value is set by considering signal transmission delay between the input and output terminals of associated circuit cells.

Theoretically the signal delay for of the each planned calls should never exceed a maximum misalignment value. Despite the use of current CAD tools, however, delay time misalignment still exists. Even with carefully planned circuit cell placement, therefore, optimizing the placement of wiring between associated circuit cells can be a difficult problem to overcome during the circuit's planning stage.

The present invention was developed in consideration of the foregoing conditions. It is a primary objective of the present invention to realize a properly assigned wiring length in the design of circuit cells for integrated semiconductor circuits that optimizes cell placement and the timing of the input signals to the individual circuit cells.

SUMMARY OF THE INVENTION

Accordingly, it is a primary objective of the present invention to provide a method for placing individual cells on a semiconductor integrated circuit. More particularly, the invention comprises a method for placing a plurality of logic cells, forming a circuit net according to a net circuit list, on an integrated circuit in such a fashion that optimized the input and output terminal connections of the plurality of logic cells forming the semiconductor integrated circuit device. The cell placement method of the present invention includes steps for setting the wiring length between the terminals of the plurality of logic cells forming a specific net and placing the plurality of logic cells on the semiconductor chip according to the set wiring length.

BRIEF DESCRIPTION OF THE DRAWINGS

The invention, together with objects and advantages may best be understood by reference to the following description of the presently preferred embodiments together with the accompanying drawings, in which:

FIG. 5 is an explanatory chart showing a terminal information table of the grouping section;

FIG. 7 is an explanatory diagram of a terminal information table;

FIG. 31 is an explanatory diagram showing the calculation of the distance between the cell regions;

FIG. 32 is an explanatory diagram of the allocated cell placement regions;

FIG. 33 is an explanatory diagram showing the distance between the cell placement P2 shown in FIG. 30 and each of the cell placements P1 through P4;

FIG. 34 is an explanatory diagram showing the distance between the cell placement P14 shown in FIG. 32 and each of the cell placements P21 through P24;

FIG. 35 is an explanatory diagram showing an estimated line path;

FIG. 36 is an explanatory diagram showing the cell's movement;

FIGS. 56 through 64 are line layouts showing the types of the corner portions in the differential lines of FIG. 54;

FIGS. 81 thorough 90 are differential wiring line layouts showing the patterns of the via contact in the corner portions of a part of tie wide width lines;

DESCRIPTION OF THE PREFERRED EMBODIMENTS

A preferred embodiment according to the present invention will now be described referring to drawings.

Figure 1:
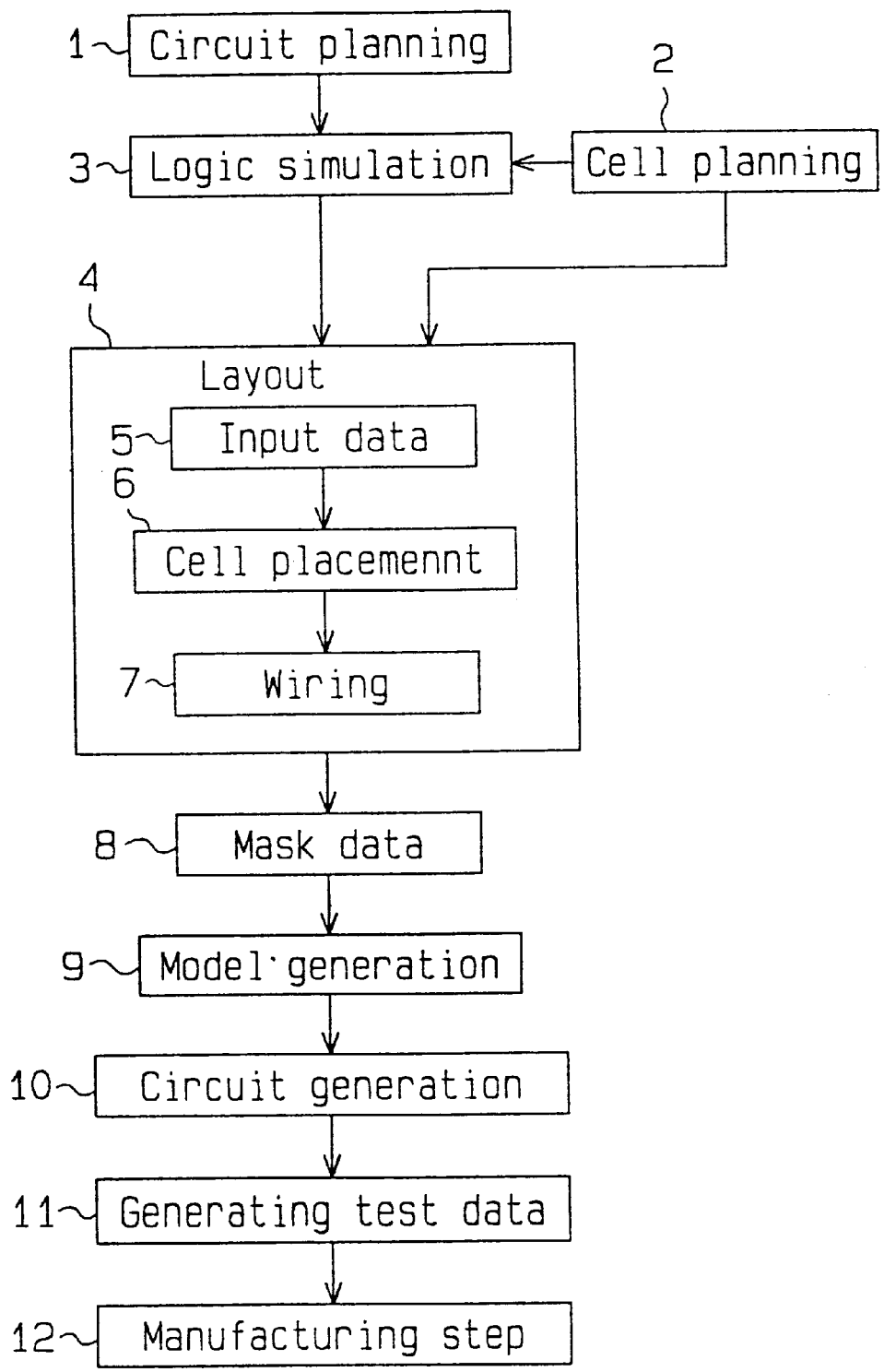
FIG. 1 is a flowchart showing a manufacturing method of a semiconductor integrated circuit device.

FIG. 1 is a flowchart describing the manufacturing steps of a semiconductor integrated circuit device.

The operation for planning a semiconductor integrated circuit utilizing logic circuits is carried out based on the functional specification which a user requires (step 1). In the circuit planning stage, data relating to both the envisioned logic circuit design and the coupling relationships among the circuit's various input and output terminals, i.e., net data is generated Cell planning for each logic cell within each logic circuit is next carried out to generate circuit data (step 2). The logic cell is planned by utilizing a physical pattern of basic circuit elements such as transistors, resistors, diodes and internal wires for coupling the elements.

Logic simulation is then carried out based on the net data and net call planning date (step 3). Following this, cell layout and wiring of the semiconductor chip in carried out (step 4). This layout includes net data input operations (step 5), cell placing operations (step 6) and wiring operations (step 7).

As the layout has been accomplished, the cell data, cell placing data and net data are converted to masking data (step 8). The masking data is the data used to produce a mask design utilized during an exposure step. After that, the operations of model generation converts the mask data into the model generation data in order to realize an accurate circuit simulation (step 9). The circuit simulation is next carried out in the circuit generator step using the model generation data from step 9, the net data generated in step 1, and test data (step 10). These data although not illustrated as being provided directly to step 10, are widely known by those skilled in the art to be used at this stage in the manufacturing process. When the circuit simulation is carried out, the operations for generating test data are likewise carried out (step 11). The semiconductor integrated circuit device is manufactured according to the masking data generated at step 8 (step 12).

Figure 2:
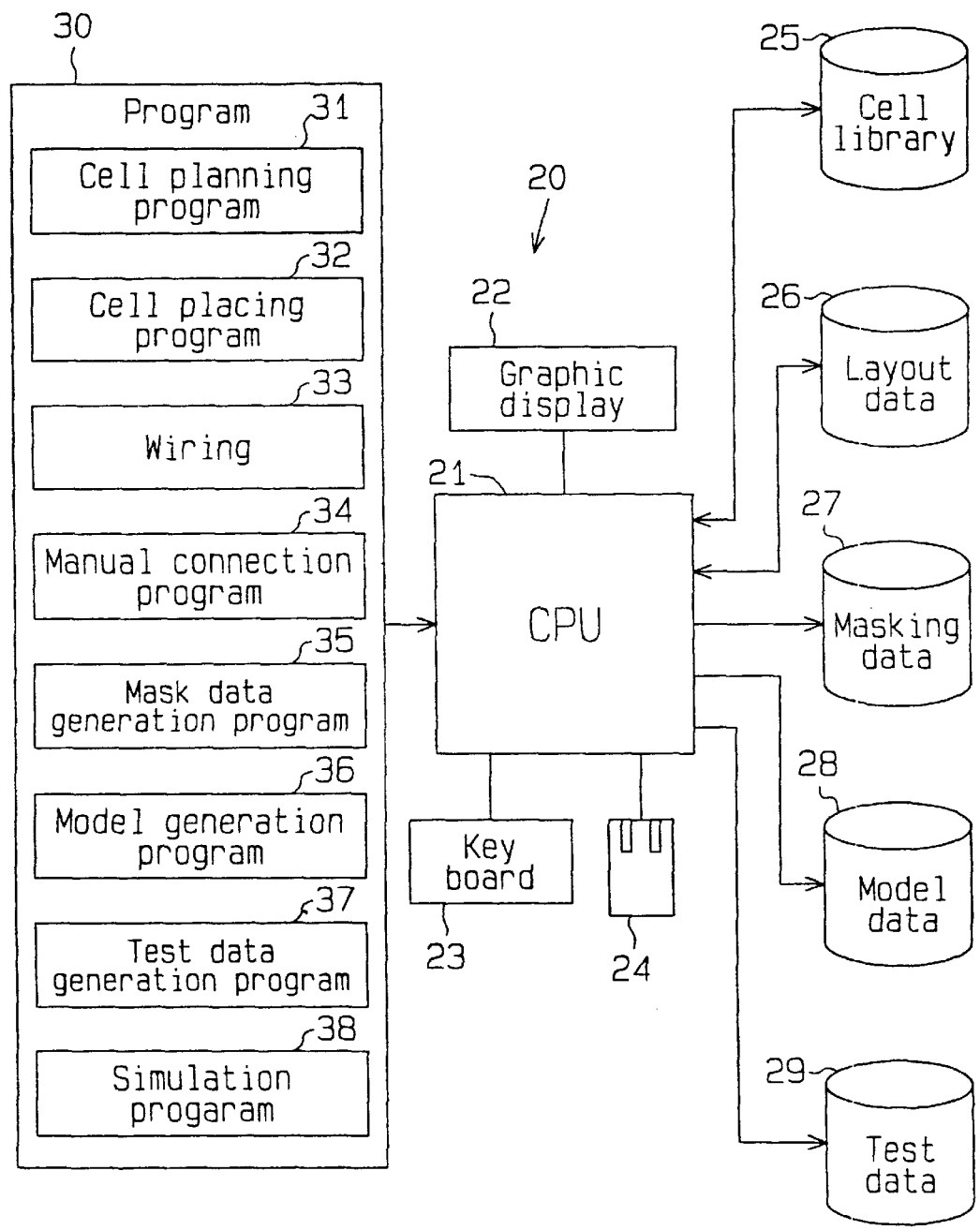
FIG. 2 is a block diagram of a planning system of the semiconductor integrated circuit device.

FIG. 2 shows a planning system 20 which carried out the operations of steps 1 though 11.

A central processing unit (hereinafter referred to as CPU) 21 in the system 20 coupled with a graphic display 22 formed with a cathode ray tube, key board 23 and mouse 24. The CPU 21 further couples with a memory unit 30 formed with a hard disk unit. The memory unit 30 stores numerous programs which are carried out; by the CPU 21. Those stored programs include a cell planning program 31, call placing program 32, wiring program 33, manual connection program 34, masking data generation program 35, model generation program 36, test data generation program 37 and simulation program 38.

A command corresponding to the predetermined operation is input through the manipulation of the key board 23 or mouse 25 by the user. The CPU 21 reads in the appropriate program from the memory unit 30, which corresponds to the input command, and executes the read program.

When the cell planning command is input to the CPU 21, the CPU 21 reads in the cell planning program 31. The CPU 21 then carries out the cell planning according to the program 31 as explained by reference FIGS. 3 through 16. (detailed explanations of which will follow) The CPU 21 stores the data of the planned cell in the cell library 25.

When the cell placing command is input to the CPU 21, the CPU 21 reads in the cell placing program 32. A layout data file 26 stores the logic circuit data and net data generated in step 1 of FIG. 1. The CPU 21 then carries out the cell placing operations according to the read in cell placing program 32 as shown in FIGS. 17 through 36, and FIGS. 38 through 49. In the cell placing operations, the CPU 21 reads out the logic circuit data and net data from the file 26, and cell data from the file 25 which correspond to each of the logic circuits.

The CPU 21 sets the placing locations of each cell on the semiconductor chip according to the cell placing data and net data, and stores the set placing location data in a data file 26.

After the operations of cell placement are carried out, the wiring command is input to the CPU 21. The CPU 21 then reads in the wiring program 33, and carries out the wiring operations according to the read in wiring program 33 which is explained by reference to FIGS. 50 through 94 (described in detail later). In the wiring operations, the CPU 21 reads out the cell data, placing positions and net data from the file 26. The CPU 21 next sets the wiring of each net on a base plate according to the placing data and net data. During the wiring operations, when the wiring distance or propagation delay time of each net is assigned, the CPU 21 carries out the wiring operations to fulfill the assignment. The CPU 21 then stores the wiring data in the file 26.

After the cell placing operations are or wiring operations completed, the manual connection command is input to the CPU 21. The CPU 21 reads in the manual connection program 34, and then carries the manual connection between the adjacent cells according to the read in program 34, which is explained by reference to FIGS. 95 through 113. (explained in detail later).

After the layout is completed, the command for generating the masking data is input to the CPU 21. The CPU 21 then reads in the masking data generation program 35 and reads out the layout data from the file 26. The CPU next generates the masking data 27 based on the read layout data according to the program mask data generation program 35, and stores the data in the masking data file 28.

After the wiring operations are completed, and as the command for generating the model data is input in the CPU 21, the CPU 21 then reads in the model generating program 36. The CPU 21 reads in the layout data from the file 26, and carries out a conversion operation of the net data into the model data, as explained in detail later by reference to FIGS. 114 through 122. Then, the CPU 21 stores the generated modeling data in the model data file 28.

When the command for generating test data is input to the CPU 21, the CPU 21 generates test data according to the test data of the logic simulation. After the modeling data generation is completed, and when the simulation command is input to the CPU 21, the CPU 21 reads in the simulation program 38. The CPU 21 reads out the modeling circuit data from the file 28, and carries out the simulation based on the modeling circuit data and test data according to the program 38. During this simulation, the user can determine whether or not the planned circuit performs as expected.

The operations carried out by the planning system will now be described. FIGS. 3 through 7 show one example of cell planning.

Figure 3:
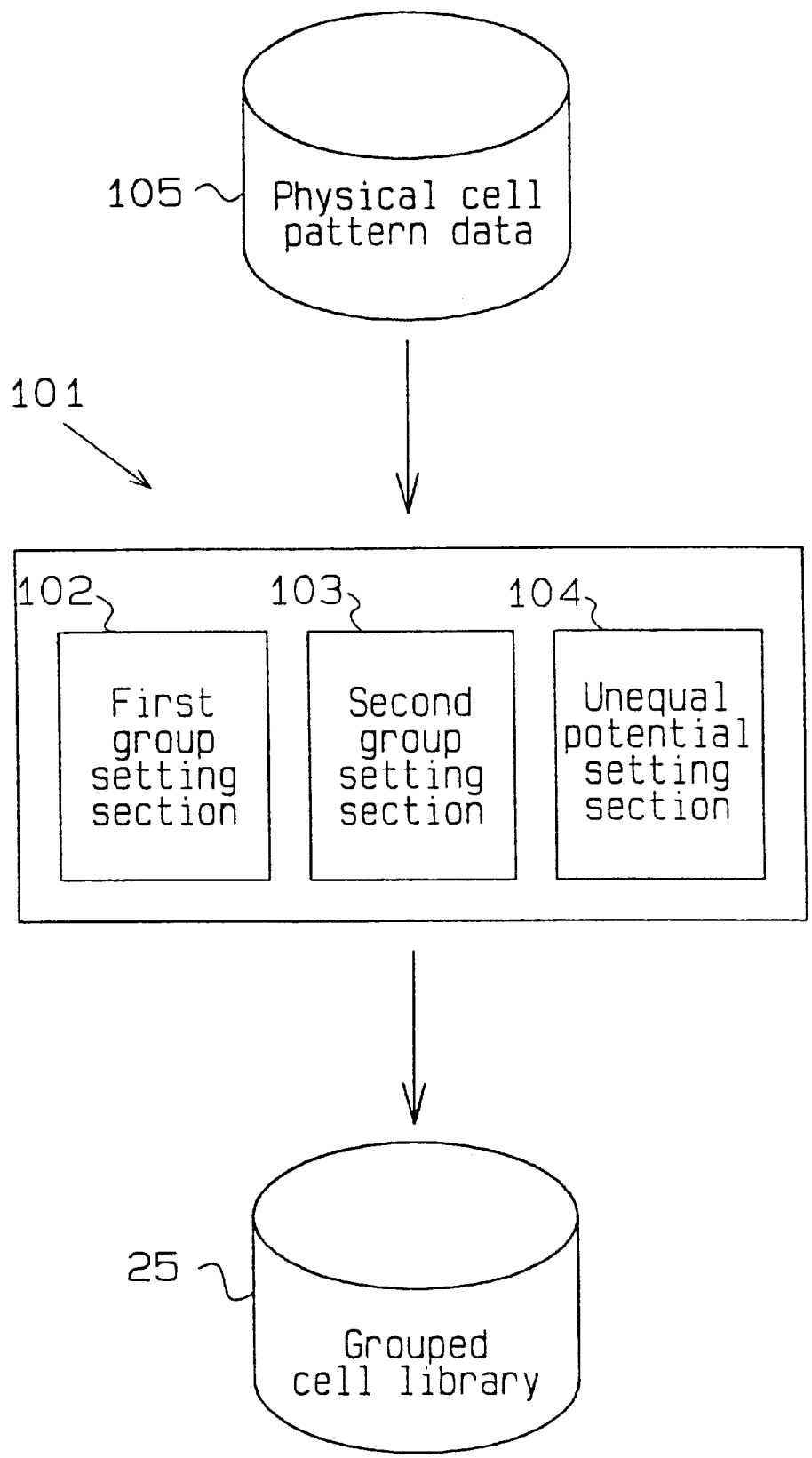
FIG. 3 is a block diagram of a grouping section.

A grouping apparatus 101 shown in FIG. 3 inputs physical pattern data of each cell for cell planning. The apparatus 101 groups equipotential terminal points included in the pattern data and aluminum alloy layer wires (hereinafter referred to as Al layer wire) as connecting points.

When the CPU 21 reads in the cell planning program 31, the apparatus 101 is formed with the CPU 21. The apparatus 101 includes a first group setting section 102, second group setting section 103, and an unequal potential setting section 104.

Figure 6:
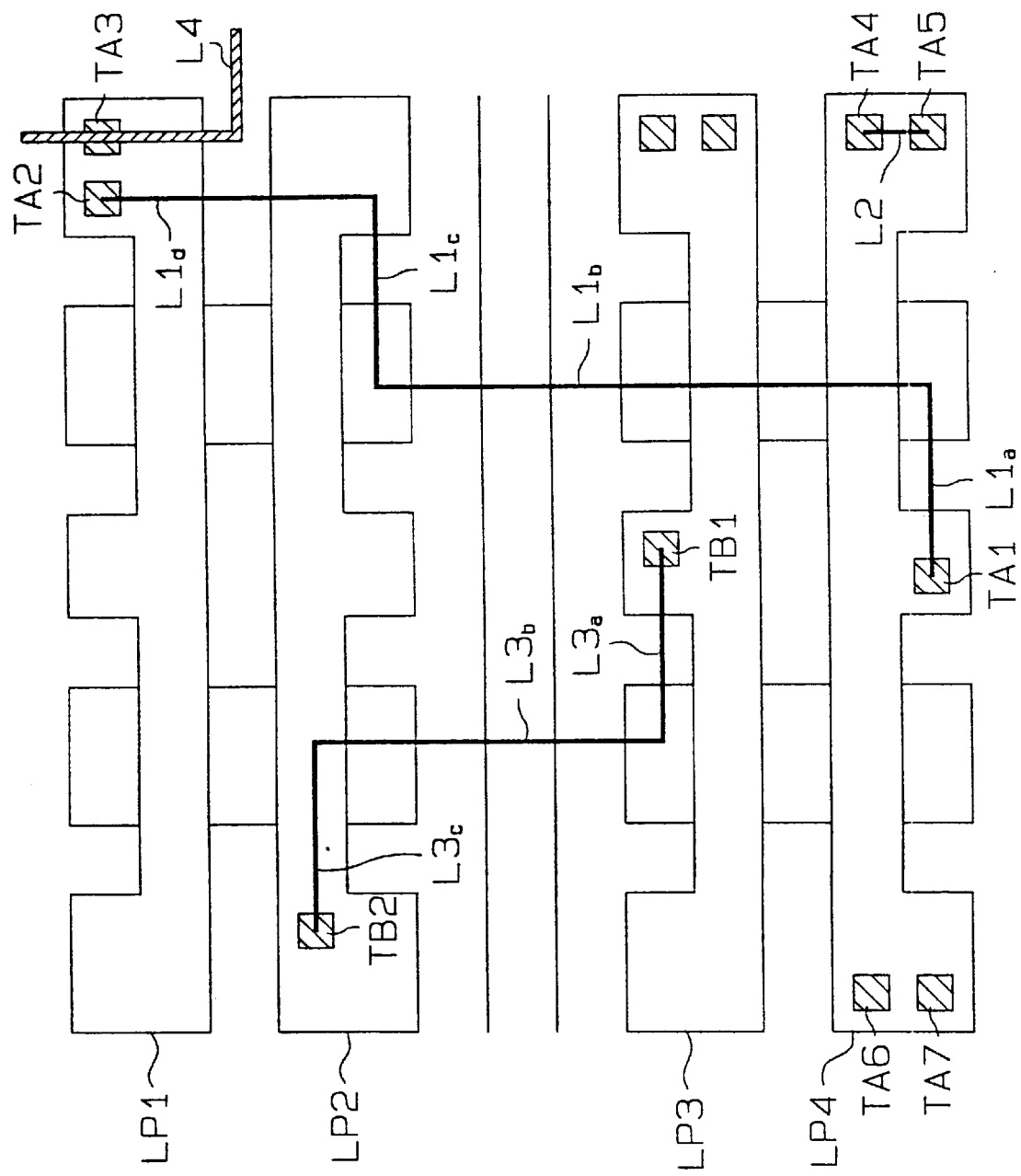
FIG. 6 is a layout of a logic cell which is formed with transistors.

The data for the physical cell pattern 105 is communicated to the input side of the apparatus 101, and a grouped cell library 25 to the output side thereof. The physical pattern data of each logic cell which are planned by the planning system 20 of FIG. 2 are stored in a cell library file 105 of FIG. 3. FIG. 6 is an example of the layout of cell formed using transmitters which would be stored in the file 105. Gate of the transistors employ polysilicon layer wiring (hereinafter referred to as polylayer wiring) LP1, LP2, LP3, and LP4. Terminal points TA2, TA3 are set on the polylayer wiring LP1. The terminal point TB2 is set on the polylayer wiring LP2, and the terminal point TB1 on the polylayer wiring LP3. Further, the terminal points TA1, TA4 through TA7 are set on the polylayer wiring LP4.

The terminal points TA1 and TA2 are electrically connected through Al layer wirings. L1a through L1d. The terminal points TA4 and TA5 are electrically connected through an Al layer wiring L2. The terminal points TB1 and TB2 are electronically connected through Al layer wiring L3 through L3c. An Al layer wiring L4 having different potential from that of the terminal point TA3 exists but does not connect to the upper portion of the terminal point TA3. The Al layer wiring in this embodiment its not formed from pure aluminum, but rather contains ninety nine percent (99%) aluminum (Al) and one percent (1%) silicon (Si).

The apparatus 101 in FIG. 3 stores the grouped terminal data in the terminal information table which is present the region in the file 25, and the information of each cell is stored as library data. For example, in the pattern data of logical cell shown in FIG. 6, the terminal points TA1 through TA7, lines L1 through L5 are output as terminal data.

The first group setting section 102 groups the terminal points on the connected polylayer wiring and the arbitrary points on the connected Al layer wiring as equipotential terminals designated by group number α. In the logical cell shown in FIG. 6, the terminal points TA1 through TA7, Al layer wiring L1a through L1d and L2 are connected through the Al layer wiring L1a through L1d, L2 or the polysilicon layer wiring. Therefore, as shown in FIG. 7, terminal points TA1 through TA6, polylayer wirings L1a through L1d, and Al layer wiring L2 are assumed to be in the same group, and the group number α thereof is set, e.g., as "1". The terminal points TB1, TB2, and Al layer wirings L3a through L3c are connected through the Al layer wiring L3a through L3c. As shown in FIG. 7, these terminal point and Al layer wirings are assumed to be in the same group, and the group number α thereof is set, e.g., as "2".

The second group setting section 103 group both the Al connected terminal points and the Al layer wiring as a second group B within the first group of equipotential terminals setting section 102. In the logical cell shown in FIG. 6, the terminal points TA1, TA2 and Al layer wirings L1a through L1d are connected by only the Al layer wiring L1a through L1d. Therefore, as shown in FIG. 7, these group number β in set, e.g., as "1". Since the terminal TA3 is not connected to other terminal points through the Al layer wiring, TA3 is assigned the group number β, e.g., as "2" shown in FIG. 7.

As the terminal points TA4, TA5 and Al layer wiring L2 are connected through only the Al layer wiring L2, the group number β, e.g., as "3" shown in FIG. 7. Since the terminal points TA6 and TA7 are not connected to other terminals through the Al layer wiring, they are assigned a group designation β, e.g., as "4" and "5", respectively, shown in FIG. 7. Since the terminal points TB1, and TB2 as well as the Al layer wiring L3a through L3c are connected through the Al layer wiring L3a through L3c, the group number β is assigned, e.g., as to "6" shown in FIG. 7.

Referring to FIG. 3, an unequal potential setting section 104 sets or identities those equipotential terminals aligned beneath a polylayer wiring, having a different potential than the equipotential terminals, as unequal potential terminals α. This serves to distinguish α terminals from other equipotential terminals. That is, these unequal potential terminal are not grouped as the equipotential terminals. In the logical circuit as shown in FIG. 6, only the terminal point TA3 includes the unequal potential Al layer wiring. Accordingly, as shown in FIG. 7, only the number γ of the terminal point TA3 is set as "EXIST". The numbers of other terminal points and Al layer wiring are set as "NON EXIST", identified an existing.

Figure 4:
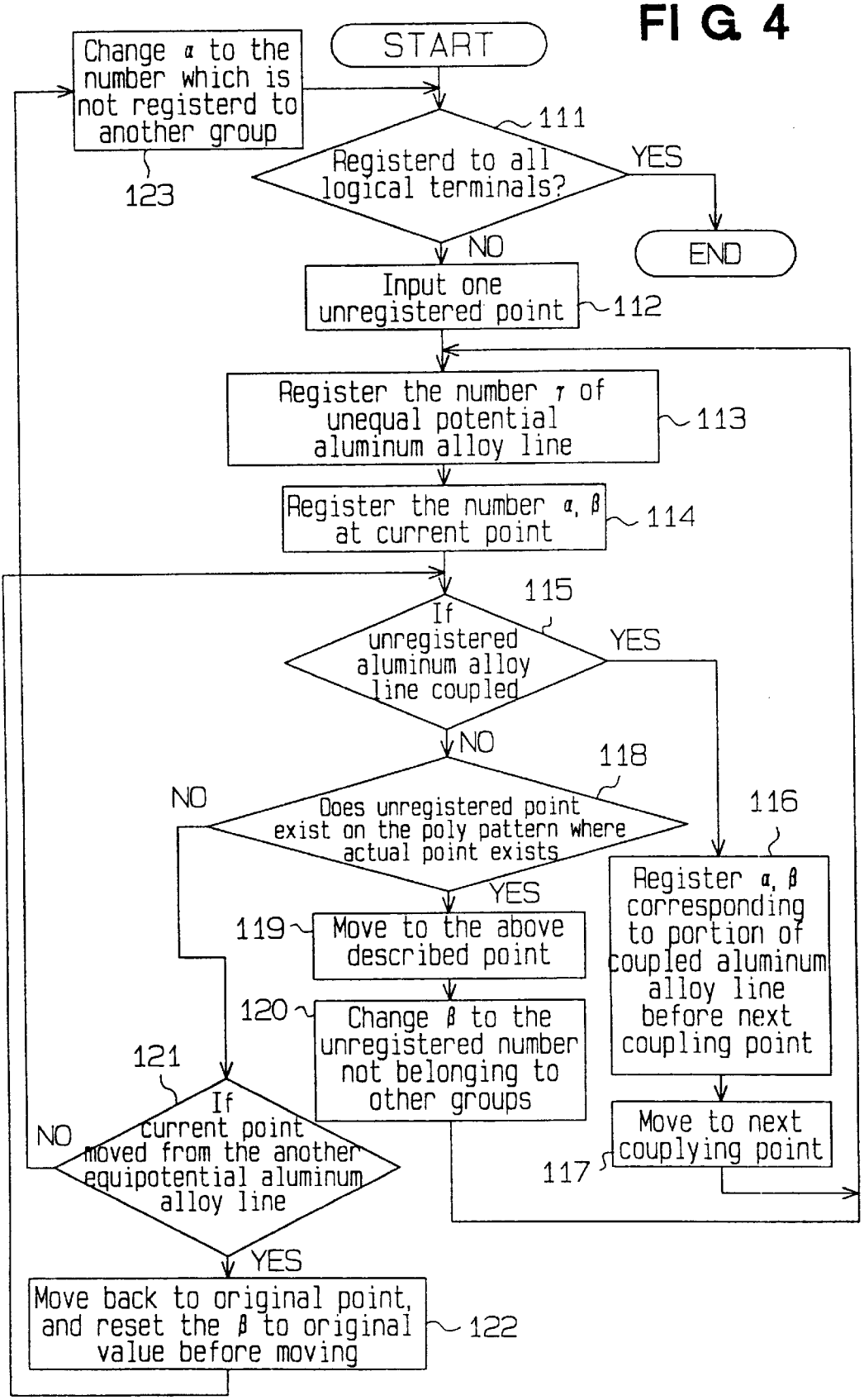
FIG. 4 is a flowchart explaining the operations carried out by the grouping section.

FIG. 4 shows the operations carried out by the grouping apparatus 101.

The apparatus 101 determines whether or not all logical terminals (i.e., terminal points) of a cell in library file 105 have been registered (step 111). If there are unregistered logic terminals points, the apparatus 101 inputs one point of the unregistered terminal points from the physical cell pattern data 105 and stores this point in the terminal information table (step 112).

The apparatus 101 determines whether or not the unequal potential Al layer wiring exists at an input point (step 113). If such a condition exists, the apparatus 101 registers the wiring layer α in the terminal information table in FIGS. 5 and 7 as existing. When an unequal potential Al wiring condition does not exist, the apparatus 101 registers the wiring layer α in the terminal information table as "NON EXISTING".

The apparatus 101 registers the group number α of the Al layer wiring or polysilicon layer wiring, and the group number β of only Al layer wiring to the terminal information table at that time (step 114). If the apparatus 101 determines that the Al layer wiring is not registered in the terminal information table but is nonetheless connected at a present point (step 115), the apparatus 101 sets the portion of the Al layer wiring from the present point to the subsequent point (i.e., excluding both points) to the group numbers α, β, and registers them in the terminal information table (step 116).

The apparatus 101 moves to the subsequent point (step 117), and returns to the step 113. The apparatus 101 repeatedly carries out the following operations starting from those of the step 113.

When the apparatus 101 determines that the current point does not connect to the Al layer wiring which is not registered in the terminal information table at step 115, the apparatus advances to step 118.

When the apparatus 101 determines that other points including the unregistered groups exist on the polysilicon layer wiring pattern which includes the current point (step 118), the apparatus advances to step 119.

The apparatus 101 converts the group number β of the point which the apparatus 101 moved to at previous step 119 to an unregistered value as the other group number (step 120) The apparatus 101 then carries out the following operations starting from step 113.

When the apparatus 101 determines that other points including the unregistered groups exist on the polysilicon layer wiring pattern which includes the current point at step 118, the apparatus advances to step 121.

When the apparatus 101 determines that the location of the current point is established by moving it from the other polysilicon layer wiring pattern through equipotential Al layer wiring (step 121), the apparatus 101 advances to step 122. The apparatus 101 moves the point back to the original location, and reset the group number β to the number of original location (step 122). The apparatus 101 then returns back to step 115, and carries out the following operations starting from step 115.

When the apparatus 101 determines that the location of the current point is not established by moving it from the other polylayer wiring pattern through equipotential Al layer wiring (step 121), the apparatus 101 advances to step 123. The apparatus 101 converts the group number α to an unregistered value as the other group number (step 123). The apparatus 101 returns back to step 111, and carries out the operations starting from the step 111. The apparatus 101 then determines that all logic terminals (i.e., terminal points) have been registered, and terminates this operations.

As shown in FIG. 5, the group number α including terminal points (not shown) TA11 through TA16, TA21 is got to "1", and the group number including terminal points (not shown ) TA22, TA23 is set to "2". The group number β including the terminal point TA11 through TA13, TA21 is set to "1", and the group number β including the terminal points TA14, TA22, TA23 is set to "2". The group number β including the terminal points TA15, TA16 is set to "3". Further, if the Al layer wiring having the unequal potential different from that of the terminal exists only at the upper portion of that terminal, the group number γ is set to as "EXIST", and the other group numbers γ are set to as "NON EXIST".

Accordingly, this grouping apparatus can create the library including the grouping of Al layer wiring which connect the terminal points of cell with the respective terminal points. Therefore, as the wiring operations of each cell are carried out using the automatic layout program with its library of information, cell terminal information increases thereby allowing for increased work efficiency.

In other words, as the terminals are grouped according to the Al layer wiring or the polylayer wiring, all points having the electronically equipotential in the cell can be defined as one group. Therefore, if terminal points can be defined as the equipotential, they can be wired to other equipotential points. This allows for a increase in wiring freedom.

In the grouped terminals having the Al layer wiring or the polylayer wiring, even the defined equipotential terminals can be further grouped into the different groups based on the Al layer wiring. Equipotential Al wired terminals that cross over the polylayer wiring exhibit wave form characteristics of wave forms differ from polylayer wired terminals. Therefore, as the terminals are grouped according to the only Al layer wiring, the wiring operations can be carried out by considering signal characteristics. With this information it can be determined whether or not those terminals thereon are connectable. This further increases the operational efficiency of semiconductor integrated circuit manufacturing.

In addition to above, the Al layer wiring including one percent (1%) of copper can be employed in place of silicon. Further, the Al wiring can be made with only aluminum.

FIGS. 8 through 13 show various interconnected gate array patterns which, according to the present invention are designated at step 2 and stored in the cell library 25. Storing and using cell data in this fashion is preferable to cell placement of a full element type gate array (hereinafter referred to as SOG) 220 of FIG. 14. The SOG is an abbreviation of spin-on glass, and is an interlayer insulating film.

A plurality of basic cells 221 are vertically and horizontally placed in the SOG 220. Each of the basic cells 221 is formed with a PMOS transistor 222 and NMOS transistor 223 which are adjacently disposed. Each one of high voltage power supply line (hereinafter referred to as high power source) VDD or low voltage power supply line (hereinafter referred to as low power source) VSS is alternately disposed between basic cells 221, and along the upper side edges of both transistors 222, 223. In the gate array 20, one or a plurality of basic cells 221 which have a functional unit corresponding to the various types of logic circuits. In this case, as the power lines VDD, VSS are passing along the upper side edges of basic cells 221, the wiring region disposed at the central upper portion of the cell is increased, allowing for increased freedom in internal wiring layout.

The SOG 220, including two input NAND gates 206 shown in FIG. 15, will now be described referring to FIG. 16. The. NAND gate 206 includes two input terminals 201, 202 and one output terminal 203. The NAND gate 206 is formed with PMOS transistors 207, 208 and NMOS transistors 209, 210 as shown in FIG. 16. Both drains of the transistors 207, 208 are coupled to the output terminal 203 and the drain of the transistor 209. The source of the transistor 209 is coupled to the drain of the transistor 210, and the source of the transistor 210 is coupled with the low voltage power source line VSS. The gates of the PMOS and NMOS transistor 207, 209 form the input terminal 201. The gates of the PMOS and NMOS transistors 208, 209 form the gate 202.

Figure 8:
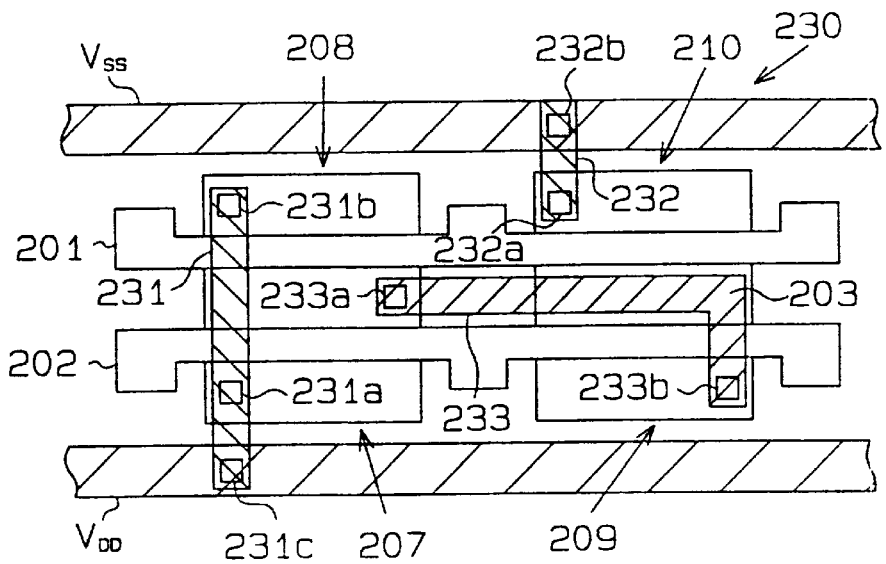
FIG. 8 is a layout of real pattern of a cell library.
Figure 14:
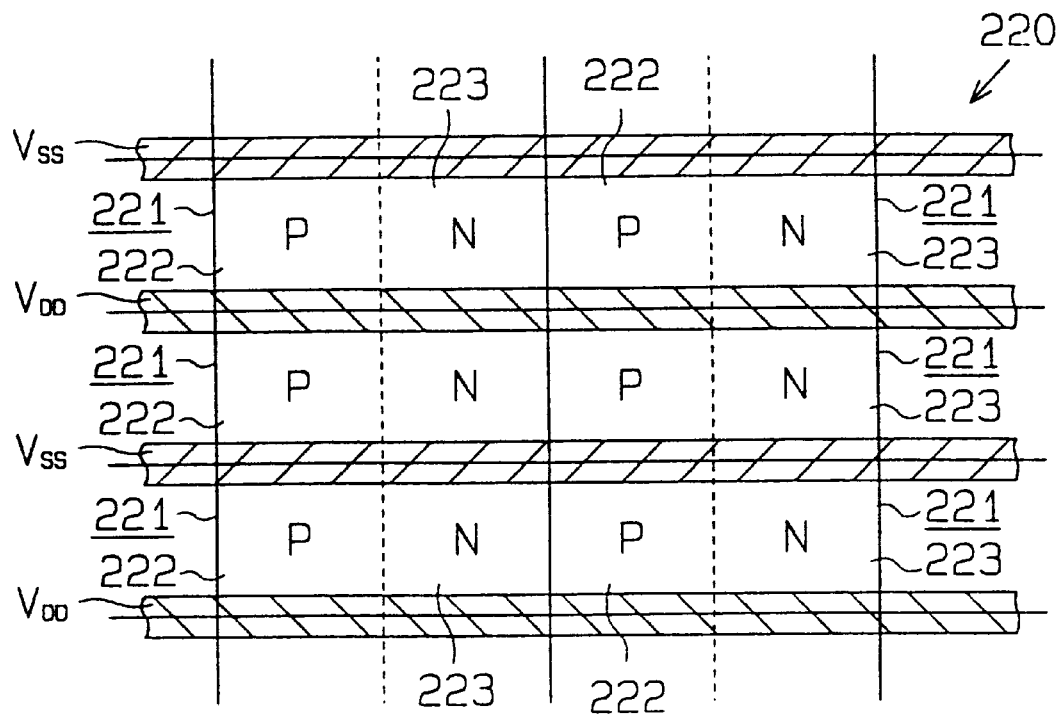
FIG. 14 is a plan view showing the construction of bulk gate arrays.
Figure 15:
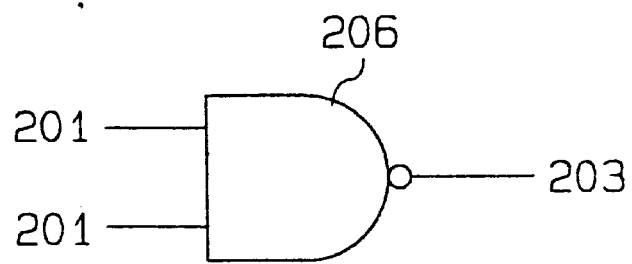
FIG. 15 is a logic diagram showing two input NAND gate.
Figure 16:
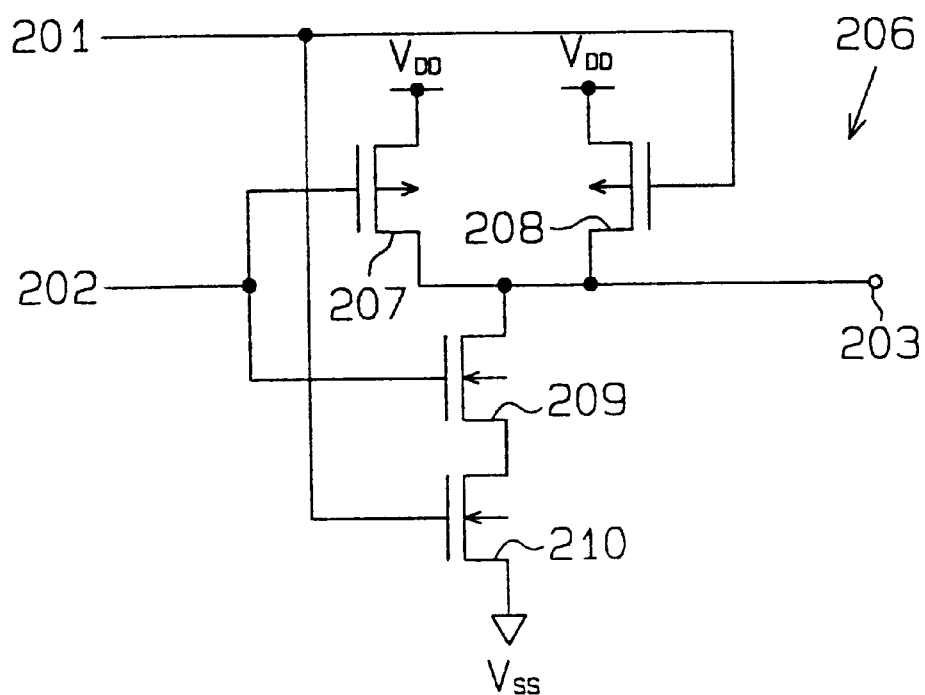
FIG. 16 is a circuit diagram of the two input NAND gate of the two input NAND gate of FIG. 15.

FIG. 8 shows a real cell pattern 230 which will place the NAND gate 206 shown in FIGS. 15, 16 on the gate array 220 of FIG. 14. A coupling wire 231 of the pattern 230 is coupled to the sources of the transistors 207, 208 and the high voltage power source line VDD through contact holes 231a through 231c, respectively. A coupling wire 232 is coupled to the source of the transistor 210 and the low voltage power source line VSS through contact holes 232a, 232b, respectively. A cell internal wiring 233 is coupled to a common drain of the transistors 207, 208 and the drain of the NMOS transistor 209 through contact holes 233a, 233b, respectively. The cell library 25 of FIG. 2 stores the real patterns 230, 234 of FIGS. 8 and 9 which correspond to the position of the NAND gate 206 of FIG. 15 to be placed in the gate array 220 of FIG. 14.

Figure 9:
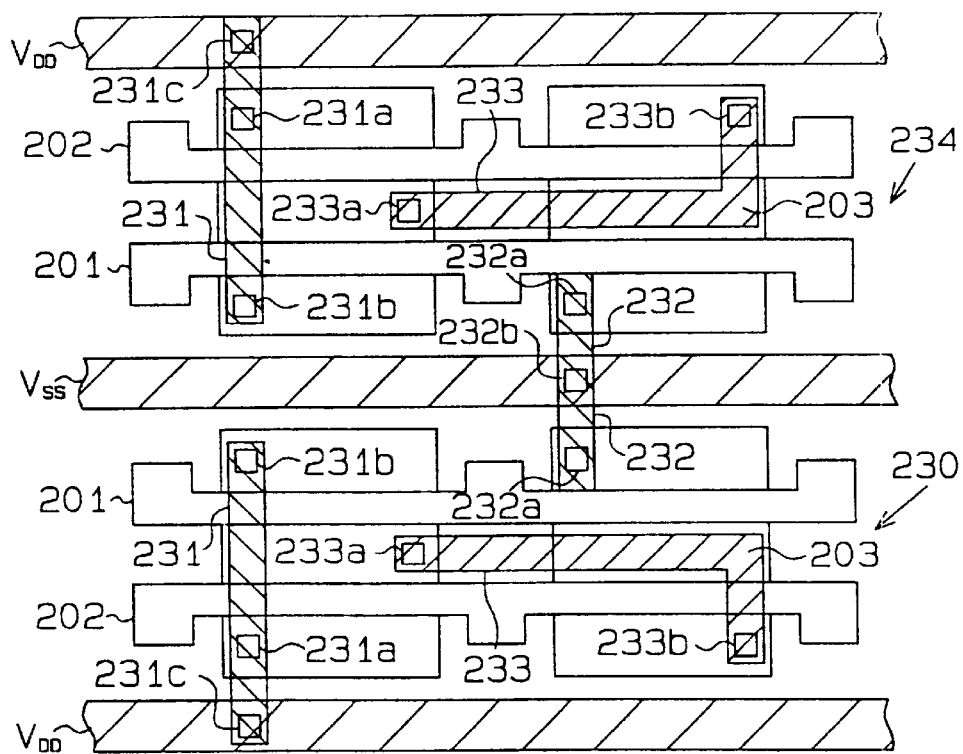
FIG. 9 is a layout where the real pattern of FIG. 8 is utilized.

As shown in FIG. 9, two double input NAND gates are disposed to be opposite each other with respect to the low voltage power source line VSS. In the layout of FIG. 9, the real pattern 230 shown in FIG. 8 is placed below the VSS with respect to the basic cell. The real pattern 234 is placed above the VSS with respect to the basic cell and is linearly symmetric to the real pattern 230.

Accordingly, a plurality of real patterns are provided to each of the cells in this embodiment. Further, the predetermined real pattern in placed according to the cell placing position in the gate array 220. This allows cells to be freely placed, regardless of the limitation for placing the power supply lines.

In the gate array 220 in the embodiment, the high voltage power source line VDD and low voltage power source line VSS are alternately placed between adjacent basic cells along both of the transistor 222, 223 in the basic cell. 221. Therefore, the reduction of the upper wiring region of the basic cell is controlled allowing a greater freedom for the internal wiring layout of the real pattern utilized in each cell.

Figure 10:
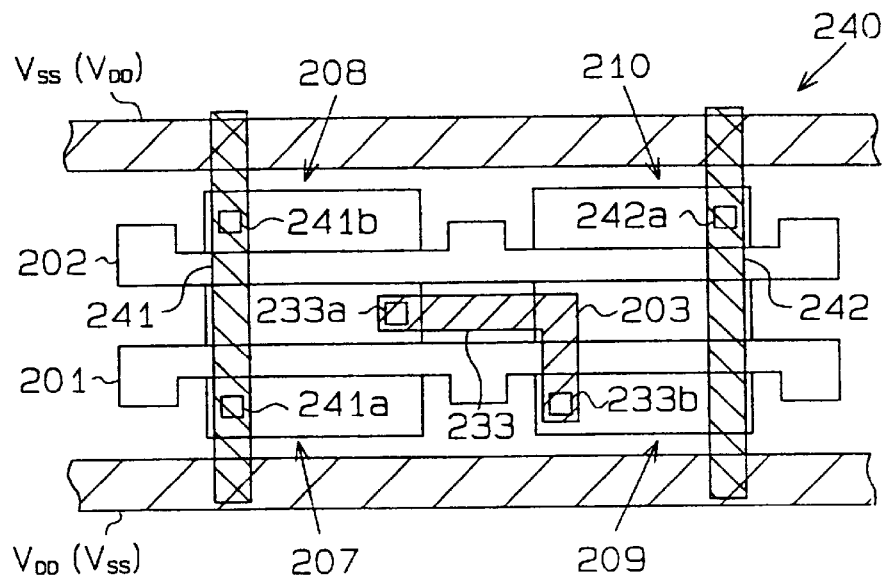
FIG. 10 in another layout of real pattern of the cell library.

FIG. 10 shows a real pattern 240 which places the double input NAND gate 206 shown in FIGS. 15, 16 in the gate array 220. Coupling wires 241, 242 in the pattern 240 extend from the high voltage power source line VDD to the low voltage power source line VSS. The coupling wire 241 is coupled to the sources of the transistors 207, 208 through contact holes 241a, 241b, respectively. The coupling wire 242 is coupled to the source of the transistor 210 through a contact hole 242a. However, no contact holes are disposed between the VDD and the VSS. The cell library 25 holds only one real pattern 240 shown in FIG. 10 with respect to one of NAND gate 206.

Figure 11:
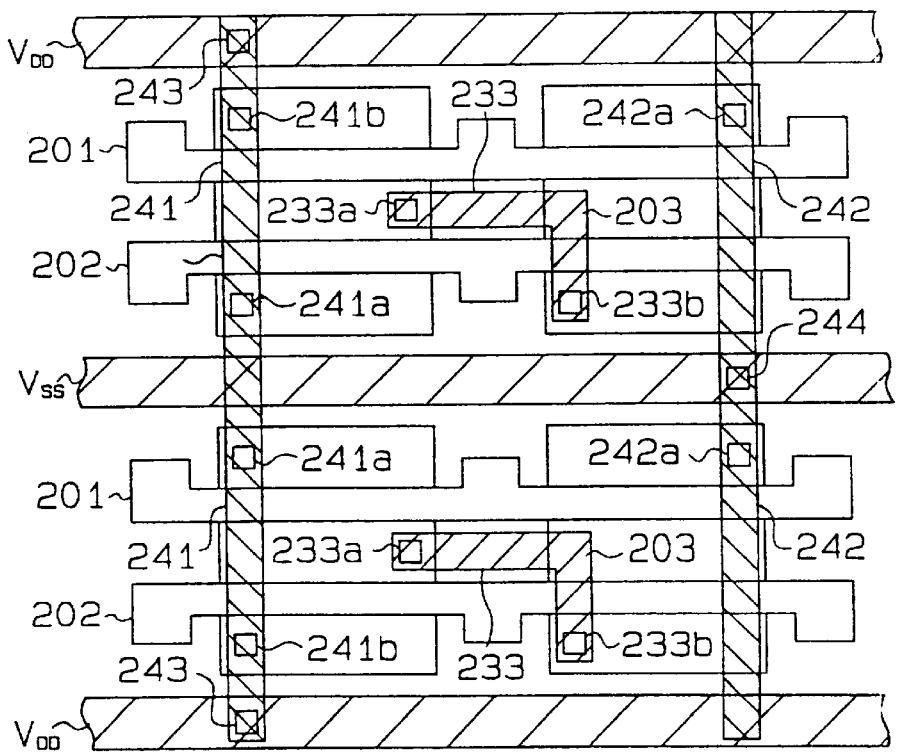
FIG. 11 is a layout where the real pattern of FIG. 10 is utilized.

FIG. 11 shows a layout in which two double input NAND gates are disposed opposite each other with respect to the low voltage power source line VSS. In FIG. 11, after the pattern 240 in placed, the CPU 21 generates wiring placement information for a contact hole 243 to be disposed at the crossing portion of the VDD and the coupling wire 241. Further, the CPU 21 generates wiring placement information for a contact hole 244 to be disposed at the intersection of the VSS and the coupling wire 242. Accordingly, the pattern 240 can be placed at any arbitrary location within basic cell.

Accordingly, when the operation of cell placing in the gate array is to be carried out according to this embodiment, only one real pattern is required for each one of the cells beforehand. Therefore, the number of the real patterns to be stored beforehand can be reduced. Furthermore, the steps for generating the real pattern can be reduced. According to the embodiment, the logic cell can be more freely positioned on the basic cell with less respect to the limitation imposed on cell design by the power supply lines.

Figure 12:
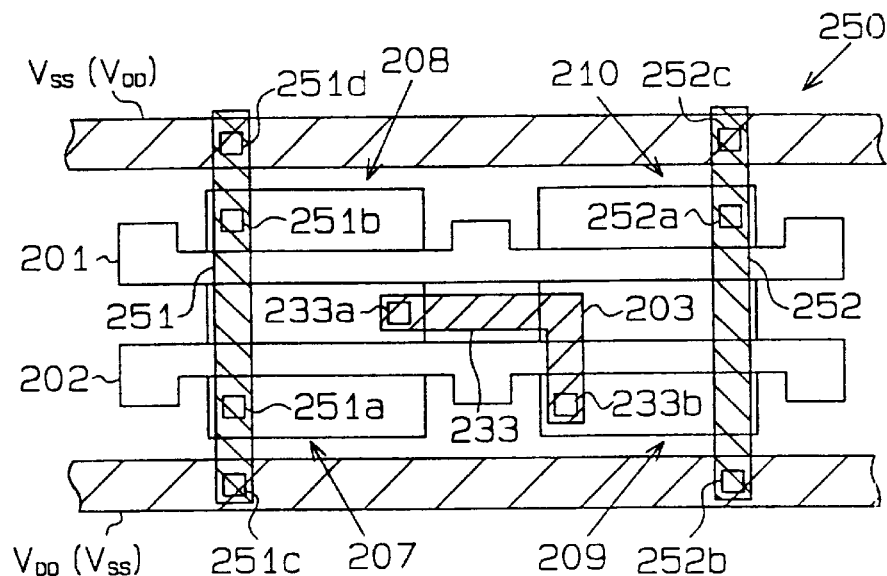
FIG. 12 is another layout of real pattern of the cell library.

FIG. 12 further shows another real pattern 250 for placing the double input NAND gate 206 shown in FIGS. 15, 16 in the gate array 220. Coupling wires 251, 252 extend from the high voltage power source line VDD to the low voltage power source line VSS. The coupling wire 251 is coupled to the sources of the transistors 207, 208 through contact holes 251a, 251b, respectively. The coupling wire 251 is further coupled to either one of the power lines VDD or VSS through contact holes 251c, 251d, respectively. The contact wire 252 is coupled to the source of the transistor 210 through the contact hole 252a. The contact wire 252 is further coupled to either one of the power lines VDD or VSS though contact holes 252b, 252c, respectively. The grouped cell library 25 stores only one real pattern 250 shown in FIG. 12 with respect to one of the NAND gate 206.

Figure 13:
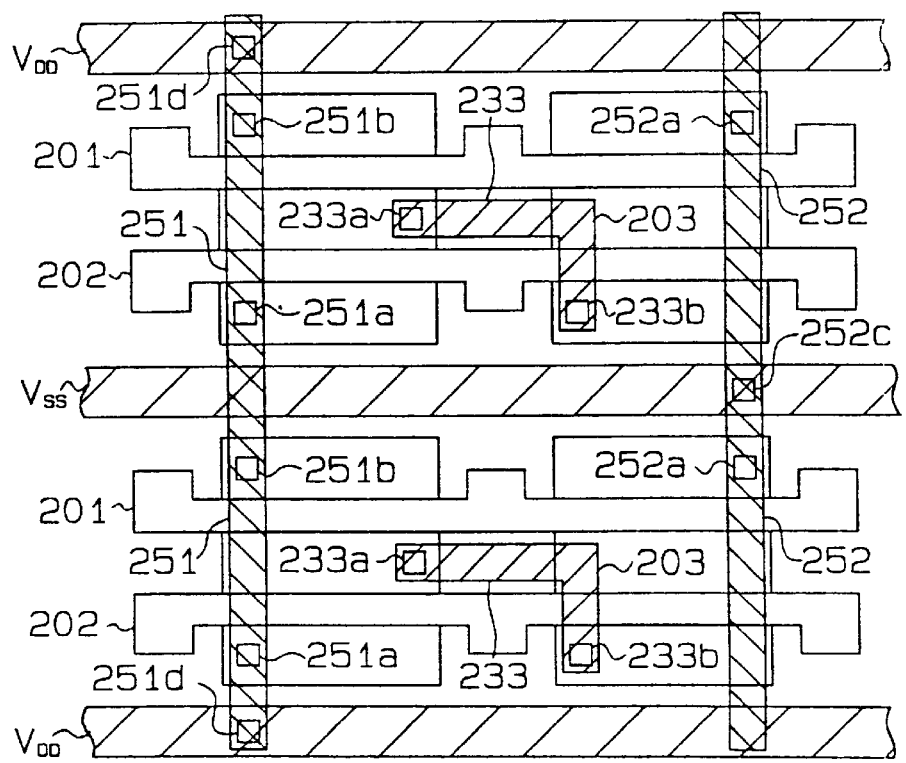
FIG. 13 is a layout where the real pattern of FIG. 12 is utilized.

FIG. 13 illustrates the layout of the two double input NAND gates, disposed opposite each other with respect to the low voltage power source line VSS. After the pattern 250 is placed, the CPU 21 erases the contact hole 251c which is disposed at the crossing section of the VDD and VSS lines. The CPU 21 further automatically erases the contact holes 252b, 252c which are disposed at the crossing sections of the VDD and VSS lines. Therefore, the pattern 250 can be placed at any arbitrary location within basic cell.

Accordingly, only one cell pattern is required with respect to each one of the cells in this embodiment beforehand. Therefore, the number of the cell patterns to be stored beforehand can be reduced. Further, the steps for generating the cell pattern can be reduced. According to the embodiment, the logic cell can be more freely positioned on the basic cell with less respect to the limitations imposed on the cell design by the power supply lines.

The cell placing operation carried out by the planing system also requires consideration of signal propagation delay time. Such considerations include the wiring length of the wiring net being assigned and a clock dividing circuit.

Cell placement according to the assigned length wiring will now be described referring to FIGS. 17 though 36. This cell placement includes first, the operation of a non-placed logic cell routine carried out when the location of each cell forming the logical connection in the semiconductor is not determined and second, the operation of a previously placed logic cell routine carried out when the location of at least one of cell forming the logical connection has been placed.

The operation relating to the non-placed logic cell will now be described. In this operation, after a placing control matrix shown in FIG. 17 is generated, the operation for allocating the logic cells is carried out as shown in FIG. 18.

Figure 22:
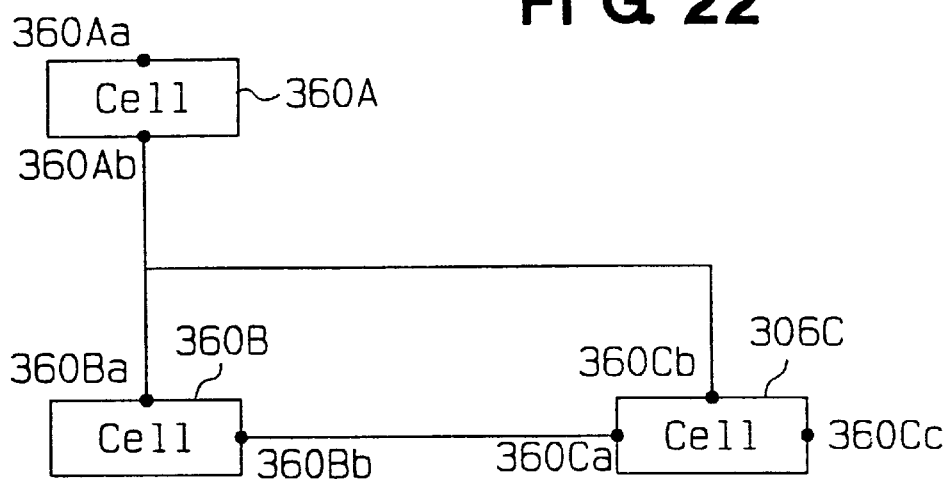
FIG. 22 is an explanatory diagram of one example of a logic cell connection.

For purposes of illustration without limitation assume that logic connections including a wiring net connection in FIG. 22 of a terminal 360Ab of cell 360A, terminal 36Ba of cell 360B and terminal 360Cb of cell 360C, and a net connecting a terminal 360Bb of cell 360B and terminal 360Ca of cell 360C exist. Again, without limitation assume that the distance between the terminals 360Ab and 360Ca is set to "20", distance between the terminals 360Ab and 360Ca is set to "100", and distance between the terminals 360Bb and 360Ca is set to "40".

Figure 17:
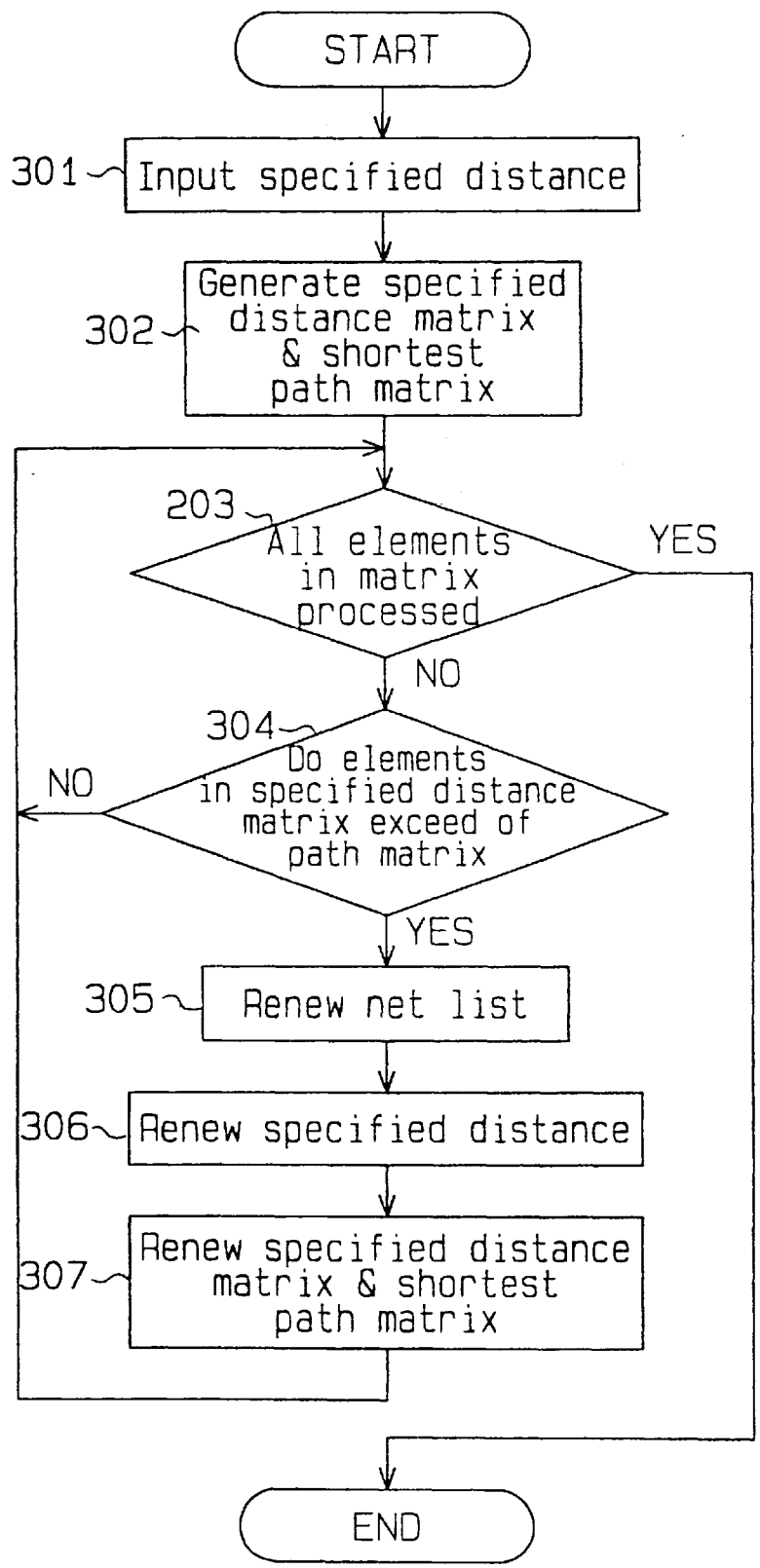
FIG. 17 is a flowchart of plotting operations for a placing control matrix in the cell layout.
Figure 18:
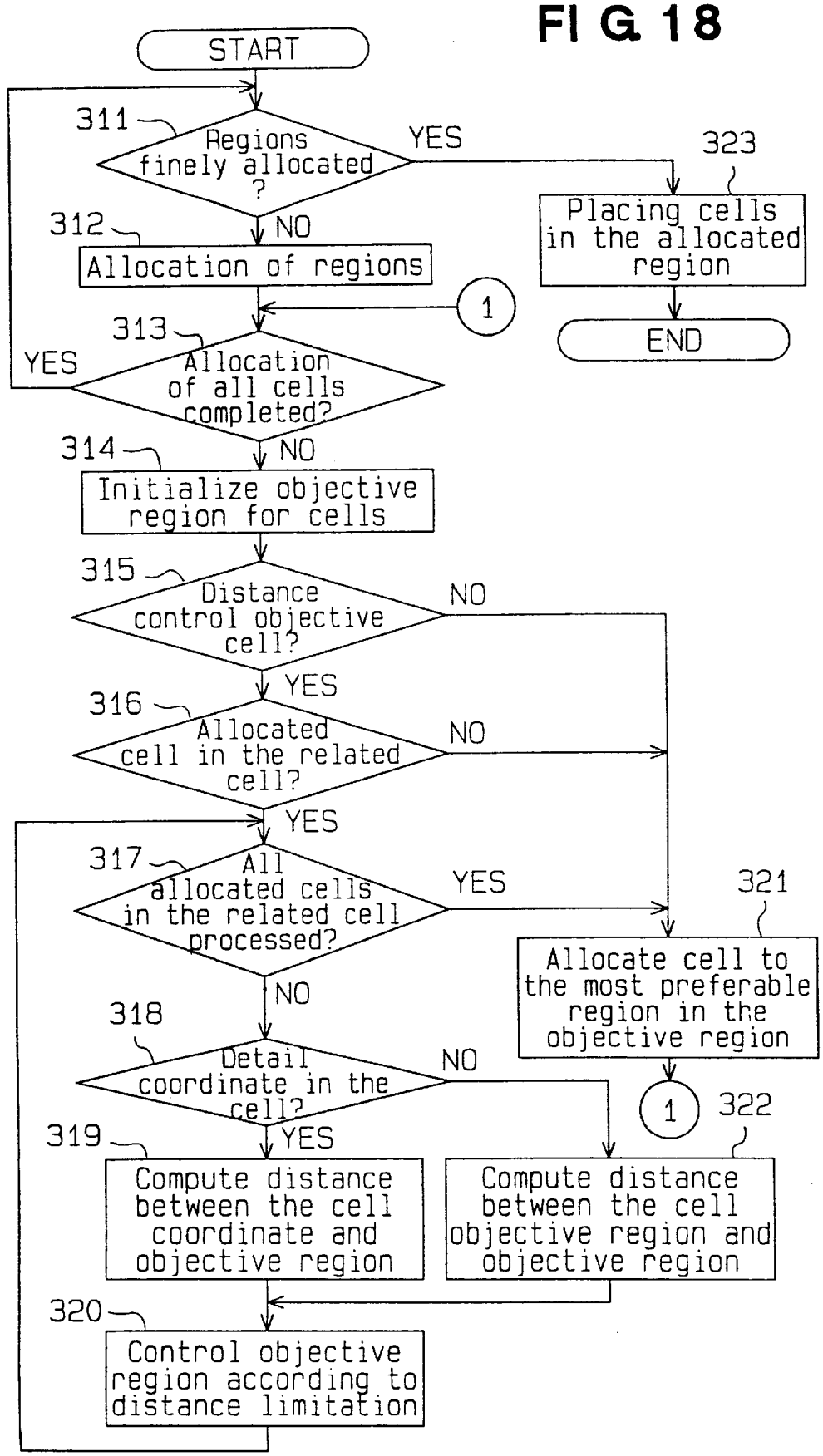
FIG. 18 is a flowchart of cell allocation operations used in the cell layout.
Figure 23:
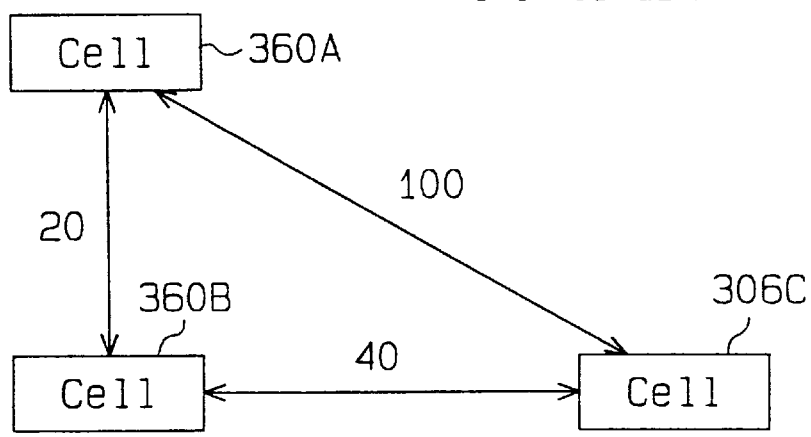
FIG. 23 is a diagram explaining the calculation of the distance between the plurality of the cells.
Figure 24:
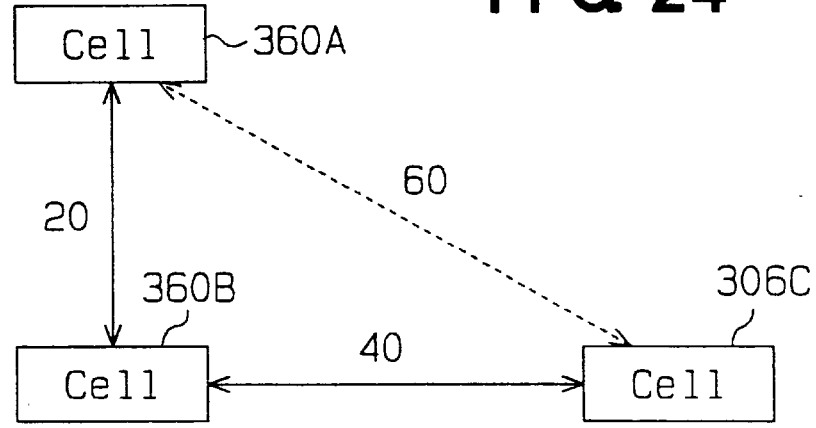
FIG. 24 is another diagram explaining the calculation of the distance between the plurality of the cells.
Figures 25, 26, 27:
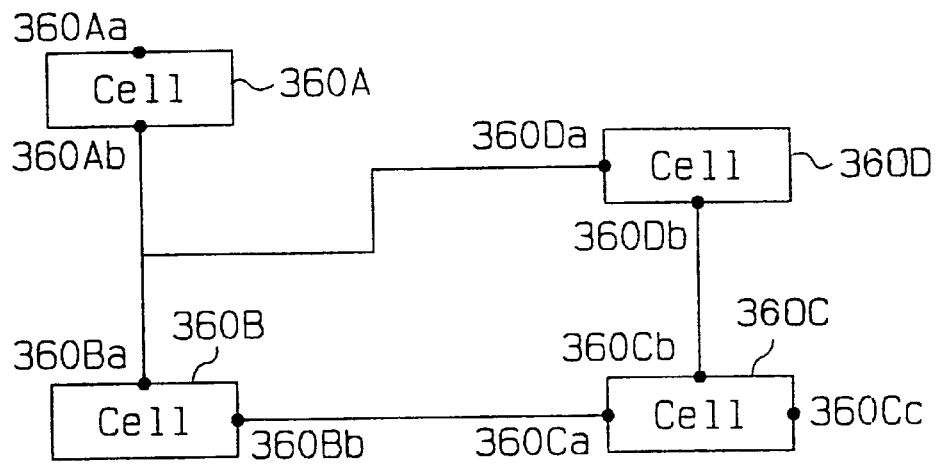
FIG. 25 is an explanatory diagram of logic cell wiring connection after recalculating the distance between the logic cells.
FIG. 26 is an explanatory diagram of a preset distance between the logic cells illustrated with matrix.
FIG. 27 is an explanatory diagram of the distance representing a minimized path between logic calls illustrated with a matrix.

The distances between the terminals 360Ab and 360Ba, between the terminals 360Ab and 360Cb, and between the terminals 360bb and 360Ca are input (step 301 of FIG. 17). An assigned distance matrix shown in FIG. 26 is generated according to the input assigned distances (step 302). FIG. 23 shows the distance between associate cells shown in FIG. 26. The minimized paths between the respective cells among the cells 360A, 360B, 360C are computed. The minimized path matrix as shown in FIG. 27 is generated. In this minimized matrix, the minimized path between the cell 360A and 360C in FIG. 24 is "60". That is, the minimized path between the cells 360A and 360C never exceeds the summed distances of the minimized path between the cells 360A and 360B, and the cells 360B and 360C. FIG. 24 shows the distances between the associated cells according to the assigned distance matrix as shown in FIG. 27.

The determination that the operations of steps 301, 302 regarding to all elements in the assigned distance matrix have been completed, is carried out (step 303). When the system determines that the unprocessed elements still exist at step 303, the operation is advanced to step 304.

The determination of whether or not the values of elements in the assigned distance matrix exceed the value of corresponding element in the minimized matrix is performed next (step 304). The assigned distance between the cells 360A and 360C in the assigned distance matrix shown in FIG. 26 exceeds the minimized path distance between the cells 360A and 360C in the minimized path matrix shown in FIG. 27. Therefore, it is determined that the wiring between the cells 360A and 360C can not be realized by setting the locations thereof.

As shown in FIG. 25, a dummy cell (i.e., detour path terminal cell) 360D is placed on the path between the cells 360a and 360c which are determined not to be realized (step 305). At the placement of the dummy terminal 360D, wiring nets are added between the terminal points 360Da, 360Ab, and 360Cb, and between the terminal points 360Da and 360Cb. Following this, the net list is updated.

As the dummy was placed, the preassigned distance "100" between the terminals 360Ab and 360Cb is changed to the distance "50" between both pairs of terminals 360Ab and 360Da, and 360Db and 360Cb (step 306).

Figures 28, 29, 30:
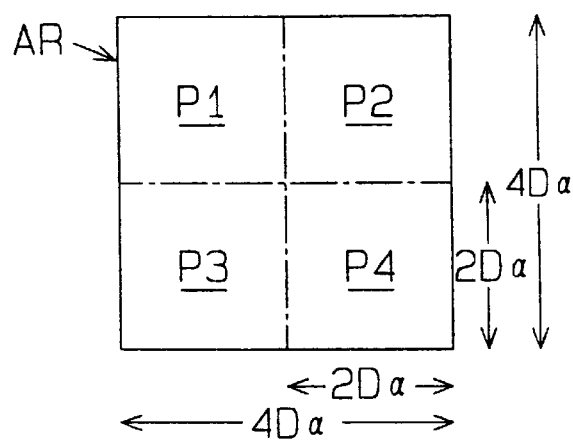
FIG. 28 is an explanatory diagram of the recalculation of the a renewed preset distance matrix of FIG. 27.
FIG. 29 is an explanatory diagram of the distance representing a minimized path between logic cells illustrated with a matrix.
FIG. 30 is an explanatory diagram of the allocating operations for various regions of cell placement.

The operation for updating distance information among the cells 360A, 360B, 360c, 360D occurs at the assigning distance procedure (step 307) due to the information provided from step 306. As shown in FIG. 28, the updated distance matrix FIG. 28 shows the distance of the associated cells which are to be separately placed. The matrix element having "-1" indicates that no direct distance exists at that location. The minimized path matrix shown in FIG. 29 is updated according to the assigned distance matrix shown in FIG. 28. This minimized distance matrix shows a maximized distance which receives the limitation of the associated cells for realizing the assigned distance. For purposes of illustration without limitation, in FIG. 28, no direct assigned distance between the cells 360A and 360C exists. However, when these cells are positioned such that they exceed the distance "60" therebetween, the distance between the cells 360A and 360B, or between the cells 360B and 360C is indeterminate.

The operations for allocating each cell having location relationship according to the assigned distance matrix on the semiconductor chip are carried out according to the flowchart of FIG. 18. The determination whether or not the placing region of cell is allocated in the fine sections is carried out (step 311). When the system determines that no fine allocation of the placing region has not occurred, the placing region is allocated (step 312). Next the cell allocation operation determines whether or not allocation of all cells on the chip has been completed (step 313). It is determined that unallocated cells still exist at step 313, an objective region for allocating the cell on the chip is initialized (step 314).

When the system determines that a distance between the cells to be allocated should be controlled (step 315), the system then determines whether or not the allocated cells exist in the related objective cells (step 316). When the system determines that the assigned cell exists in the related cells at step 316, the system next determine whether or not the all allocated cells have been processed with the operation in the related cells (step 317).

If it is determined that an unprocessed allocated cell exists at step 317, the operation advances to step 318 where coordinate value for the allocated cell are generated (step 318). When the allocated cells have the definite coordinate values, the distance between the definite coordinate values and the objective cell region is computed (step 319), and the system advances to step 320. When the system determines that the allocated cell lacks definite coordinate values at step 318, the distances between the objective cell region and each of objective cell regions are computed (step 322). In other words, when the objective allocate regions Pm, Pn exist on the chip as shown in FIG. 31, the distances between the associated regions are determined using the Manhattan distance between the closest points a2 and b1, and the Manhattan distance between the most parted points a2 and b2 in the regions Pm and Pn. Likewise, the distances between the definite coordinate values and the objective allocate region are determined using the Manhattan distance between the closest points in the definite coordinate value and the objective allocate region, respectively, and the Manhattan distance between the most distant points thereof, respectively.

The objective allocate region is controlled according to the distance limitation (step 320), after which the system returns back to step 317 and repeatedly carries out the operations starting from step 317.

If it is determined that the cell is not the distance control objective cell at step 315, then either the allocated cell does not exist in the related cells at step 316, or all allocated cells in the related cells have been processed at step 317, and the operation advances to step 321. After the cell is allocated to the most preferable region in the allocation objective regions (step 321), the system returns to step 313, and carries out the operations starting from the step 313. If it is determined that the operation for placing all cells has been completed at step 313, the system returns to step 311.

When the system determines that a cell region is finely divided at step 311, each cell is allocated in the associate allocate region by reference to the terminal distance assignment (step 323).

Therefore, for purposes of illustration but not for limitation, assume that the placing region AR for the cell shown in FIG. 30 is on the chip and that two cells CE1, CE2 (not shown) are placed in the placing region AR, which are separated by the distance of "50", according to the assigned distance of the terminals.

This region AR is divided into four allocate objective regions P1 through P4. At this stage, the two cells CE1, CE2 can be placed to each one of the allocate objective regions P1 through P4. Assume for purposes of illustration but not for limitation that the distance Dα is set to "15". When the cell CE1 is to be positioned the related cell CE2 is not considered for positioning. Prior to positioning the cell CE2, the distances between the allocate objective region P2 and the regions P1 through P4 are computed, respectively. As shown FIG. 33, the minimized distances between the each of the regions P1 through P4 and the region to be used for placement of CE2 and P2 converge to "0", and each of the maximized distances become "50". Therefore, the region where the allocation of the cell CE2 is limited by assigning that the distance is determined not to exist. Therefore, the cell CE2, for example, is allocated to the allocate objective region P1.

As shown in FIG. 32, each of the cell placement regions P1 through P4 is divided into four allocate objective regions P11 through P14, P21 through P24, P31 through P34, and P41 through P44, respectively. At this stage, the cell CE1 can be allocated to each of the cell placement regions P21 through P24, and the cell CE2 can be allocated to the cell placement regions P11 through P14.

When the cell CE2 is set to be positioned, the relative cell CE1 is not considered for positioning. Prior to positioning the cell CE1, the distances between the cell placement region P14 and regions P21 through P24 are computed. As shown in FIG. 34, the allocate objective region for the cell CE1 is limited to the regions P21, P23, P24 by assigning the distance. Assume when the cell CE1 is allocated to the allocate objective region P22, the operation for assigning the distance can not be realized.

The operations relating the previously placed logic will now be described. In the operations, after checking the distance limitation for the previously placed cells shown in FIG. 19, an adjustment is made to the calculation of the previously placed cell's location of FIGS. 20 and 21.

Figure 19:
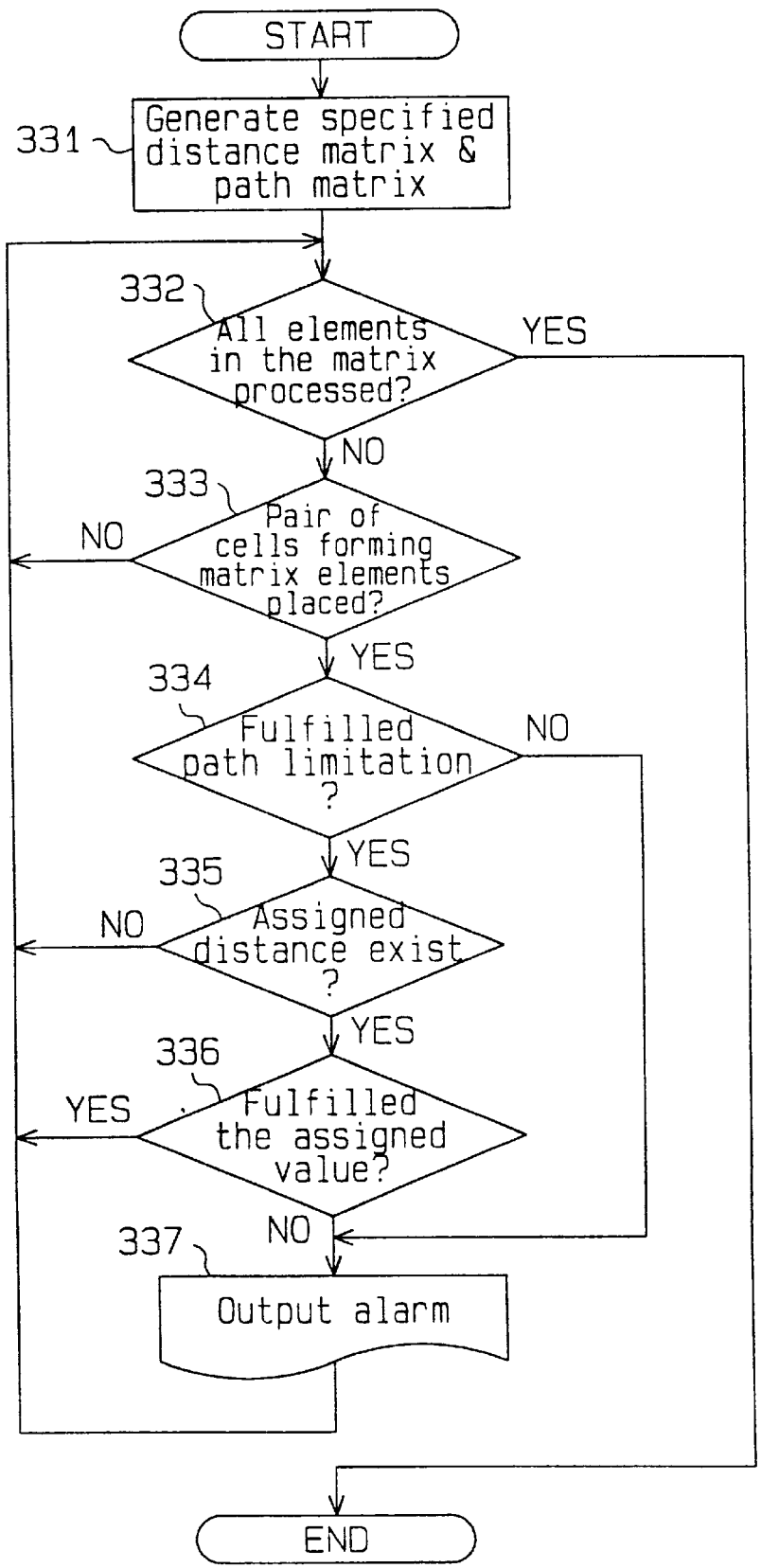
FIG. 19 is a flowchart illustrating a routine for checking whether or not the placed cell fulfills the assigned line distance.

The flowchart of FIG. 19 explains the distance limitation checking procedure carried out when at least one of cells is a previously placed cell having a logic connection to another cell.

An assigned distance matrix is generated with respect to each cell having such a logical relationship similar to step 302 (step 331). The minimized path matrix is generated according to this assigned distance matrix.

A determination is next made whether or not all elements in the assign distance matrix have been processed (step 332). When the system determines that any unprocessed elements exist at step 332, the system advances to step 333. When the system determines that a pair of cells forming the elements of the matrix exist (step 333), the system then determines whether or not the pair fulfill a minimized path limitation (step 334). When the system determines that the pair meet the minimized path limitation at step 334, the system advances to step 335, and determines whether or not the distance limitation exists.

When the system determines that the distance limitation exists at step 335, it then determines whether or not the distance between the paired cells meet the assigned distance (step 336). When the system determines that the distance between the paired cells meet the assigned distance at step 336, an alarm is output at step 337. The information relating to the alarm is stored in the layout data.

The system then returns to step 332, and carries out the operations starting from step 332. When the system determines that all elements of the matrix have been processed at step 332, the system terminates the operation.

Figure 20:
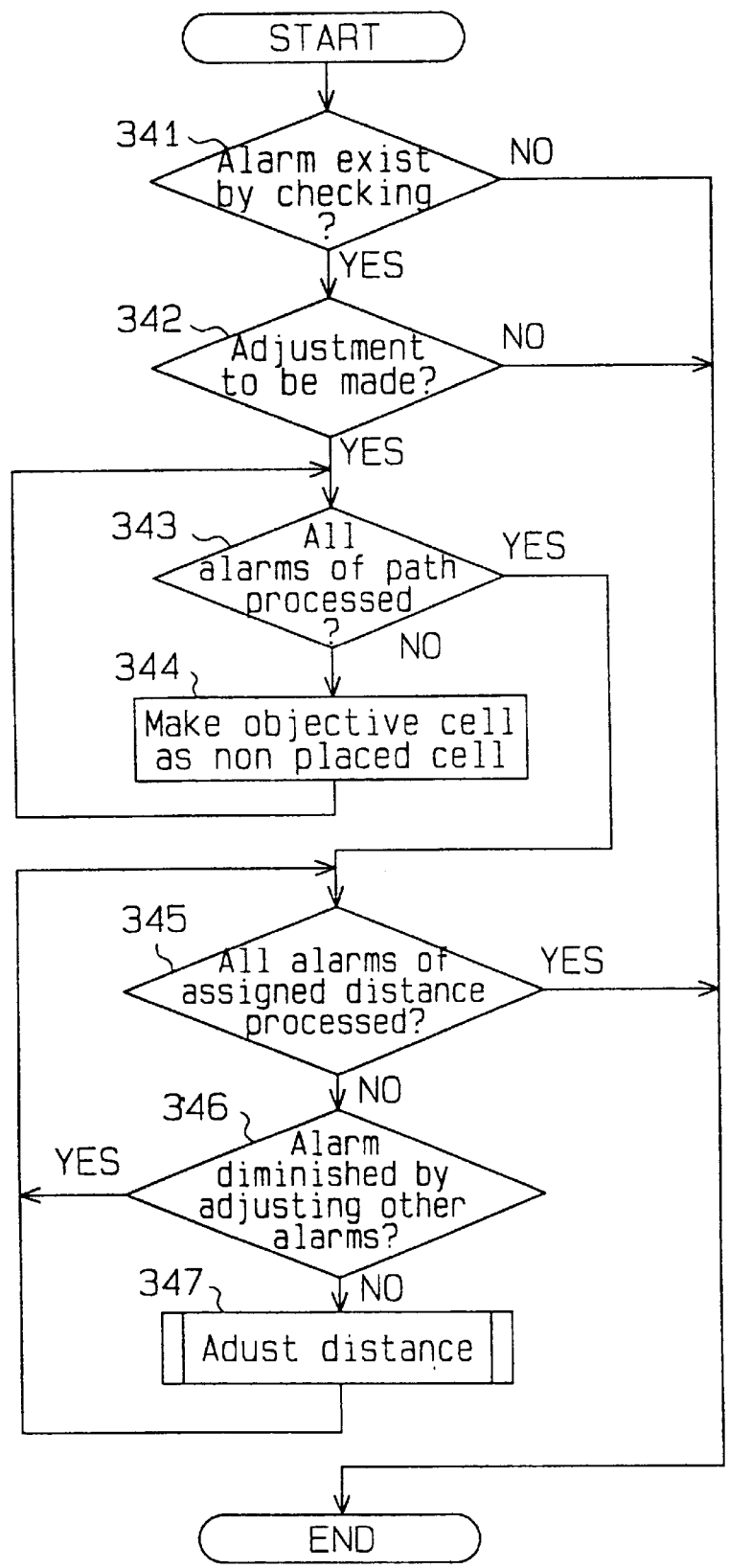
FIG. 20 is a flowchart showing the operations for adjusting the position of the placed cell in the call layout.

The operation for adjusting the placed location of the previously placed cell will now be described referring to FIG. 20.

The system determines whether or not the alarm is output during checking the distance limitation (shown in FIG. 19) of the previously placed cell (step 341). When the system determines that the alarm was output respecting a previously placed cell, the system determined whether or not the distance limitation adjustment is to be carried out (step 342).

If the system determines that a distance adjustment is to be carried out at step 342, the system then determines whether or not the adjustment has been made at step 343. When the system determines that unprocessed previously placed cells exist at step 343, the system advances to step 344, where the system characterizes the previously placed cells as non-changed cells. Through this change in cell characterization, the minimized path restriction in observed.

When the system determines that all the previously placed or non-placed cells fulfill the minimum path requirement, the system advance to step 345. There the system determines whether previously placed cells meet the assigned distance requirement. If the requirement is not met, the system continues to maintain alarms indicating that the requirement has not yet been met. Under this condition, the system then moves to step 346 where the system determines whether other system alarms nullify the alarm condition set off for the assigned distance requirement. Under this condition, the system advances to step 347 and adjusts the distances.

Figure 21:
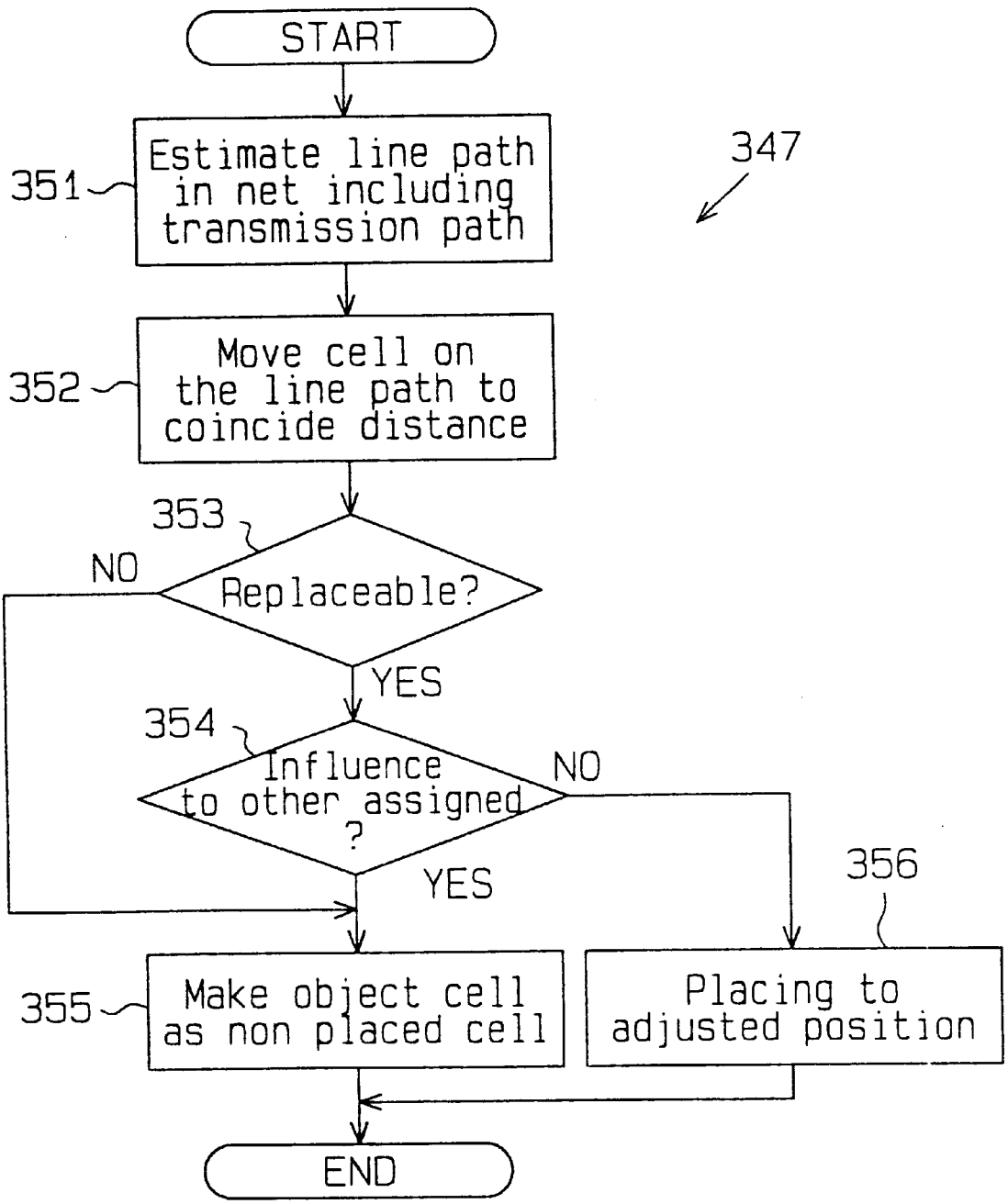
FIG. 21 is a flowchart of distance adjusting routine performed operations during the cell layout.

In the distance adjustment at step 347, the system estimates the line paths of the wiring net including the transmission paths (step 351) of FIG. 21. The system moves the cell on the estimated wiring path and determines its distance (step 352).

The system determines whether or not the moved cell can be replaced (step 353). When the system determines that the cell is replaceable, the system determines whether or not the assign distances of other paths would be influenced (step 354) by the replaced cell. If the paths would be so influenced, the system classifies the condition of the cell to that of being non-placed (step 355). When the system determines that the cell replacement does not influence other path distances, the cell at step 354 is placed to the adjusted location which was computed at step 352.

The above-described operations will now be described in detail. For example, assume that cells 360E, 360F shown in FIG. 35 are placed at distance which exceed the assigned distances. Further assume that the assigned distances exist between a terminal 360e of the cell 360E and a terminal 360f of the cell 360F.

As shown in FIG. 35, the system estimates the wiring path 360e→360g→360h→360f of a wiring net, i.e. the portion along the transmission wire assigned to terminals 360e and 360f.

As shown in FIG. 36, the cell 360F is moved on the wiring path which connects the terminals 360e and 360f to the location indicated by a broken line, in order to realize the assign distance between the terminals. Even when the cell 360F is moved to the location indicated by a broken line, the cell 360F does not effect other assign distances and is movable. The adjustment is completed by moving the cell 360F to the location indicated by a broken line.

Accordingly, in this embodiment, the design distance matrix and minimized path matrix are generated with respect to the path between the cells where the assigned distance is set. When a value of the elements in the assigned distance matrix exceeds the value assigned to a corresponding element in the minimized matrix, a dummy cell is placed on the path between the cells. Therefore, each cell can be placed to realize the set assigned distance between a plurality of cells. The distance limitation check is carried out with respect to the previously placed cells which the assign distances were set, by generating the assigned distance matrix and the minimized path matrix. When the element in the assigned distance matrix exceeds the corresponding element in the minimized matrix, the system changes the previously placed cell to the condition of being non-placed, or moves the cell to adjust its distance. Therefore, even when the wiring operations are carried out by means of the auto wiring device without considering signal propagation delay time, the signal propagation delay time between the terminals converges to an optimal value, thereby allowing the functional ability of chip to be increased.

A clock distribution circuit for cell placement by fixed wiring will now be described referring to FIGS. 37 through 49.

Figure 37:
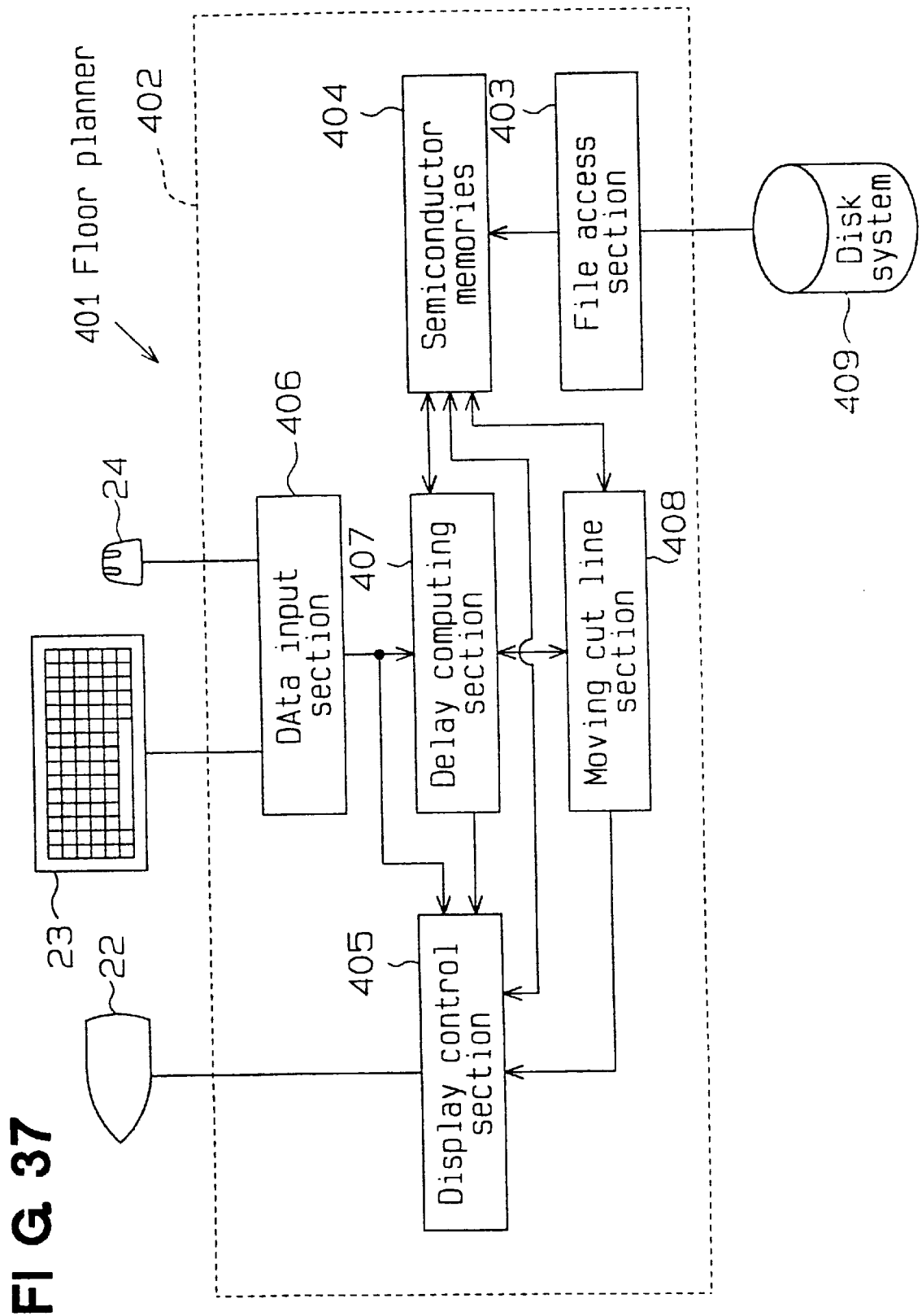
FIG. 37 is a block diagram of a circuit planner routine illustrating the apparatus for carrying out logic cell design and placement.

A circuit planner routine 401 shown in FIG. 37 is executed when the CPU 21 reads the cell placing program 32. The planner 401 includes a main frame 402, disk system 409, graphic display 22, key board 23 and mouse 24. The main frame comprises a file access section 403, semiconductor memories 404, display control section 405, data input section 406, delay computing section 407 and moving out line section 408.

Figure 38:
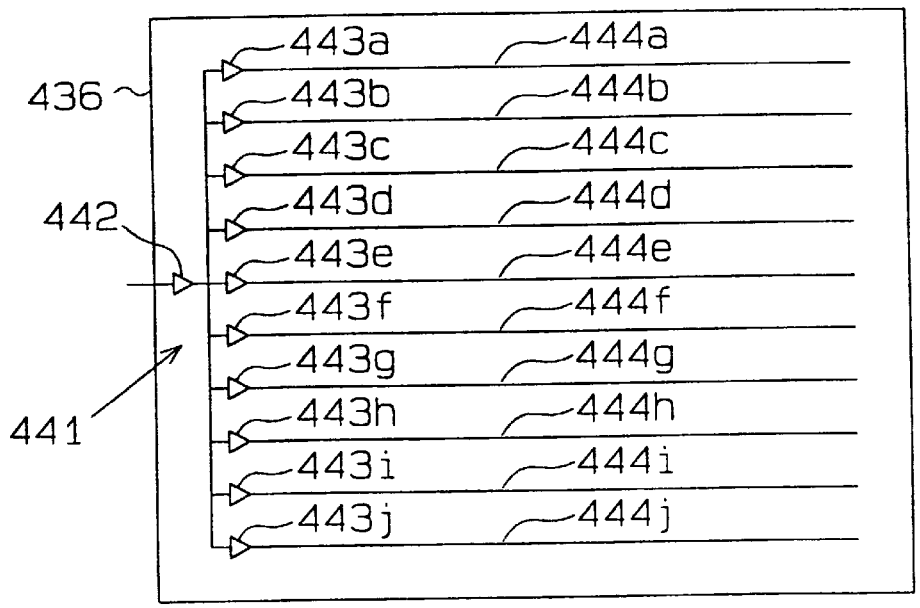
FIG. 38 is a diagram blowing a clock distribution circuit displayed on a display unit.
Figure 43:
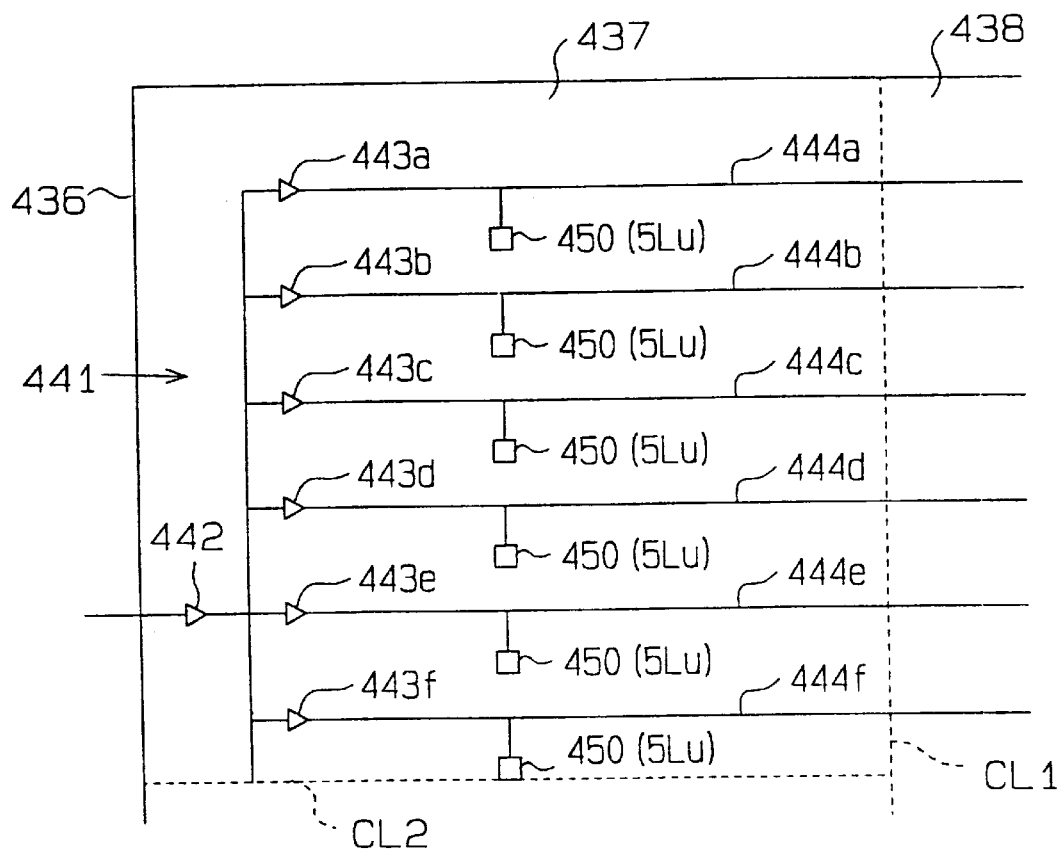
FIG. 43 is a diagram showing the coupling configuration of flip-flop cells with the fixed signal line.

The disk system 409 is connected to the file access section 403. As shown in FIG. 38, the disk system 409 stores pattern data and cell placement data for displaying a semiconductor chip 436 and clock distribution circuit 441. The clock distribution circuit 441 comprises a main driver 442, secondary drivers 443a through 443j as drive circuits, and fixed signal lines 444a through 444j. The main driver 442 inputs clock signals from an external section (not shown). The main driver connects to each of the secondary drivers 443a through 443j which has a similar output capability to that of the main driver 442. The outputs of the secondary drivers 443a through 443j connect to the fixed signal lines 444a through 444j, respectively. Each of the fixed signal lines 444a through 444j indicates a portion where the associate secondary driver is assigned on the chip 436. As shown in FIG. 43, each one of the fixed signal lines 444i through 444j connects to a flip flop (hereinafter referred to as FF) 450 as a load cell.

Figure 48:
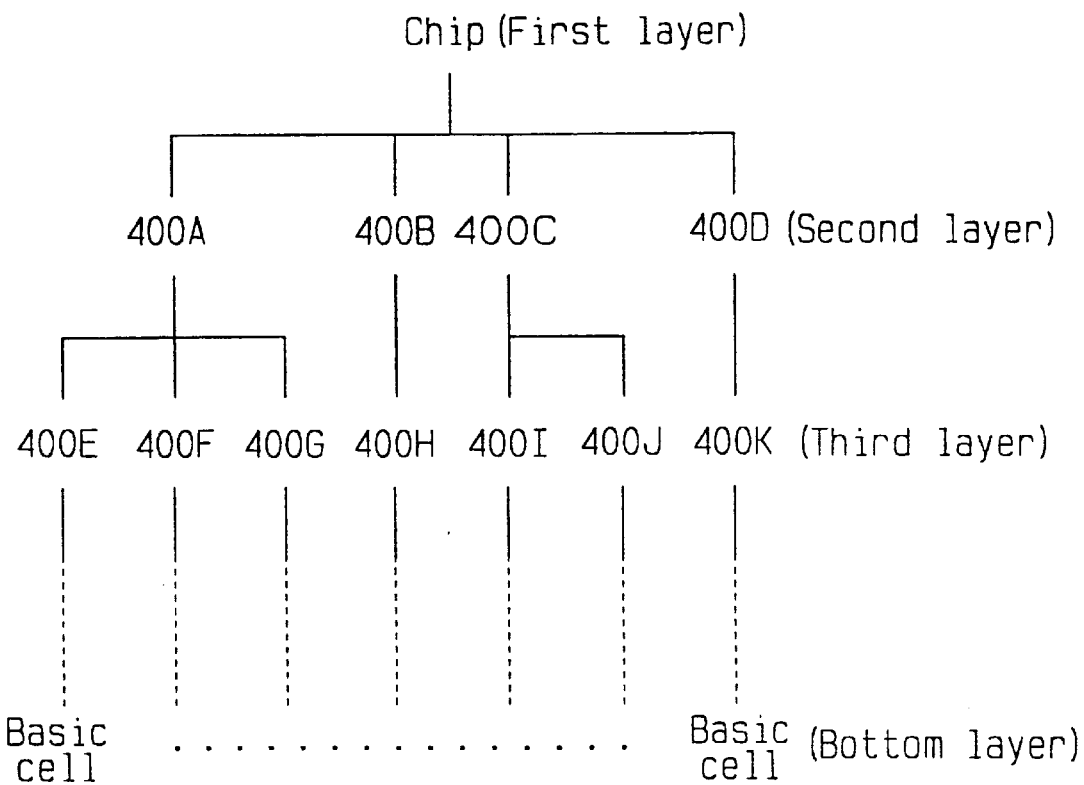
FIG. 48 is a diagram showing the construction of logic planning data.
Figure 49:
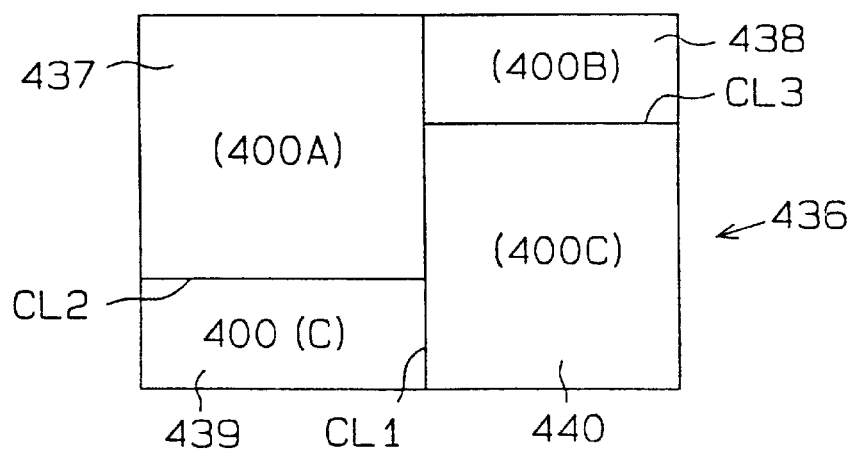
FIG. 49 is an explanatory diagram showing the conditions where a plurality of functional blocks are placed in a chip.

As shown in FIG. 48, the disk system 409 further stores logic planning data in a stair configuration. The first stair of the chip is defined by functional blocks 400A through 400D of the second stair. The functional blocks 400A through 400D are defined by functional blocks 400E through 400G, 400H, 400I, 400J, 400K, respectively. Each one of the functional blocks 400E through 400K is sequentially defined by an associated functional block disposed at following stair. The bottom stair is defined by basic cells such as AND or OR gates.

The file access section 403 reads out data of the chip 436, clock distribution circuit 441, each of the functional blocks 400A through 400K from the disk system 409. The file access section 403 stores those read out data in the memories 404. The file access section 403 bas the capacity to store those data in the disk system 409.

The display control section 405 connects to the display 22. The display control section 405 reads out the pattern data and placing data of the chip 436 from the memories 404. The display control section 405, by means of the display 22, displays the chip 436 according to the read out pattern and placement data, shown in FIG. 38.

The display control section 405 reads out the pattern and placement data of the clock distribution circuit 441 from the memories 404. The display control section, via the display 22, causes the clock distribution circuit 441 on the chip 436 to be displayed according to the read out pattern and placing data shown in FIG. 39.

Figure 39:
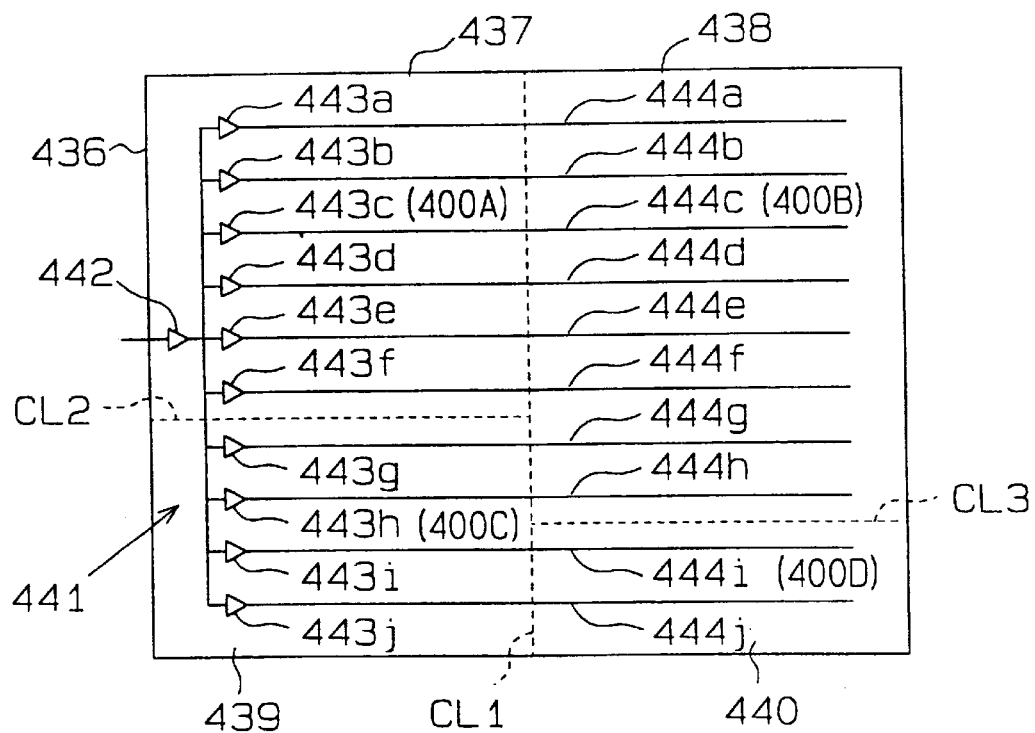
FIG. 39 is a diagram illustrating the division of semiconductor chip regions based on the placement out lines.
Figure 41:
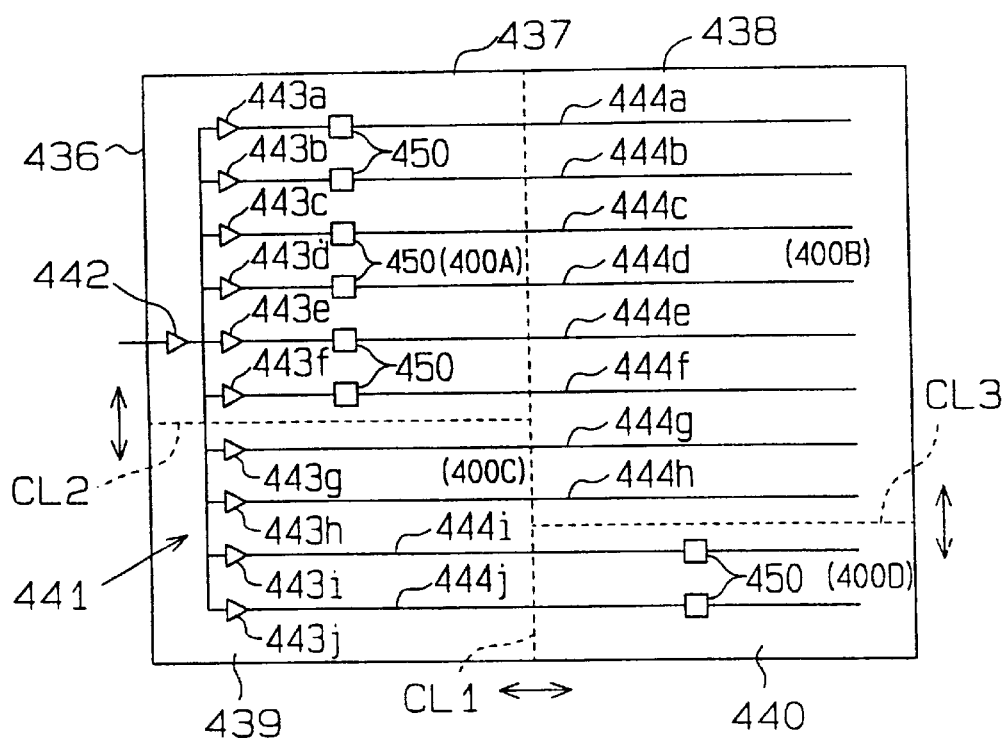
FIG. 41 is a diagram showing the movement of out lines between cell's placement regions.
Figure 42:
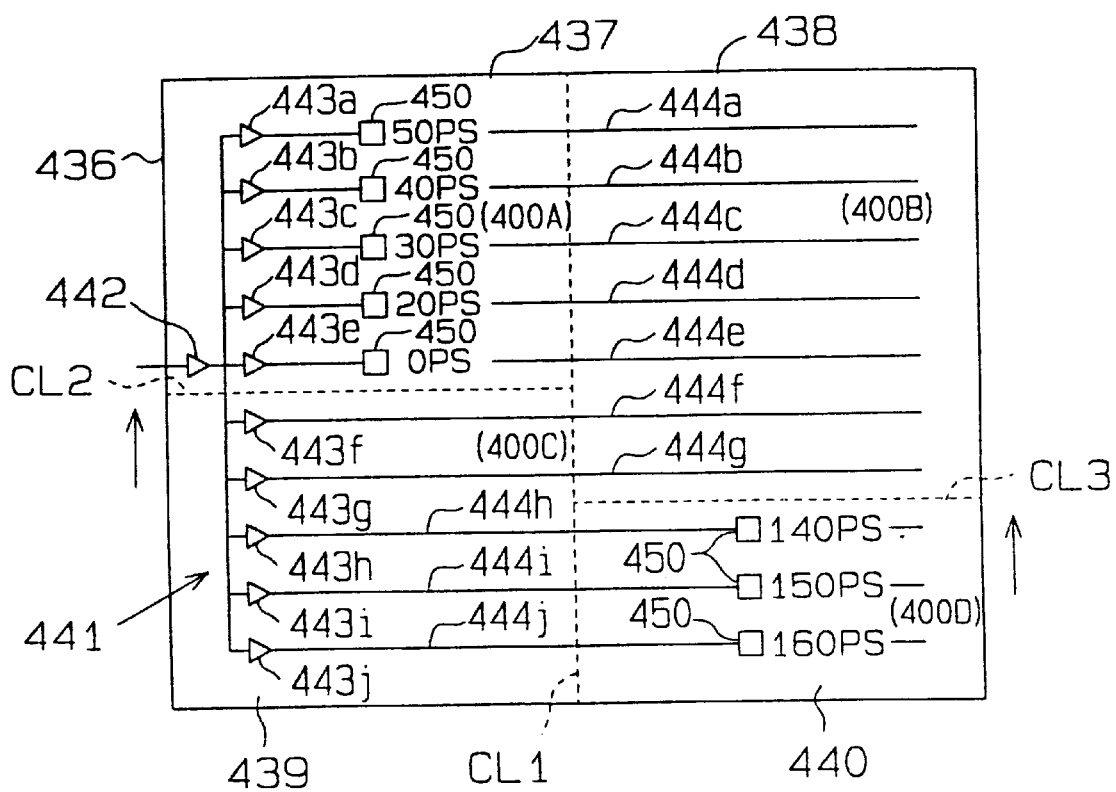
FIG. 42 is a diagram showing a reindicaton of the clockskew after the cut lines moved.

The key board 23 and mouse 24 connect to the data input section 406. The circuit layout planning operation as shown in FIG. 39 can execute a moving out line process as shown in FIGS. 41, 42 for dividing the regions on the chip according to the manipulation of the key board.23 or mouse 24. When the key board 23 or mouse 24 is manipulated, the data input section 406 outputs a signal to the display control section 405 and delay computing section 407.

During the floor layout planning, for example, when the key board 23 inputs the coordinate values of cut lines CL1 through CL3. The display control section 405 generates data for displaying the cut lines CL1 through CL3. The display control section 405 cause the display 22 generate the cut lines CL1 through CL3 which are indicated by broken lines on the chip 436 according to the generated data, as shown in FIG. 39. By these cut lines CL1 through CL3, the chip 436 is divided into a plurality of placing regions 437 through 440. Each of the functional blocks 400A through 400D is selected and allocated to the respective placing regions 437 through 440. Accordingly, the display control section 405 places the functional blocks 400A through 400D to the corresponding placing regions 437 through 440, respectively, as shown in FIG. 39.

During the circuit layout planning, when the functional blocks 400A through 400D are placed in the corresponding placing regions 437 through 440, respectively, the delay computing section 407 reads out the data of the clock distributing circuit 441, and data such as kinds, the number and load capacity of each of FF cells in the functional blocks 400A through 400D from the memories 404.

The delay computing section 407 computes total load capacities connected to the fixed signal lines 444a through 444j in the placing regions 437 through 440 according to the read out data, respectively. The delay computing section 407 then computes delay time (i.e., signal delay time) of FF cell connected to the fixed signal lines 444a through 444j in the placing regions 437 through 440 according to the computed total load capacities, respectively.

The delay computation will now be described.

Figure 44:
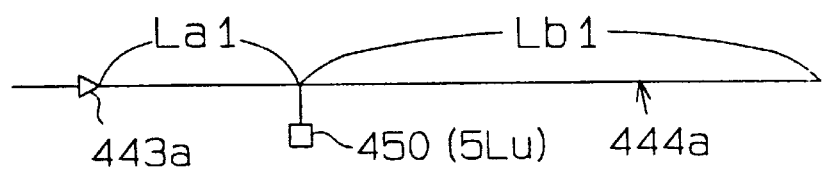
FIG. 44 is a diagram showing the way of computing delay time in FIG. 43.

Assume for purposes of illustration but not limitation, that the secondary driver connects to one FF cell of a functional block in the placing region 437, where the FF cell 450, having 30 Lu (i.e., loading unit: unit of capacity), is connected. Assume that these FF cells 450 are connected to the fixed signal lines 444a through 444f, respectively, as shown in FIG. 43. The fixed signal lines 444a through 444f connect to the FF cells 450 which have 5 Lu, respectively. The unit resistance and unit capacity of the fixed signal line 444a has been known beforehand. Accordingly, as shown in FIG. 44, a driver cell delay between the secondary driver 443a and FF cell 450 can be estimated through the known RC path delay equation, based on the lengths La1, Lb1 and load capacity. The driver cell delay between each of secondary drivers 443b through 443f and FF cell 450 can be similarly computed.

Figure 45:
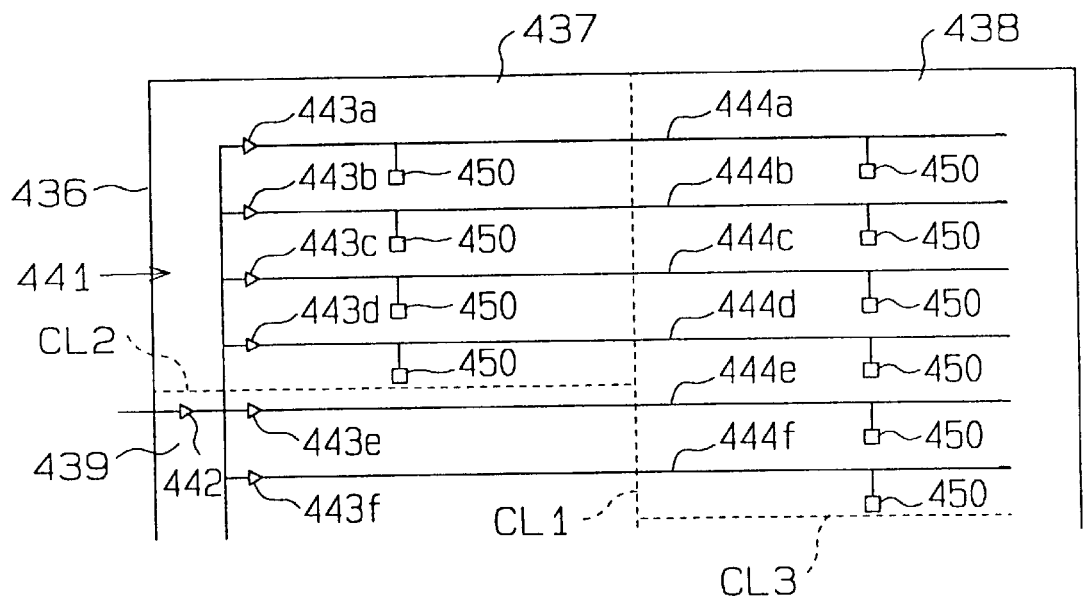
FIG. 45 is a diagram showing the coupling configuration of flip-flop cells with the fixed signal line.
Figure 46:
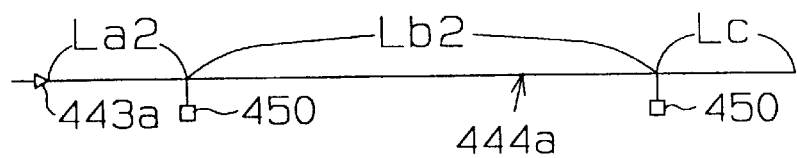
FIG. 46 is a diagram showing a way of computing delay time in FIG. 45.

Assume that the secondary driver connects to a plurality of the FF cells of different functional blocks, e.g., as shown in FIG. 45, each of the fixed signal lines 444a through 444d connect to the FF cells in the placing regions 437, 438, respectively, and each of the fixed signal lines 444e, 444f connect to the FF cells 450 in the placing region 438, respectively. Accordingly, a driver cell delay between the secondary driver 443a and the FF cell 450 can be estimated, based on the lengths La2, Lb2, Lc, and the load capacities connected to the fixed signal lines 444a in each placing regions 437, 438, as shown in FIG. 46. The drive cell delay time of each driver cell between the secondary driver 443e, 443f and the FF cells 450 can be computed, based on the length (La2+Lb2), Lc, and load capacities connected to the fixed signal lines 444e and 444f in the placing region 438. However, in the case according to the FIG. 45, in the placing region 430 the driver cell delay between the secondary driver 443a through 443d and the FF cells 450 differ from that between the secondary driver 443e, 443f and the FF cells 450.

The delay computation section 407 computes the driver delay between the main driver 442 and each of secondary drivers 443a through 443j. The delay computation section 407 computes the FF delay between the main driver 442 and each of the FF cells 450 by adding each of computed driver delay and corresponding computed driver cell delay.

The delay computation section 407 computes each clockskew (signal delay time difference) by subtracting the minimum FF delay from each of the computed FF delays, and output the results of the subtraction to the display control section 405. The delay computation section 407 carries out the clockskew computation every time the cut line is moved.

Figure 40:
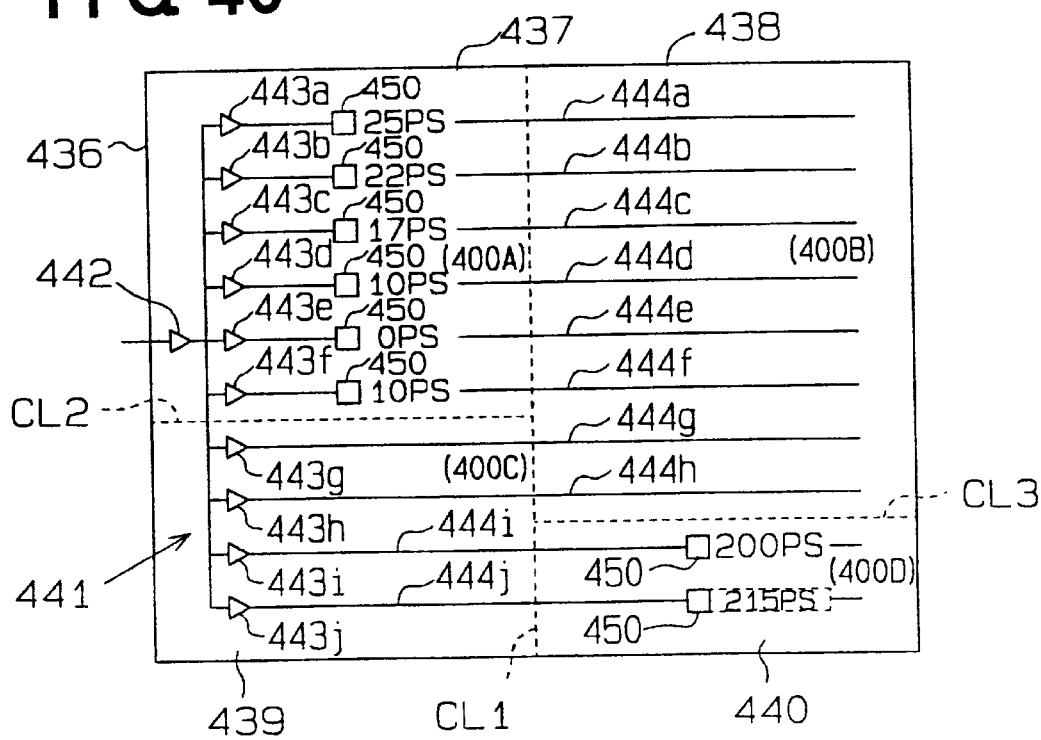
FIG. 40 is a diagram showing a clockskew of the fixed signal lines in each of a cell's placement regions.

The display control section 405 indicates each clockskew of the corresponding fixed signal lines in each of the placing regions 437 through 440, as shown in FIG. 40. The display control section 407 emphasizes the maximum clockskew by a highlighted or flashing display. In FIG. 40, an the FF delay between the fixed signal line 444e and the FF cell 450 in the placing region is minimized, the clockskew thereof is 0 PS (pico seconds). The clockskew 215 PS of the fixed signal line 444e in the placing region 440 is the maximum clockskew and its display is emphasized.

After the circuit planning is completed, the moving cut line operation is selected with input from the key board 23 or the mouse 24. The moving cut line section 408 carries out the moving out line operation which is indicated in the circuit planning, which in turn reduced the entire clockskews of the chip 436.

Figure 47:
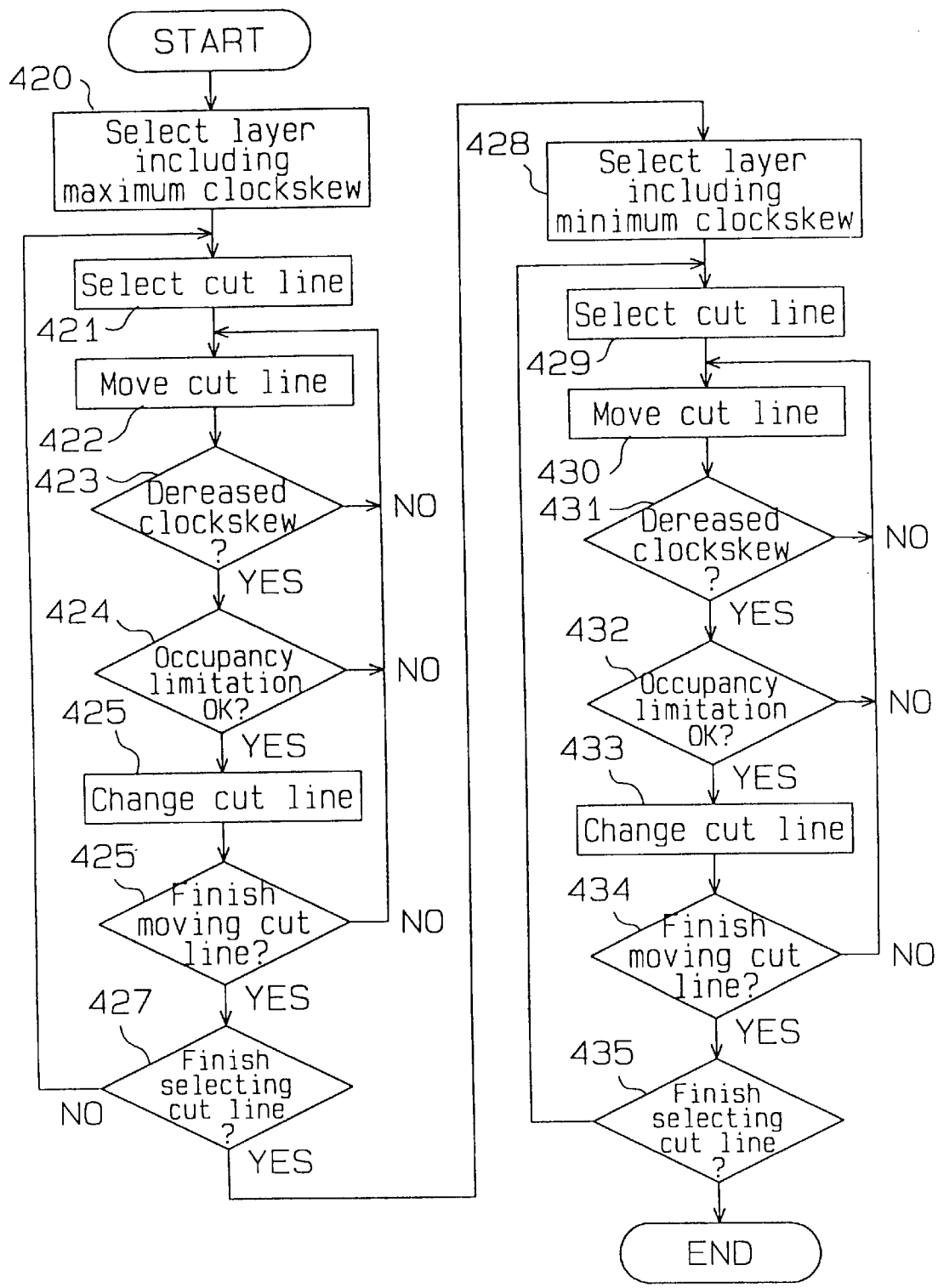
FIG. 47 is a flow chart showing the operations of the floor planner.

The operation for moving cut lines will now be described in detail referring to FIG. 47.

The moving cut line solution 408 selects a placing region of a stair construction including a maximized clockskew (step 420). The section 408 selects one of the cut lines which divides the selected placing region (step 421), and moves the selected cut line (step 422).

As the delay computing section 407 recomputes the clockskew of each fixed signal lines in the placing region according to the movement of the cut line, the section 408 determines whether or not the combined clockskews of the chip are reduced (step 423).

The section 400 determines whether the clockskews are reduced, the section 408 date determine whether or not the cell occupancy rate of the functional block placed in the placing region fulfills the preset occupancy rate limitation (step 424). This determination in carried out because the cell occupancy rate changes according to the change in the size of the placing region due to the movement of the cut line. When the section 408 determines that the occupancy rate limitation is fulfilled at step 424, the location of the cut line is moved to a location which fulfill the limitation (step 425).

The section 408 then determines whether or not the operation for moving the cut line is completed (step 426). The section 408 determines that the operation is not completed, yet, the section 408 repeatedly carries out the operations starting from the step 422. When the section 408 determines that clockskew is not reduced at step 423 or the occupancy rate is not fulfilled at step 424, the section 408 repeatedly carries out the operations starting from the step 422.

When the section 408 determines that the operation for moving the out line is completed at step 426, the section 406 determines whether or not the operation for selecting the cut line is completed, i.e., it determines whether or not an unprocessed line exists at step 427. When the section 408 determines that the unprocessed line exists at step 427, the section 400 repeatedly carries out the operations starting from the step 421.

When the section 400 determines that the operation for selecting the cut line is completed at step 427, the section 408 selects the stair of the placing region including the minimum clockskew (step 428). The section 408 selects any one of the cut lines which divides the selected placing region (step 429), and moves the selected cut line (step 430).

The delay computation section 407 recomputes the clockskew of each fixed signal lines in the placing region according to the movement of the cut line, the section 408 determines whether or not the combined clockskews of the chip are reduced (step 431).

The section 408 determines that the clockskews are reduced, the section 408 determines whether or not the cell occupancy rate of the functional block placed in the placing region fulfills the preset occupancy rate limitation (step 432).

When the section 408 determines that the occupancy rate is met at step 432, the section 408 makes the cut line move to that location (step 433).

The section 408 determines whether or not the operations for moving the cut line is completed (step 434). When the section 408 determines that the operation for moving the cut line is not yet completed, the section 408 repeatedly carries out the operations starting from step 430. When the section 408 determines that the clockskew in not reduced at step 431 or the occupancy rate is not fulfilled at step 432, the section 408 repeatedly carries out the operations starting from step 434.

When the section 408 determines that the operation for moving the cut line is completed at step 434, the section 408 determines whether or not the operation for selecting the cut line is completed, i.e., determines whether or not the unprocessed cut line exists (step 435). When the section 408 determines that the unprocessed out line exists at step 435, the section 408 repeatedly carries out the operations starting from step 429.

When the section 408 determines that the operation for selecting the cut line is completed at step 435, the section 408 terminates the entire operation.

When the above-described moving cut line operation is employed in the circuit planing shown in FIG. 39, the placing region 440 shown in FIG. 40 is selected as the placing region which includes the maximum clockskew. The out line CL1 in the placing region 440 is selected, and horizontally moved (i.e., along the right-and-left direction in FIG. 41). In this case, the locations of load cells connected to each signal line in the region 440 are slightly changed. However, the number of signal lines included in the region 440 does not change. Further, the load capacity connected to each of the signal lines does not change. Therefore, the reduced magnitude clockskew is also small.

The out line CL3 is then selected, and vertically moved (i.e., along the up-and-down direction in FIG. 41). In this case, as shown in FIG. 42, when the cut line CL3 is moved upward within the region which meets the occupancy rate of the functional blocks placed in the placing region 438, the number of signal lines included in the region 440 increases, and the load capacity connected to each of the signal lines is reduced. As a result, delay time of each signal line in the region 440 is reduced. Therefore, the combined clockskews of the chip can be reduced.

In the operation for moving the cut line, the section 408 selects the placing region 437 shown in FIG. 40 as the region including the minimum clockskew. The cut line CL1 in the placing region 437 is then selected, and horizontally moved (i.e., along the right-and-left direction in FIG. 41). In this case, the locations of load cells connected to each signal line in the region 437 are slightly changed. However, the number of signal lines included in the region 437 does not change. Therefore, the magnitude of clockskew is reduced.

The cut line CL2 is moved selected, and vertically moved (i.e., up-and-down direction in FIG. 41). In this case, as the out line CL2 is moved upward within the region which fulfills the occupancy rate of the functional blocks placed in the placing region 437, the number of signal lines included in the region 437 is reduced, the load capacity connected to each of the signal lines increases. As a result, the delay time of each signal line in the region 437 increases. Therefore, the combined clockskews of the chip can be reduced, as shown in FIG. 42.

Accordingly, in this embodiment, each of the functional blocks is allocated to corresponding placing regions 437 through 440 as the planner assigns the circuit floor plan. Accordingly, clockskew is computed for the FF cells connected to the corresponding fixed signal lines 444a through 444j of the secondary drivers, and 443a through 443j in the placing regions 437 through 440. The computed clockskews are indicated on the fixed signal lines 444a through 444j, respectively. Therefore, the planner can increase the work efficiency without estimating the clockskew.

Further, in this embodiment, as the operation for moving the cut line is selected, the placing region of the cut line including the maximum and minimum clockskews can be moved. Accordingly, the combined clockskews for the semiconductor 436 can be easily reduced. Through these reductions the work efficiency can be increased. When the operation for moving the cut line is not selected, the planner can re-assign the circuit plan to achieve the desired clockskew, when the indicated clockskew is unacceptable.

Furthermore, in this embodiment, each of the clockskews are indicated on the fixed signal lines 444a through 444j in the placing regions 437 through 440, respectively. Therefore, the planner can recognize the clockskew of each of the fixed signal lines 444a through 444j at a glance. Further, in this embodiment, among the clockskews, the maximum clockskew is emphasized by a highlighted or flashing display. Accordingly, the planner can easily determine whether or not the clockskew is within the allowable limitation.

However, in this embodiment, whenever the cut line of the region including the maximum clockskew is moved, the cut line of the region including the minimum clockskew is likewise moved. The order for moving the out lines can be reversed.

In this embodiment, the cut lines of the regions including both maximum and minimum clockskews respectively are moved. Only the cut line of the region including either the maximum or minimum clockskew can be moved.

Further, in this embodiment; the clockskews are indicated on the fixed signal lines 444a through 444j in the placing regions 437 through 440 of the chip 436, respectively. Instead of such on-line indications, if the clockskews correspond to the fixed signal lines in the placing regions 437 through 440, the clockskews can be displayed at arbitrary locations such as the vicinity of the corresponding fixed signal lines, or display unit 22 which is the outside of the chip 436. Furthermore in this embodiment, the clockskews are indicated with respect to the fixed signal lines 444a through 444j in the placing regions 437 through 440, instead of this, the delay can be displayed.

FIGS. 50 through 94 illustrate the wiring process and layout for planing a masking pattern, such as a differential wiring which operates complemental differential signals for the input/output wirings etc., of differential amplifiers, and wiring processes of latches, etc., which hold each of bits relating to the clock distribution or parallel data.

Figure 50:
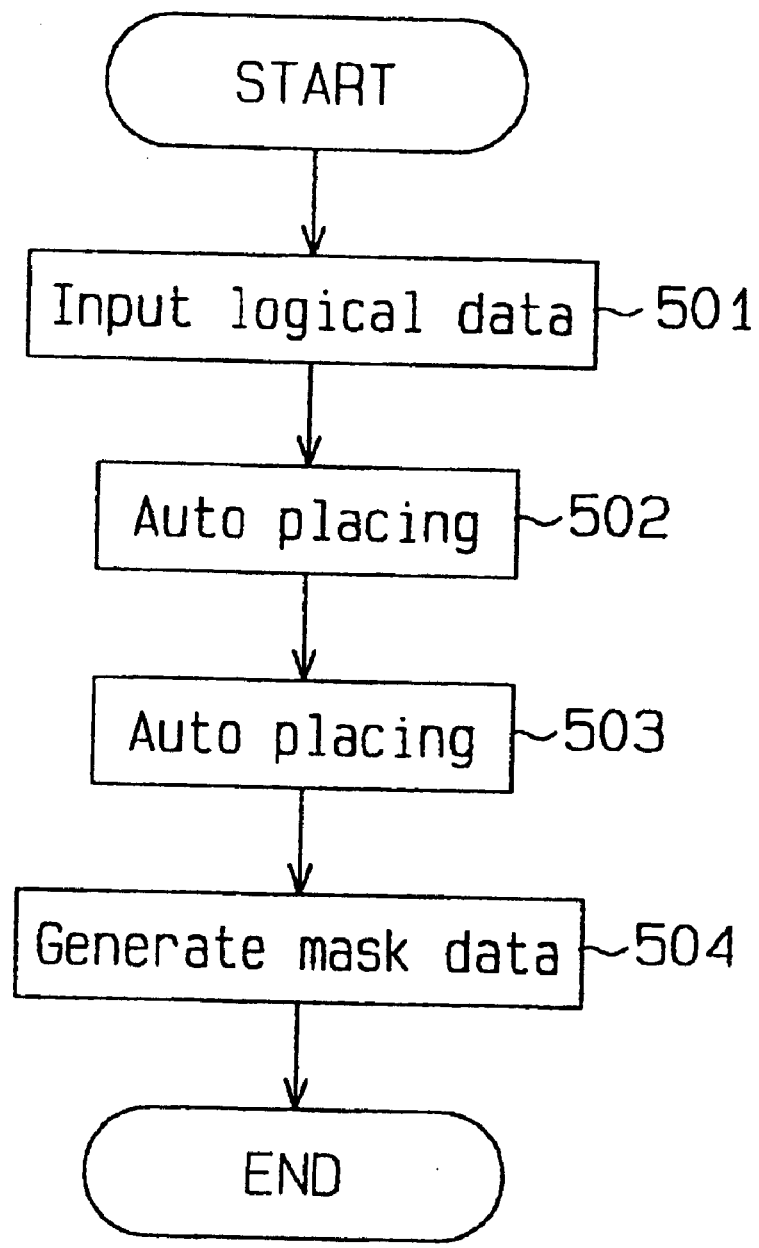
FIG. 50 is a flowchart showing the operational steps of a masking pattern planning.

FIG. 50 shows the processing steps of masking pattern planning method such as the master slice method or unit cell method.

Logical data, generated beforehand by means of a logic planning, is input to the system (step 501). The logic planning means that the logical constitution is realized to fulfill the desired specification. In other words, the logical circuit diagram for realizing the desired logical specification is generated by utilizing the cells (i.e., unit of each basic circuit forming the logical circuit, unit of basic gates, flip flops, resistors, etc.) which are pre-planned and stored in the cell library beforehand. Data of cells to be utilized, and net data indicating the connecting relationship of each cell are generated.

The placement of each cell is performed based on the planning method (step 502). In master slice method where cell and wiring regions between the cells are fixed, after the specific cells are initialized by electronic limitation, the automatic placement of all cells is carried out.

The evaluation of the placement condition is then carried out. The result of this evaluation in that the evaluation should be carried out together with the wiring, but the problems become rather complex. Therefore, an approximate reference level for evaluation is set, and the evaluation is to be independently carried out from the wiring. For the reference level for evaluation, at the virtual wiring path is set, the total sum of wiring length of each wiring paths is to be reduced, or as hypothetical line is drawn in the semiconductor integrated circuit chip, the number of wiring crossing the hypothetical line is to be reduced.

In the unit cell method, the cell placement and wiring region between the cells may be varied. The wiring and the evaluation of wiring are carried out in a manner similar to the master slice method. However, as the result of evaluation in the unit cell method, the reduction of wiring region is considered in addition to the reference level for evaluation described in the master slice method.

A single wide width wire in automatically disposed at each of portions between the cells (step 503). The operational steps for the wiring will now be described.

In the portion of wiring net where the difference of wired length difference in the actual wiring is to be set under the preset value, a point where the wiring to be at started (hereinafter referred to as wiring staring point) and point where the wiring is to be ended (hereinafter referred to as wiring ended point) are set. The number of the wiring starting and ended points can be multiplied, respectively.

Each net where the wire length difference of actual wiring is to be set under the preset value converges to the wiring starting point by utilizing the well known master slice method by which a plurality of nets can be drawn to a virtual point. This method, e.g., is utilized for setting a prohibited region on the chip according to the result of automatic placement of each cell.

A single wide width wire is automatically placed between the wiring starting point and the wiring ended point. In the master slice method, the wire placing region and prohibited region are set according to the result of automatic placement of each cell. The wide width wire in automatically placed through either the line search method, maze method, channel allocating method or discovery method.

In the unit cell method, a wire insertion position between each cell row is set. The system generates a wiring limitation graph by which the wiring is ordered. With the minimum requirement for wiring region assured, the wide width wire is automatically placed through the main line method.

The width and pattern of the wide width wire is set according to the current which flows in the actual wiring in each net, and to available wiring space in the preset wirings.

For example, to improve the cross talk characteristics of the wiring space, the wiring space should be set above the specific value in order to reduce the space capacity.

The masking data is next generate (step 504). The operational steps for generating the masking data will now be described.

The wide width wiring which is automatically placed is converted to the wiring pattern of every net where the wiring length difference of the actual wiring in desired to be set below the preset value.

The wiring pattern for every net in the corner portion of the wide width wiring is converted to the wiring pattern including the preset vertical conductive path (hereinafter referred to as via) contact. In this case, the wiring pattern including the via contact is stored in the table beforehand, based on the type classification of corner portion of the wide width wiring. The type of the corner portion of the actual wide width wire is determined, and the wiring pattern including the via contact which corresponds to the determined type is referred and replaced therewith.

The masking pattern is selected according to the result in automatic placing of each cell and the result of the wiring which is replaced with the wiring pattern. The selected masking pattern is converted to the masking data which is preferable data for inputting to an exposure device. In other words, after rectangle or trapezoid analysis process is carried out with respect to the masking pattern, the adjustment is made to diverting distortion and close effectiveness.

Accordingly, the wiring length difference of the actual wiring in the specific nets can be set below the preset value, and the wiring space in the specific net can be set greater than the specific value.

FIGS. 51 through 93 show the masking pattern of differential wiring.

In this embodiment, as the wiring length differences of actual wirings 521, 522 in two nets which transmit complimentary differential signals converge to zero (0), the wiring width of the each actual wirings 521, 522 as well as the wiring space is set to one grid. In the wiring layout, only intersections of the grid along the vertical direction and grid along the horizontal direction are indicated by dots "Gr".

Figure 51:
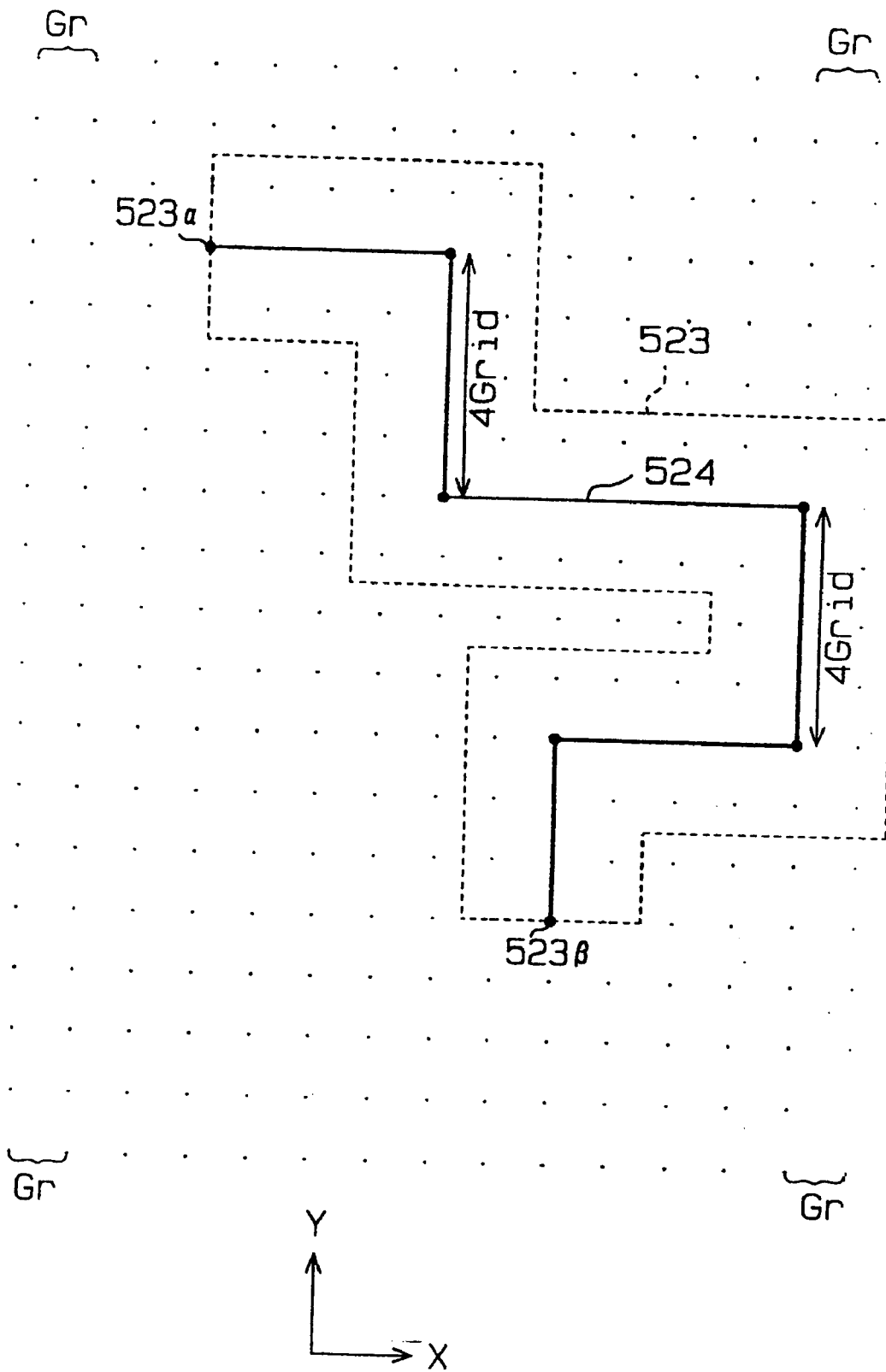
FIG. 51 through 54 are line layouts showing the masking pattern of differential line.

FIG. 51 shows the wiring layout which is the result in the automatic wiring of wide width wire 523 (referred to step 503). Each of wiring starting point 523α and wiring ended point 523β is set, the two nets which transmit the complimentary differential signal converge to the wiring starting point 523α. Accordingly, one wide width wire 523 is automatically wired from the wiring starting point 523α to the wiring ended point 523β.

The wiring width and wiring pattern of the wide width wire 523 are set, based on the current flows in the actual wirings 521, 522 in each net, and the wiring space in each preset wire 521, 522. In this embodiment, the wiring width of each wide wiring 521, 522 is set to 1 grid, and the wiring space is also to 1 grid. Therefore, the wiring width of the wide width wire 523 changes to 3 grids. In the wiring pattern or the wide width wire 523 one side of a central line segment 524 which equally divides the wide width wire 523 into two becomes more than 4 grids excluding both distal sides.

Figure 52:
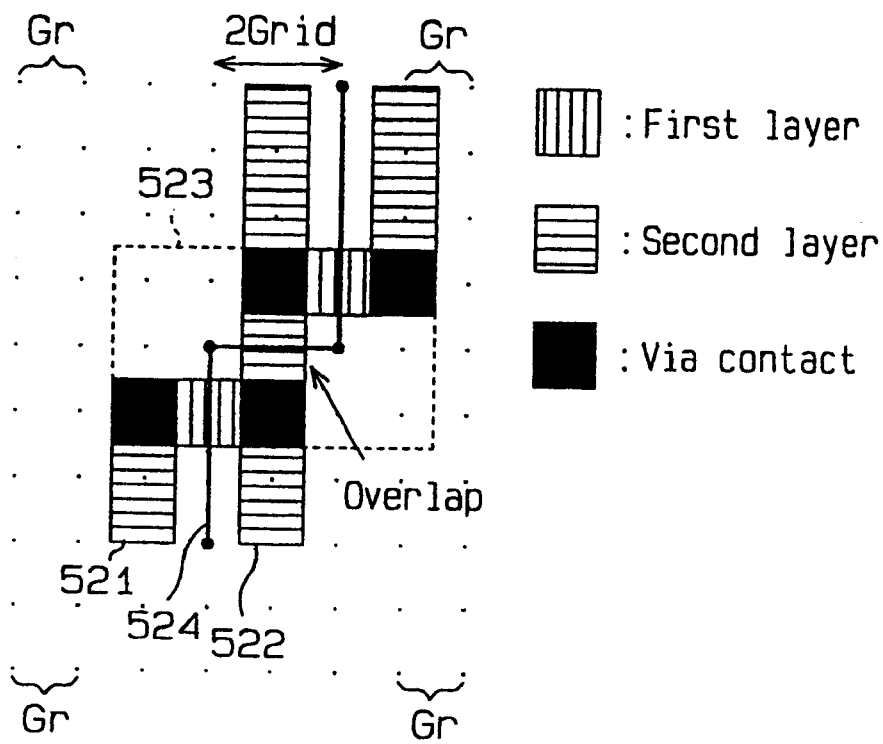
Figure 53:
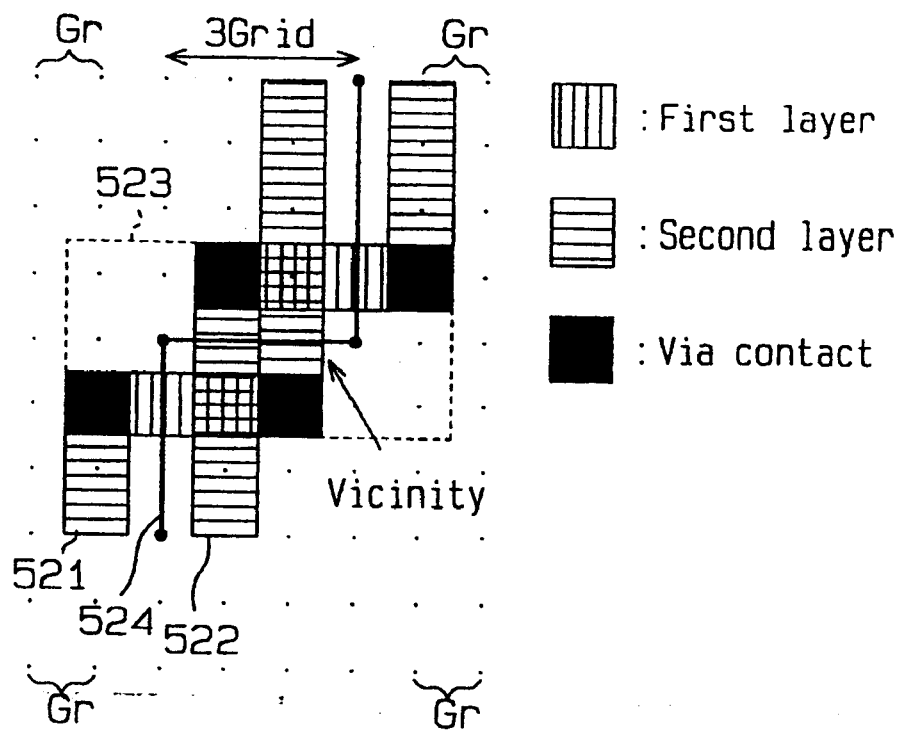

That is, as shown in FIG. 52, assume for purpose of illustration but not limitation that one side of the central line segment 524 is set to be 2 grids, this causes a portion of the actual wirings 521 to overlap wiring 522. As shown in FIG. 53, assume that one side of the central line segment 524 is set to be 3 grids, the portion where the actual wirings 521, 522 are adjacently disposed may be generated. Therefore, 1 grid of wiring space can not be allocated. In the differential wiring, when the wiring space capacity of each actual wiring 521, 522 is large, the cross talk between the wiring 521, 522 becomes worse to generate malfunction. Therefore, the wiring space should be set to exceed the specific value in order to reduce the wiring space capacity. As a result, in this embodiment, the wiring space is set to 1 grid.

Figure 54:
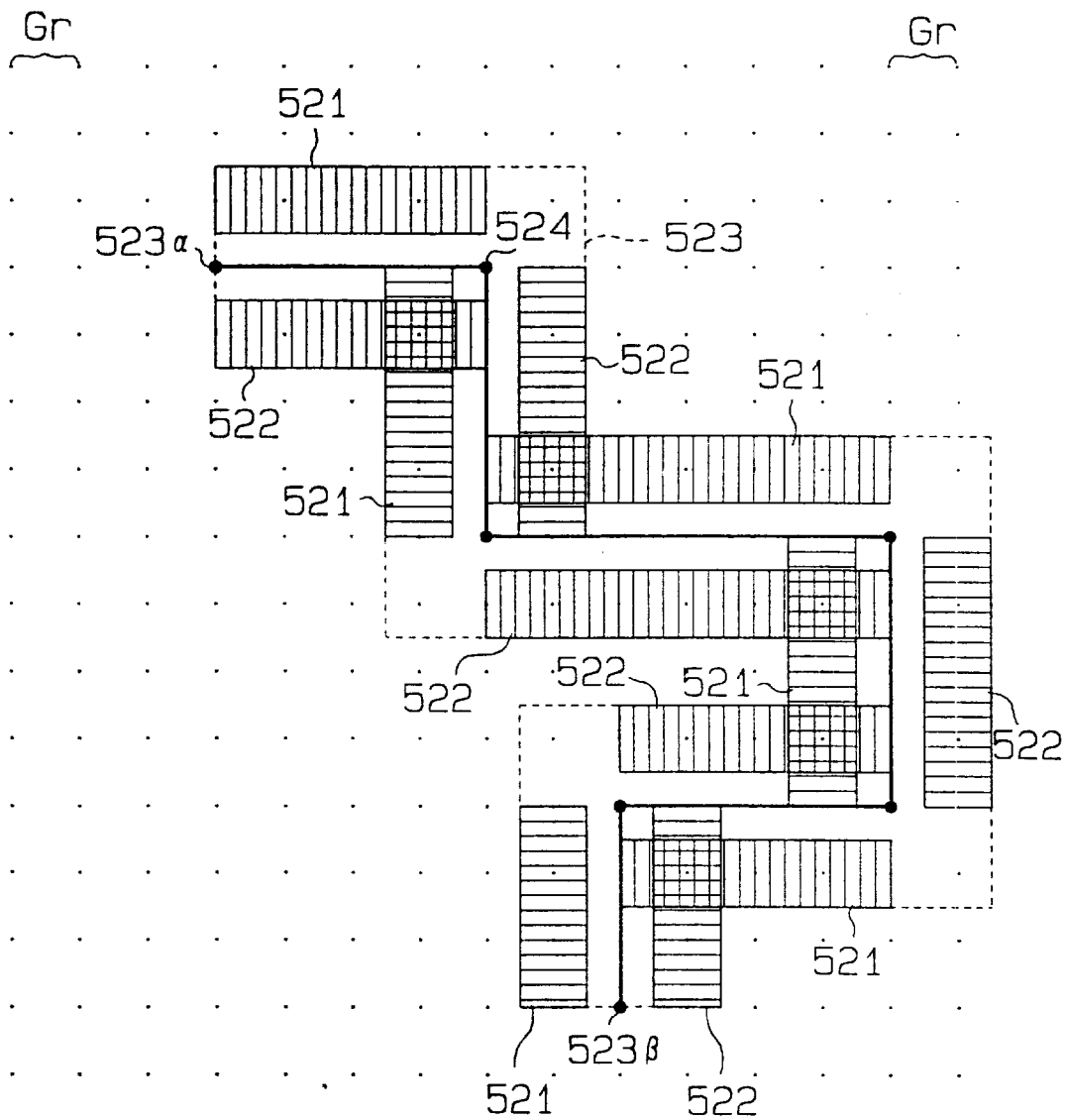

FIG. 54 shows the wiring layout according to the result where the wide width wiring 523 is converted into wiring pattern of every two nets which transmit the complementally differential signal.

In this embodiment, the wiring pattern of two actual wirings having 1 grid wiring space (width of wiring is 1 grid) is placed along the central line segment 524.

FIG. 55 shows the type classification of the corner portion of the wide width wiring 523. The corner portion of the wide width wire 523 according to this embodiment always forms a square (i.e., one side is 3 grids) where the intersecting point (i.e., turning point of the central line segment) of the X directional central line segment 524 and the Y directional central line segment 524 is the center and each of the circumferences is 1 grid.

Figure 55A:
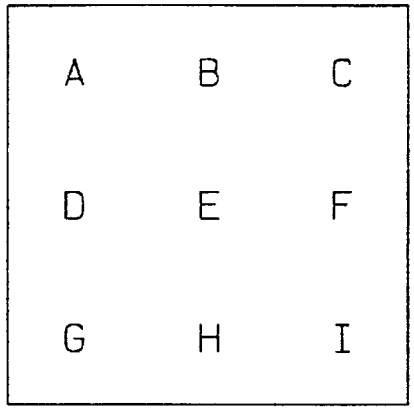
FIGS. 55(a) through (c) are diagrams showing type sorting of corner portions in the differential lines of FIG. 54.

FIG. 55(a) shows the location determination diagram. The intersecting point of the X directional (horizontal direction) of the central line segment 524 and the Y directional (vertical direction) of the central line segment 524 is set at the location "E". The locations "A" through "I" are placed on the circumference of grids.

Figure 55B:
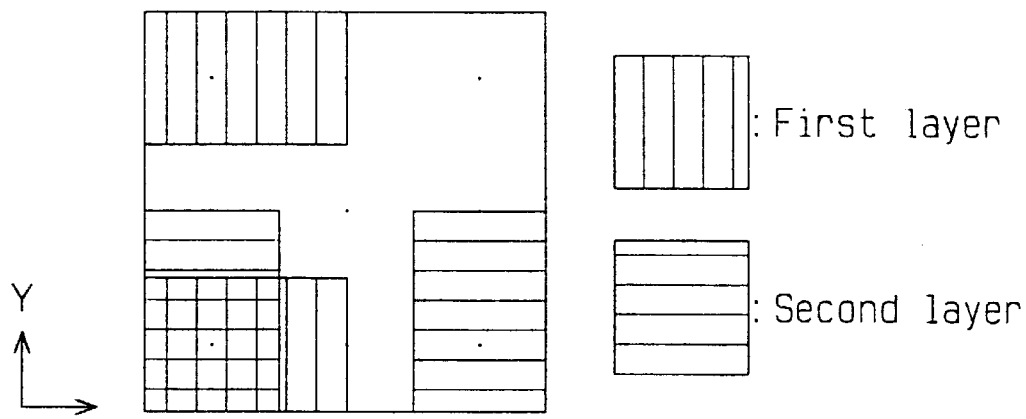
Figure 55C:
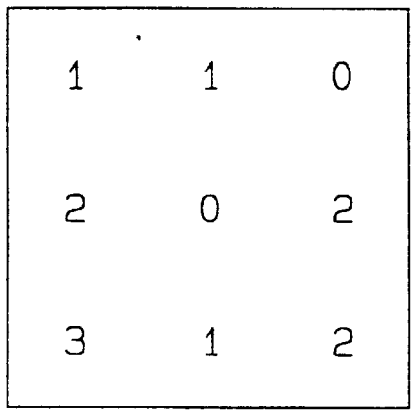

FIG. 55(b) shows the wiring layout of the corner portion of the wide width wiring 523. As shown in FIG. 55(c), codes are set: the grid having 1 layer wiring is set to the code "1", the grid having 2 layer to the code "2", the grid having both 1 layer and 2 layers to the code "3", and the grid having no wirings to the code "0".

The determination whether or not the code "3" is located at any one location of "A" through "I", and the type of the corner portion of the wide width wiring 523 is classified. For example, the corner portion of the wide width wiring 523 shown in FIG. 55(b), the code "3" is set at the location "G".

Figure 56:
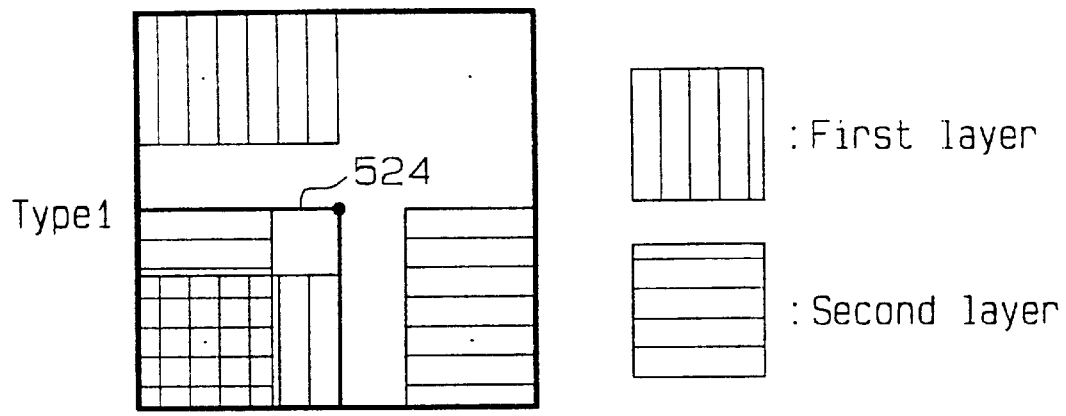
Figure 57:
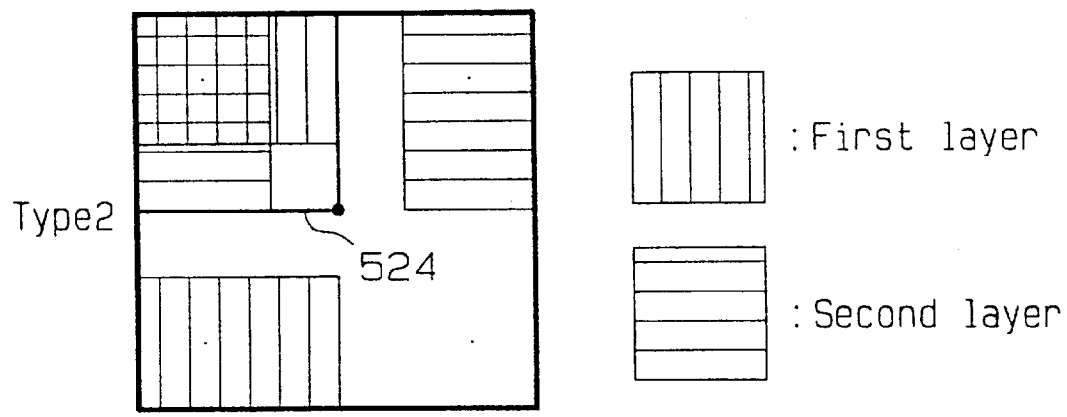
Figure 58:
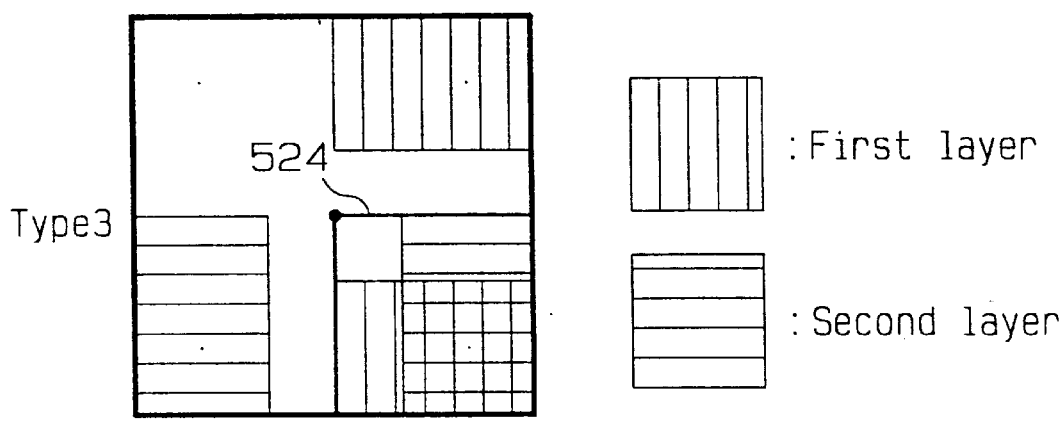
Figure 59:
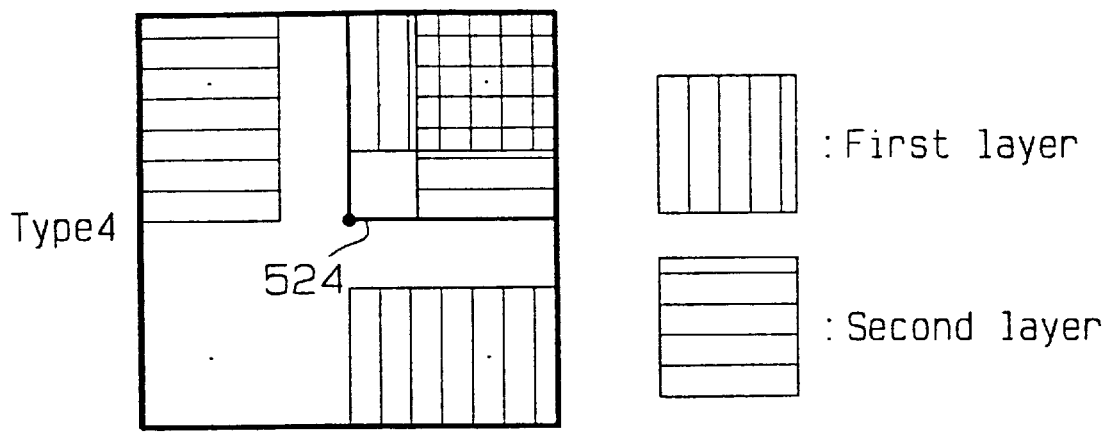
Figure 60:
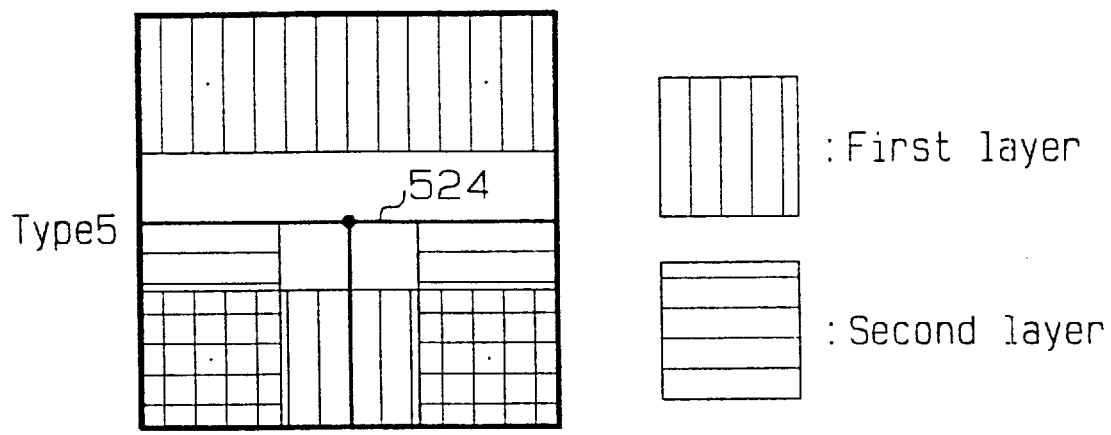
Figure 61:
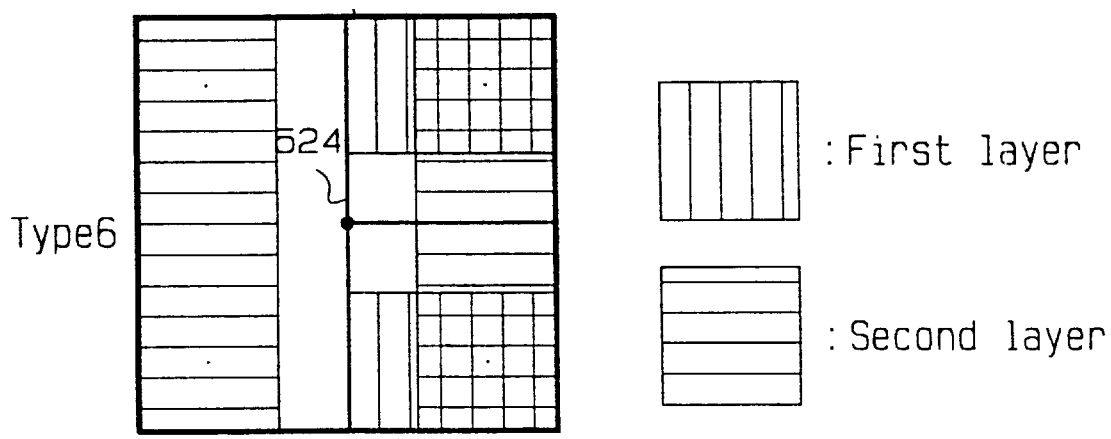

The locations "A" through "I" where the code "3" is set are classified similar to the FIG. 55(b), the type of the corner portion of the wide width wiring 523 can be classified to nine patterns such as the type 1 of FIG. 56 through the type 9 of FIG. 64.

That is, the location where the code "3" is: type 1; location "G", type 2; location "A", type 3; location "I", type 4; location "C", type 5; location "G" and "I", type 6; location "C" and "I", type 7; location "A" and "C", type 8; location "A" and "G", and type 9; location "A", "C", "G" and "I".

As shown in FIG. 65 through 72, one portion of the wiring pattern is canceled for wiring type 1 of FIG. 56 through type 8 of FIG. 63.

That is, the locations where the wiring pattern would be canceled are: type 1; locations "A through B" and "F through I", type 2; locations "G through H" and "C through F", type 3; locations "B through C" and "D through G", type 4; locations "A through D" and "H through I", type 5; locations "F through I", type 6; locations "B through C", type 7; locations "A through D", type 8; locations "G through H", and type 9; no cancellation of wiring pattern.

Figure 65:
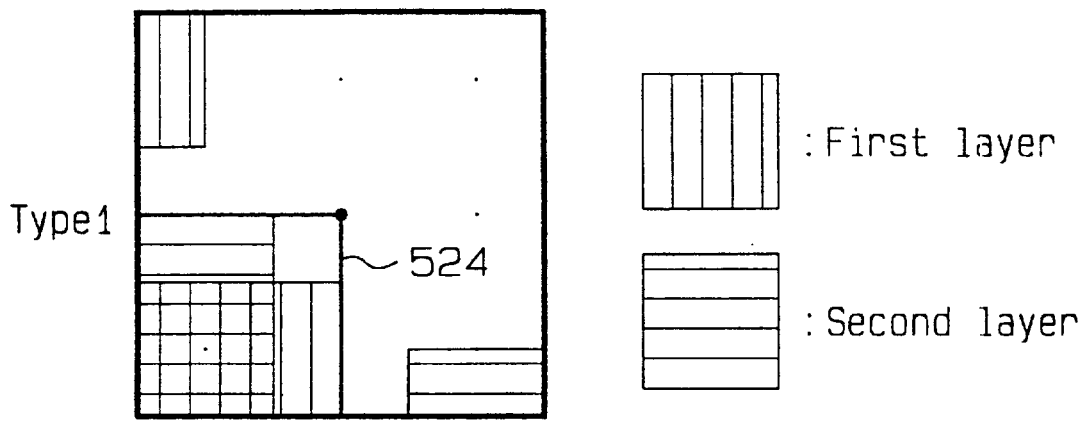
FIG. 65 through 72 are circuit cell line layouts illustrating the various deleted line patterns at the corner portions of a wide width line.
Figure 66:
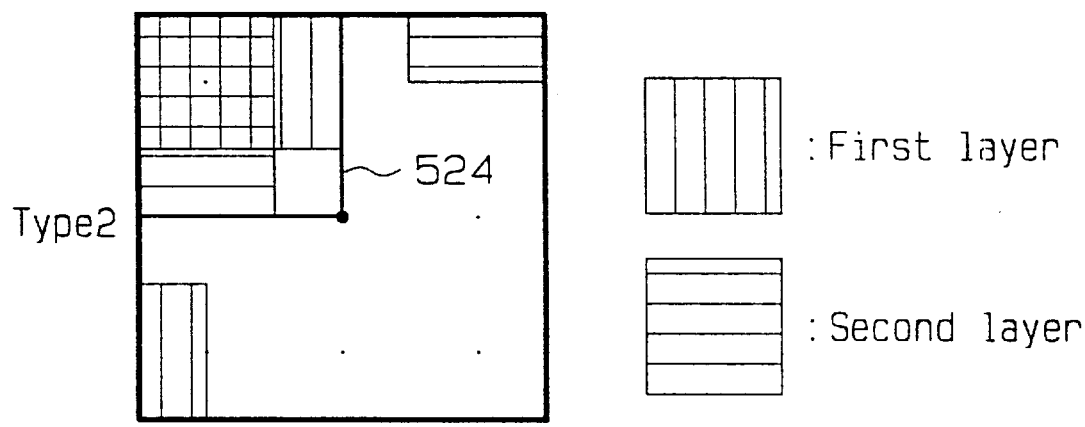
Figure 67:
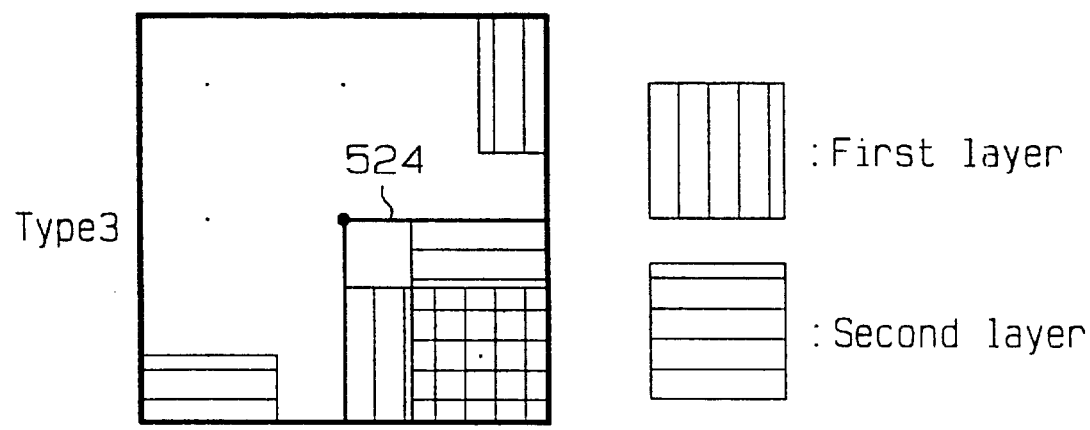
Figure 68:
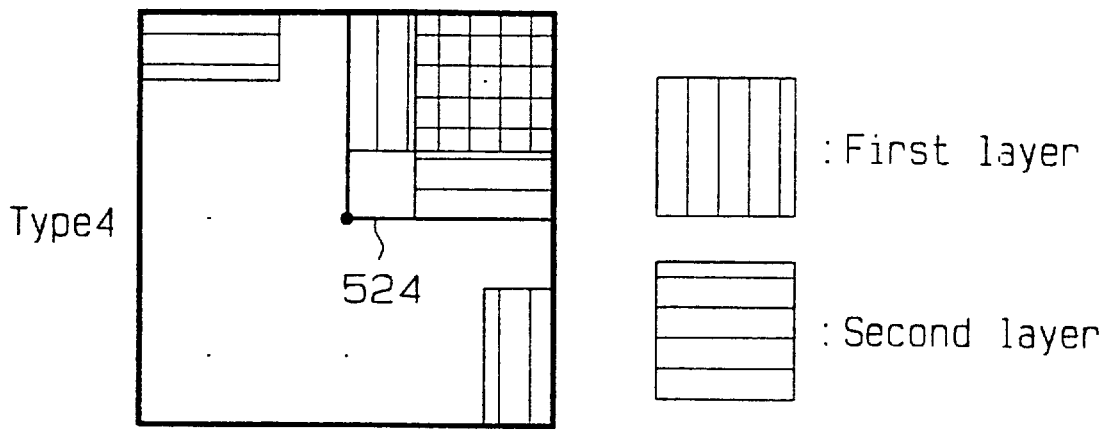
Figure 69:
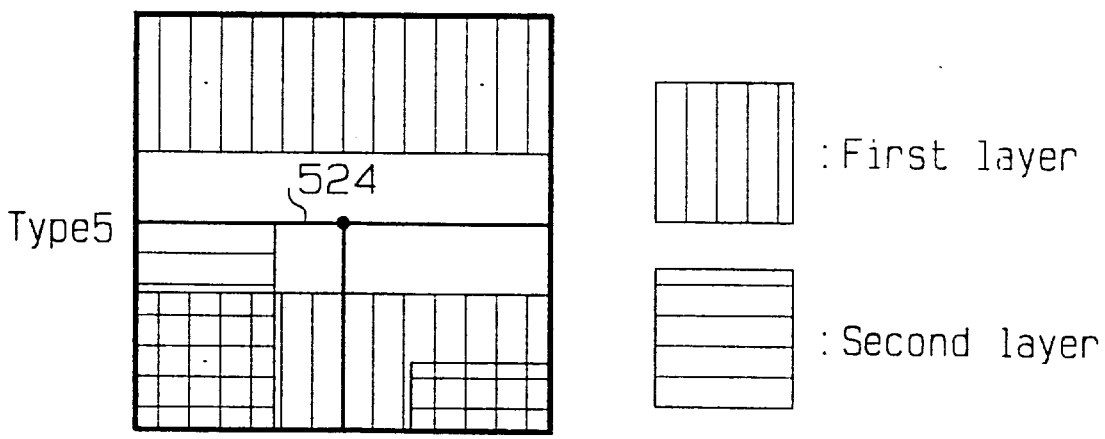
Figure 70:
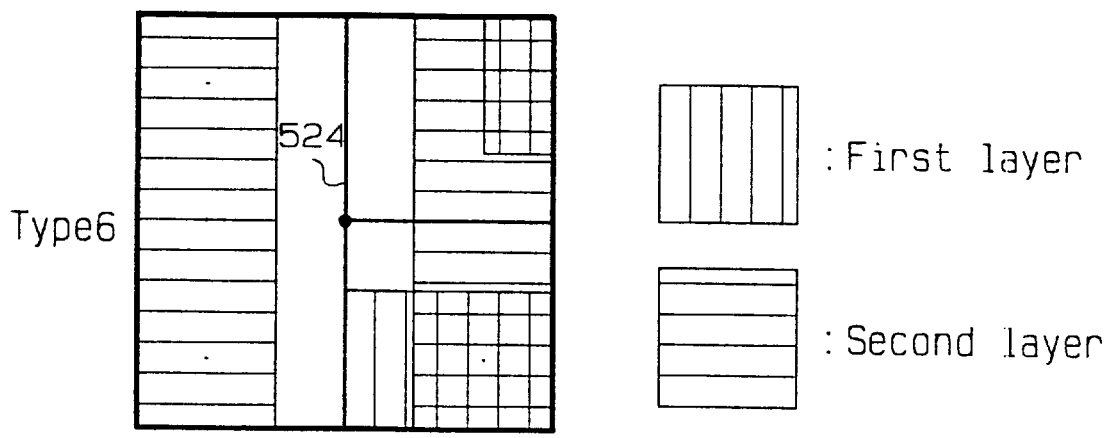
Figure 71:
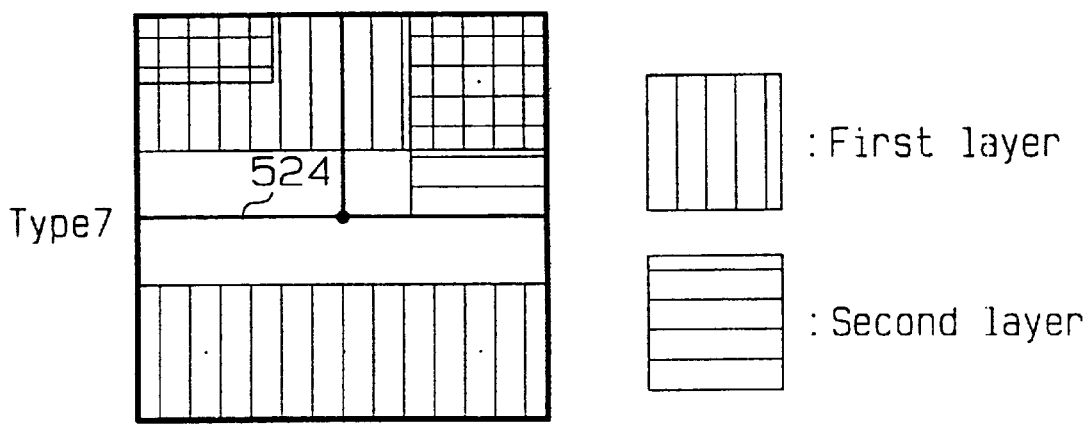
Figure 72:
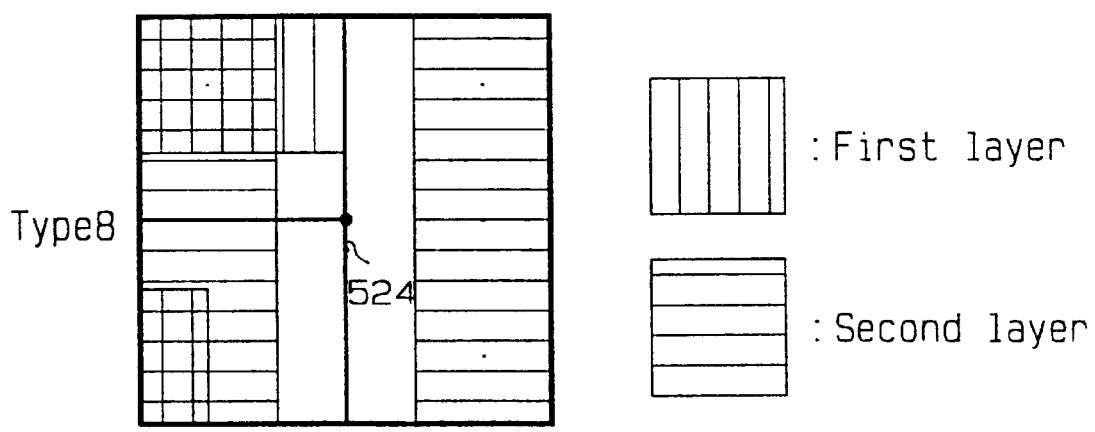

As shown in FIGS. 73 through 90, wiring pattern is added for each of the type 1 of FIG. 65 through the type 8 of FIG. 72.

That is, the locations where the wiring pattern would be added are: type 1; locations "A through D" and "H through I", type 2; locations "D through C" and "B through C", type 3; locations "C through F" and "C through H", type 4; locations "A through B" and "F through I", type 5; locations "A through D", type 6: locations "G through H", type 7; locations "F through I", type 8; locations "B through C", type 9; no addition of the wiring pattern.

Figure 73:
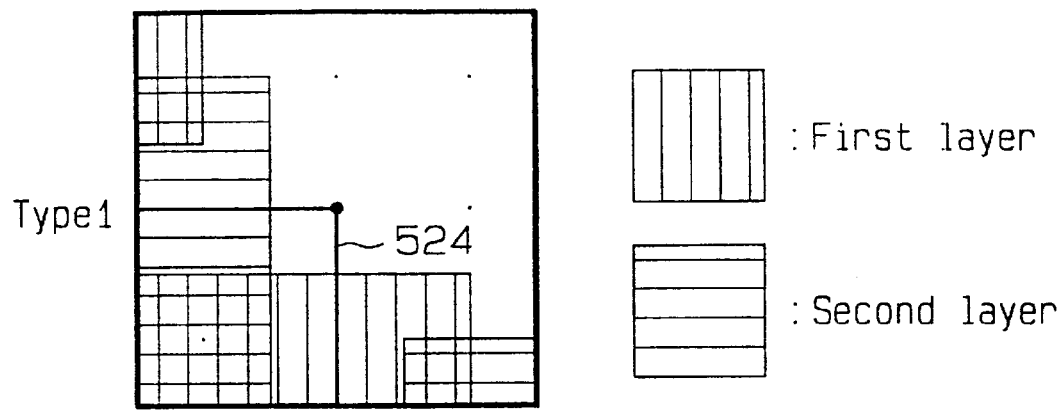
FIGS. 73 through 80 illustrating line layouts showing overlapping differential wiring line patterns added to the corner parts of a wide width line portion.
Figure 74:
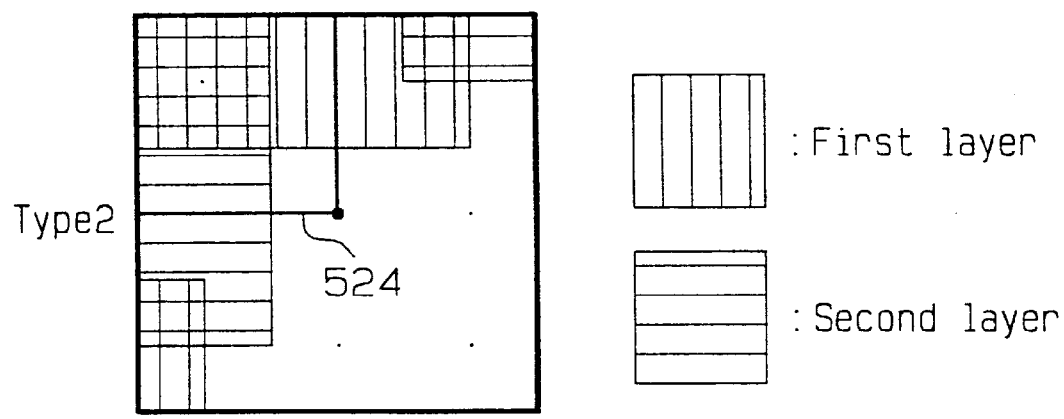
Figure 75:
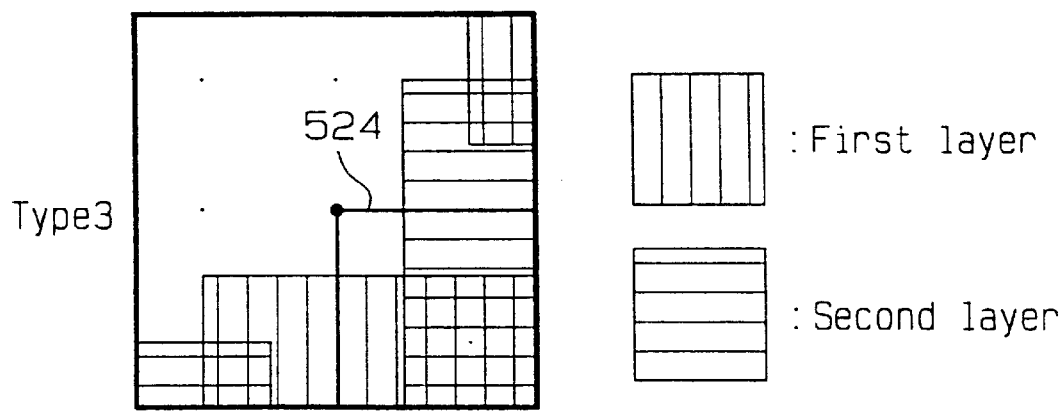
Figure 76:
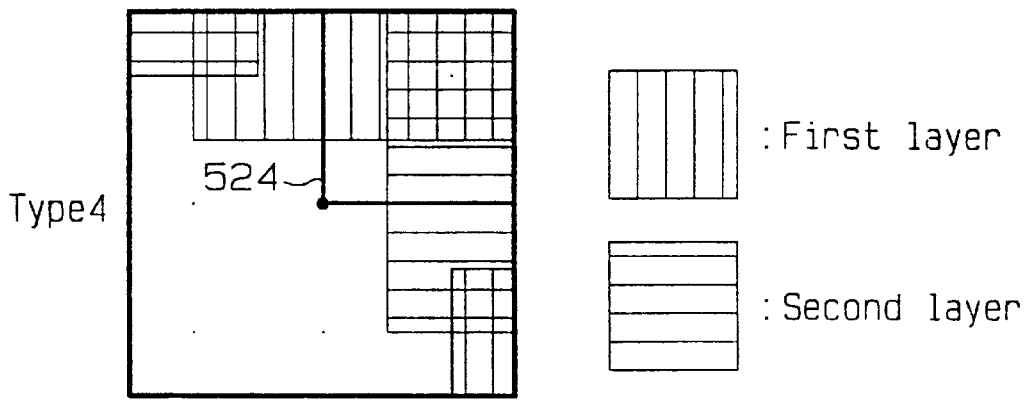
Figure 77:
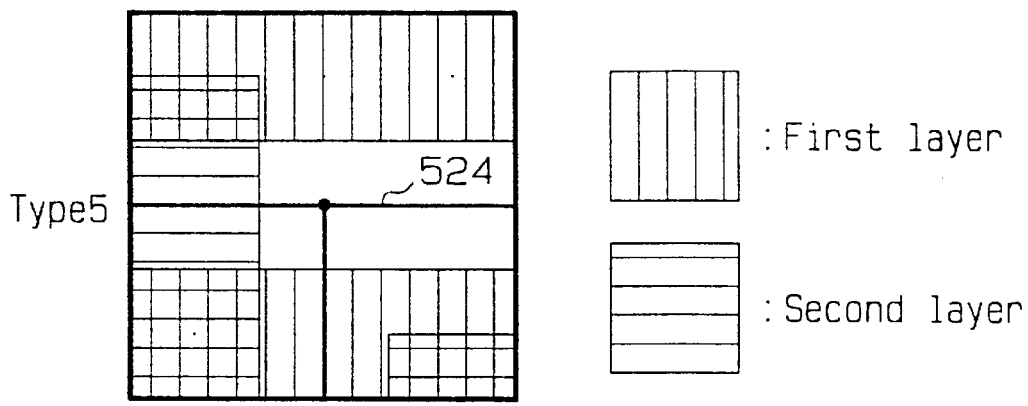
Figure 78:
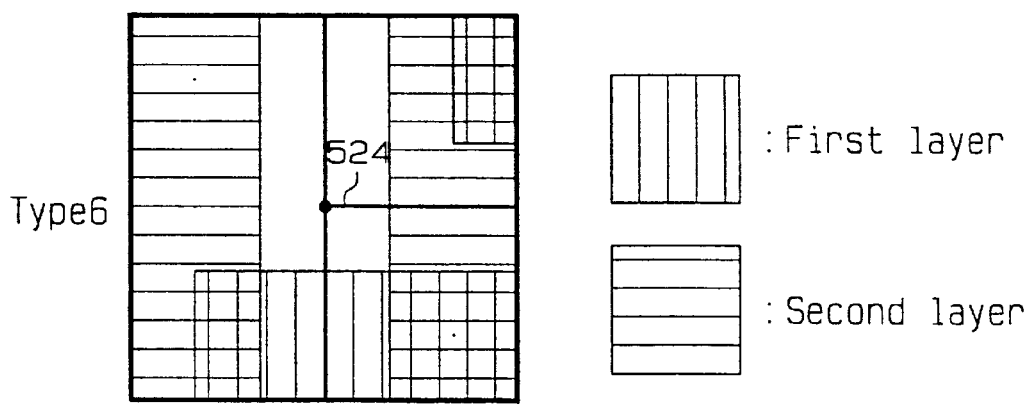
Figure 79:
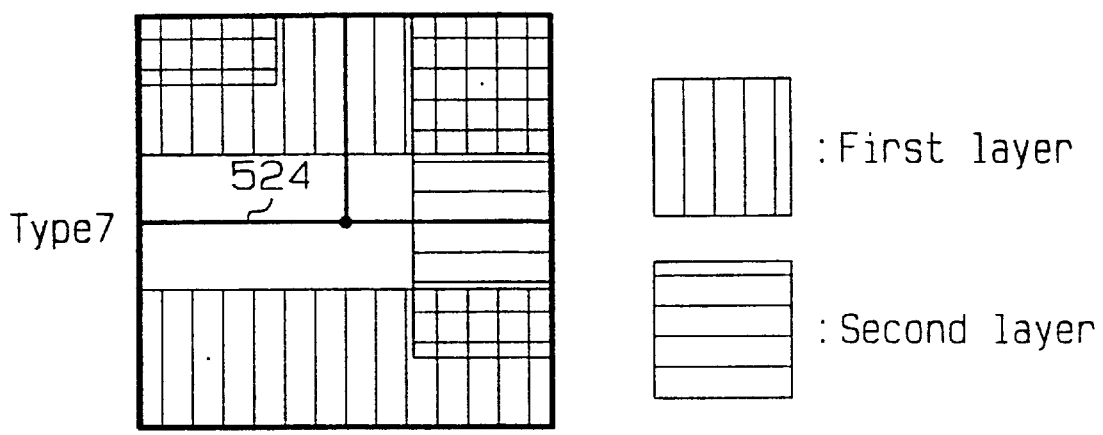
Figure 80:
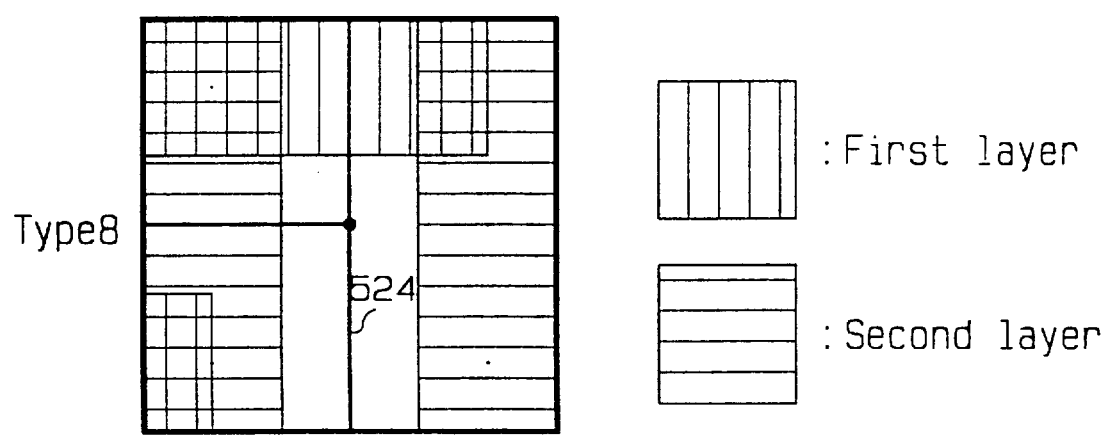

As shown in FIGS. 81 through 88, patterns of via contact are generated with respect to the type 1 of FIG. 73 through type 8 of FIG. 80.

That is, the locations where the pattern of via contact is to be generated are: type 1; locations "A" and "I", type 2; locations "C" and "G" type 3; locations "C" and "G", type 4; locations "A" and "I" type 5; locations "A" and "I", type 6; locations "C" and "G", type 7; locations "I" and "A", and type 8; locations "C" and "G". With respect to the type 9, as shown in FIG. 89 or 90, the patterns of via contacts are generated at two locations on the diagonal of type 9 in FIG. 64 (i.e., FIG. 89; locations "A" and "I" or FIG. 90; locations "C" and "G").

Figure 91:
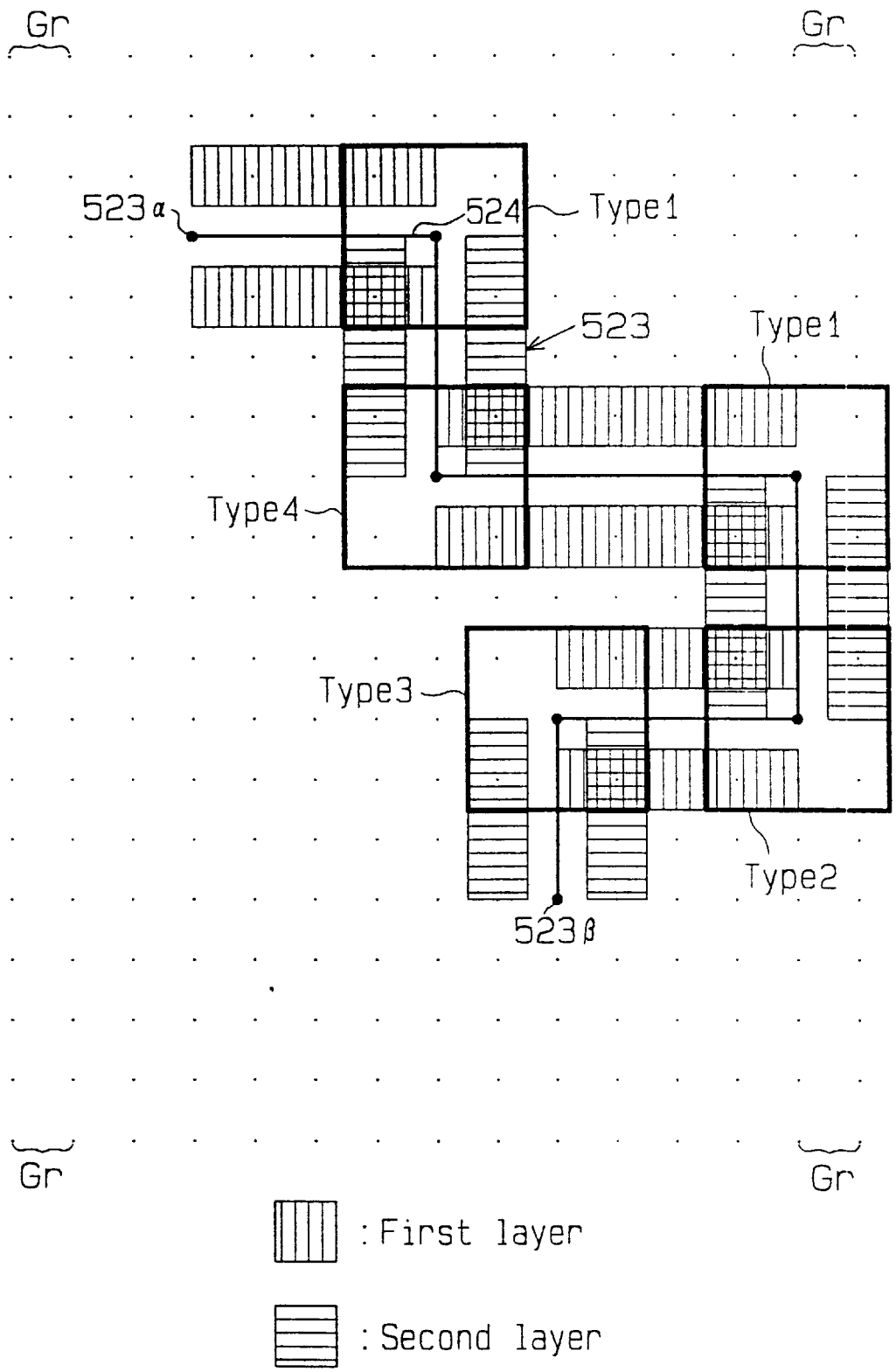
FIGS. 91 and 92 are line layout showing a masking pattern planning using differential lines for a wide width line.
Figure 92:
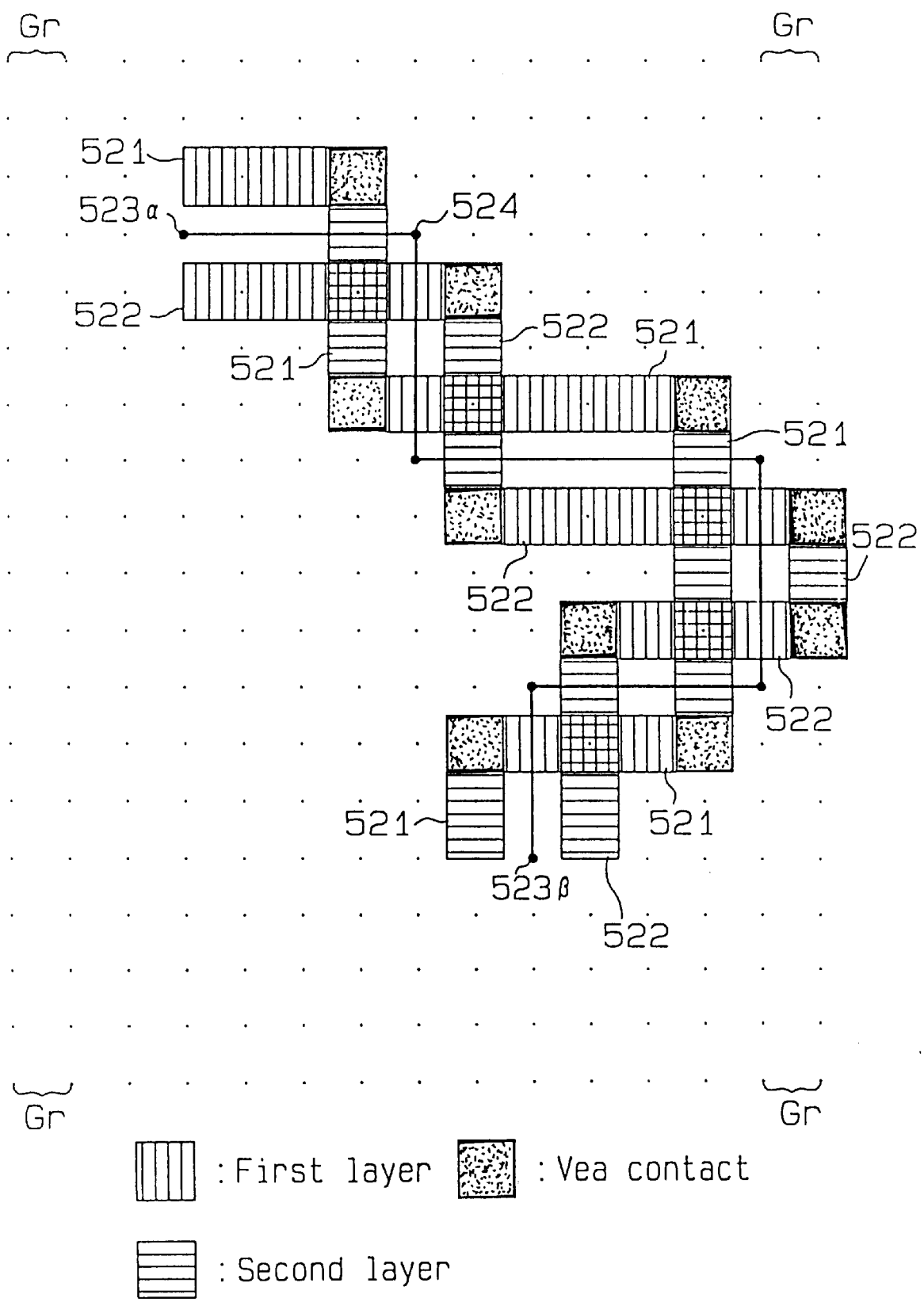

As described above, when the type of the corner portion of wide width wire 523 in the layout of FIG. 54 is classified according to FIGS. 56 through 64, the wiring layout forms the patterns of FIG. 91. As the pattern of via contact is generated at FIG. 91 according to FIGS. 73 through 88, the wiring layout forms the pattern illustrated in FIG. 92.

The wiring pattern (FIGS. 73 through 88) of the actual wirings 521, 522 including the via contacts are stored in a wire pattern table as reference patterns, based on the classification of types (FIG. 56 through 64) of the corner portion of the wide width wire 523. Accordingly, the actual wirings 512, 522 of every not in the corner portion of the wide width wiring 523 are converted to the wiring patterns which include the preset via contact.

Through this conversion, in this embodiment where the operation for placing the differential wirings is carried out, the difference of wiring lengths of the actual wirings 521, 522 in two nets which transmit complimentary differential signals is effective reduced to zero (0), and the wiring space in each actual wiring 521, 522 forms 1 grid.

According to the embodiment, the difference of the wiring length of the actual wirings in each specific net can be set smaller than the specific value. Therefore, as the difference of delay time of signals becomes smaller than the specific value, skew can be prevented.

In this embodiment, the wiring space of the actual wirings in each specific net are preferably set. Accordingly, specific wiring operations in the differential wiring, such as determining the space capacity between the actual wirings for each specific net, can be performed to improve cross talk between wirings.

Further, in this embodiment, the actual wiring operation in every net through the automatic wiring is not carried out. Only one wide width wire is automatically connected between the associate cells. Therefore, in this embodiment, it is not required that the wiring data corresponding to the number of the nets are to be stored. The wiring data of only one wide width wire is required to be stored. Accordingly, the capacity of memory device in the planing system can be small.

Further, in this embodiment, the verification operation is not carried out during the generation of masking data. The automatic placing and automatic wiring operations are alternately repeatedly carried out without any manual adjustment. Therefore, in this embodiment, the planing steps for the masking pattern are reduced, so as to simplify each of the planing steps.

The present invention may not be limited to the above described embodiments and examples. The present invention may be embodied in following forms.

Figure 93:
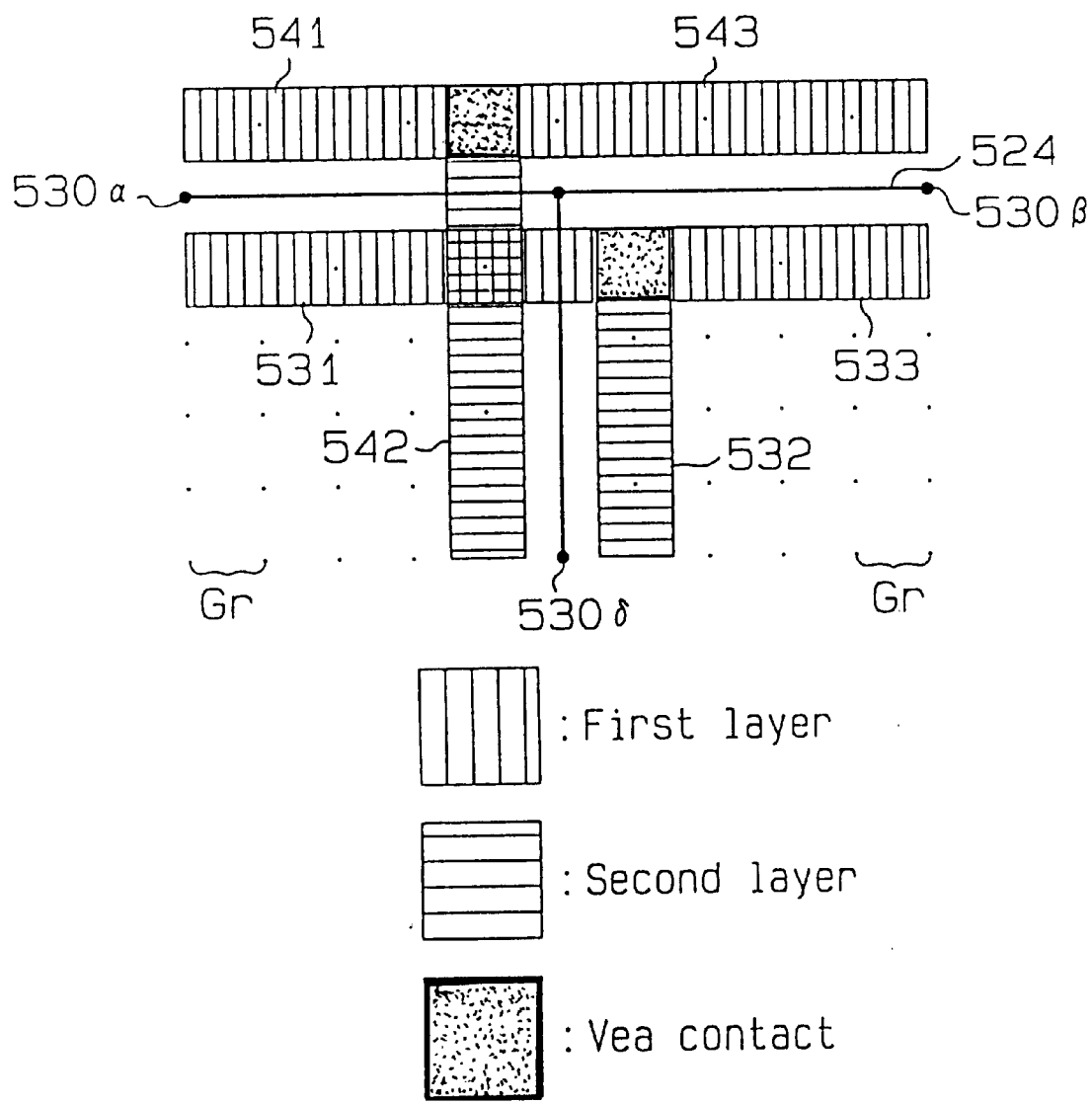
FIG. 93 is a line layout illustrating a line pattern including T crosses.

There may be multiple wiring starting and ending points. For example, as shown in FIG. 93, two wiring ended points 530β, 530Δ can be set with respect to one wiring starting point 530α. In this case, the lengths of the two pairs of actual wirings 541, 543, and 531, 533 which connect from the wiring starting point 530α to the wiring ended point 530β converge, respectively. Lengths of two pairs of the actual wirings 541, 543, and 531, 532 which connect frown the wiring staring point 530α to the wiring ended point 530γ do not converge. However, when the difference of the wiring lengths is below a specific value, skew can be prevented. When the wiring length are to be equal, T-shaped intersection as shown in FIG. 93 can not be disposed in the wiring patterns.

The above-described differential wiring is embodied in the differential wiring of two nets. If the wiring is designed for preventing skew with the difference in the delay time of the signals set for a specific value, the differential wiring having more than three nets can be utilized in the planing operations for any wiring patterns. Examples of this would be data linen for clock distribution or for latches which stores each bit of parallel data. One example of the above-described differential wiring is embodied in the two layers wiring. This wiring operation can also be embodied in multiple layers wiring having more than three layers.

Figure 94:
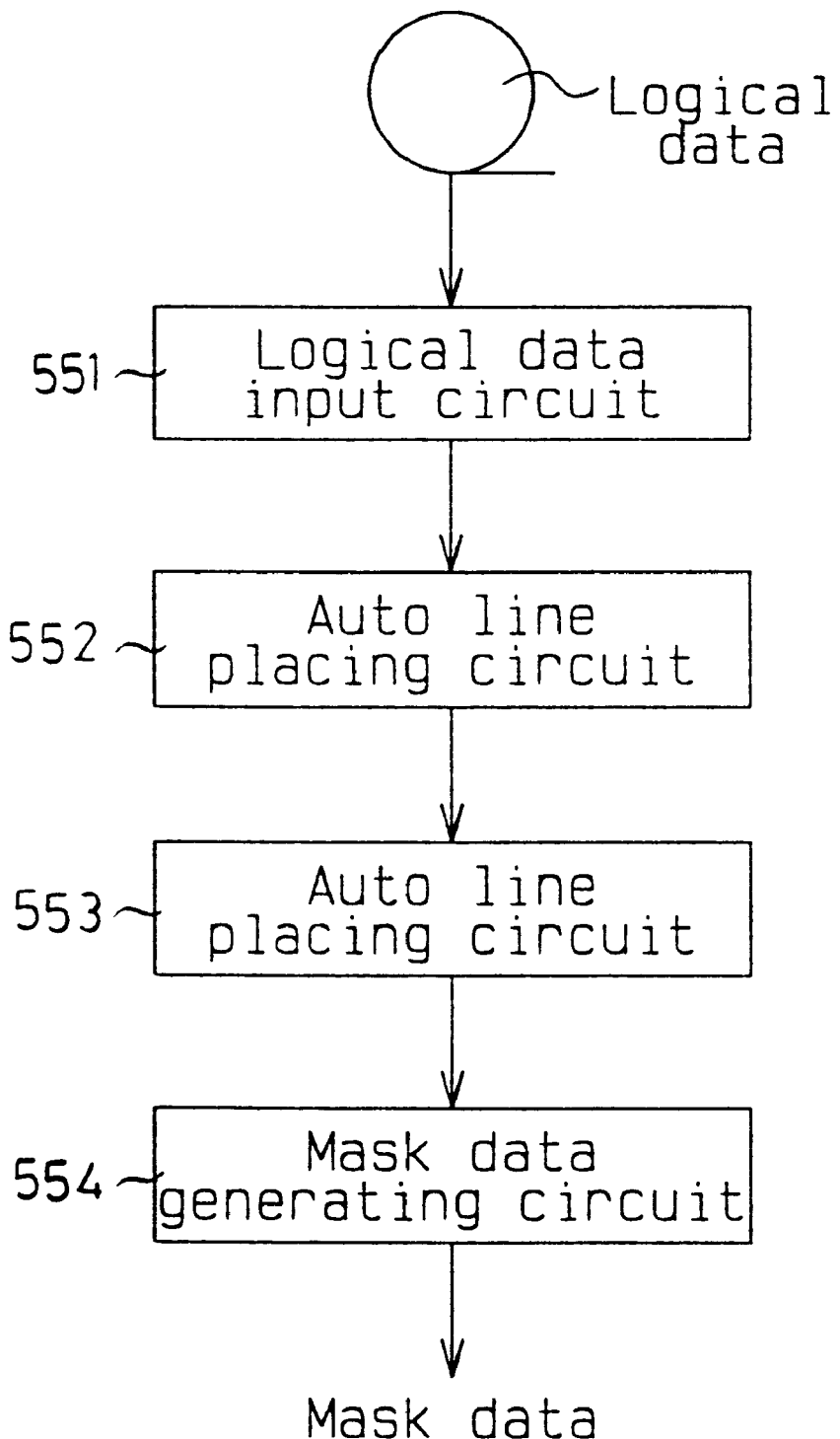
FIG. 94 are block circuits of the masking pattern planner.

FIG. 94 shows the block circuit of the masking pattern planner which carries out the various operations of the above-described masking pattern planing method. This planner includes logic data input circuit 551, automatic placing circuit 552, automatic wiring circuit 553, and masking data generating circuit 554. Each of the circuits 551 through 554 carry out the operations of steps 501, 502, 503, 504 of FIG. 50, respectively.

FIGS. 95 through 113 show a preferable embodiment of manually connecting operations.

Figure 95:
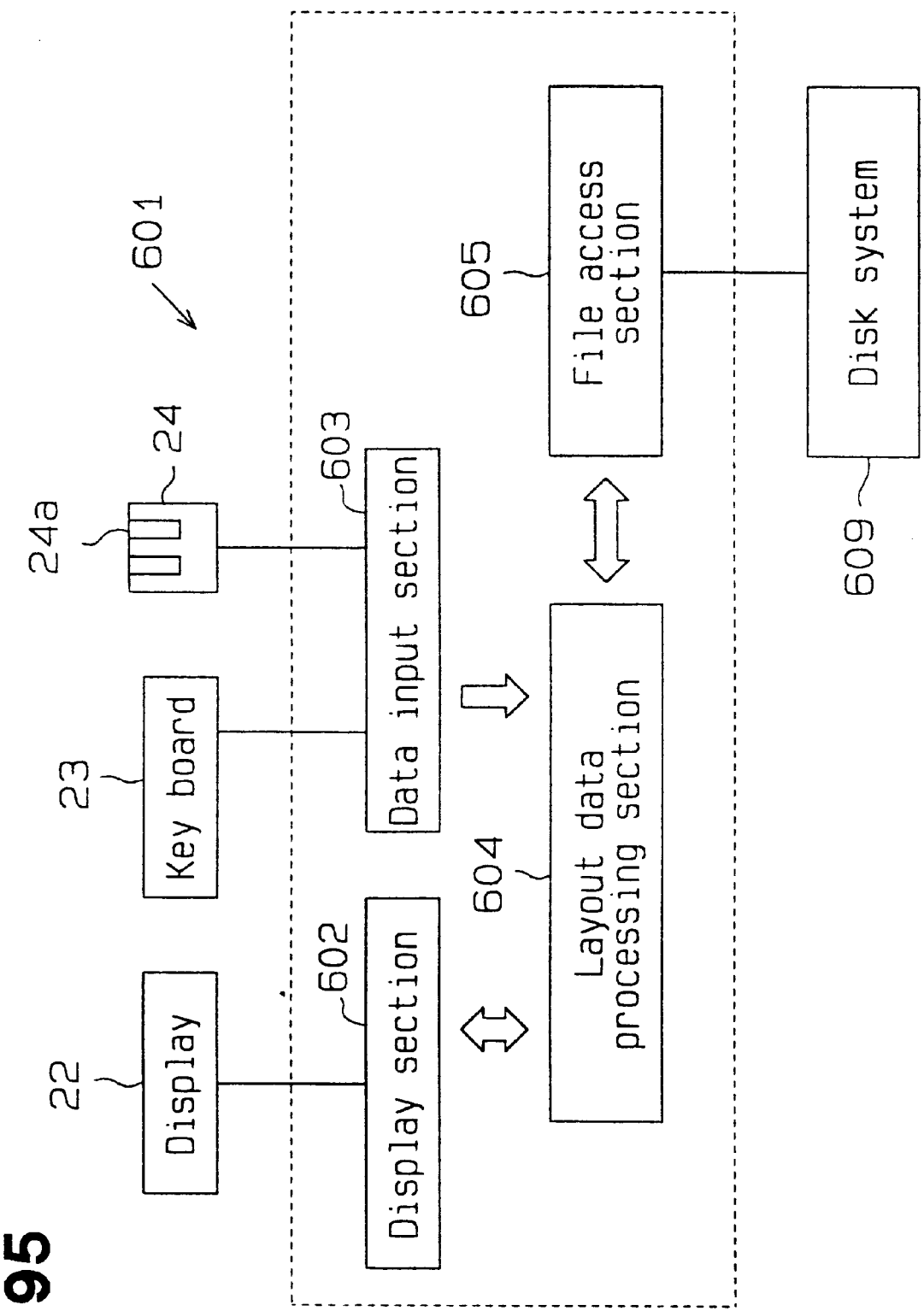
FIG. 95 is a schematic showing one example of the layout editor.

A layout editor 601 shown in FIG. 95 is utilized when the CPU 21 reads in the manual connection program 33. The editor 601 includes a display section 602, data input section 603, layout data processing section 604, and file access section 605. The display section 602 connects to the display 22. The display 22 displays two points a,b, obstacles 631, 632 such as logic cells, pointer 633 and rubber band 634 as a virtual wiring connecting between two points a and b. The pointer 633 is utilized to indicate one point on the display 22. The display 22 displays cursors 635a, 635b (i.e., indicated by broken line) which horizontally and vertically extend through the indicating point (i.e., the tip of arrow) by the pointer 633.

The data input section 603 connects with the mouse 24 and key board 23 as the pointer devices. The mouse 24 includes a click button 24a. When the mouse 24 is manipulated on the plane surface, the pointer 633 on the display 22 is accordingly moved. When the mouse 24 is stationary and the button 24a is pressed, the indicating point by the pointer 633 at that time is selected. Further, when the mouse 24 is stationary and the button 24a is released, the indicating point by the pointer 633 is set as a fixed point.

Figure 100:
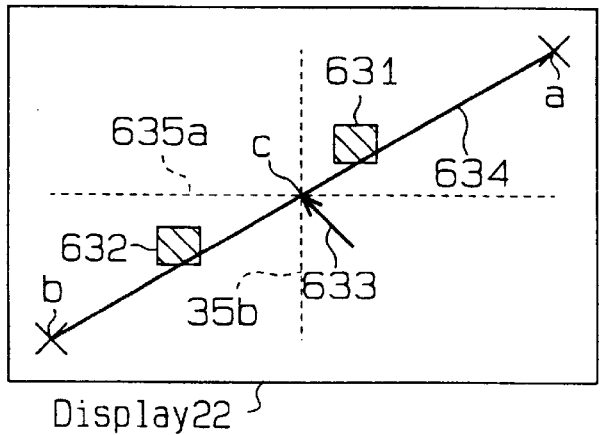
Figure 101:
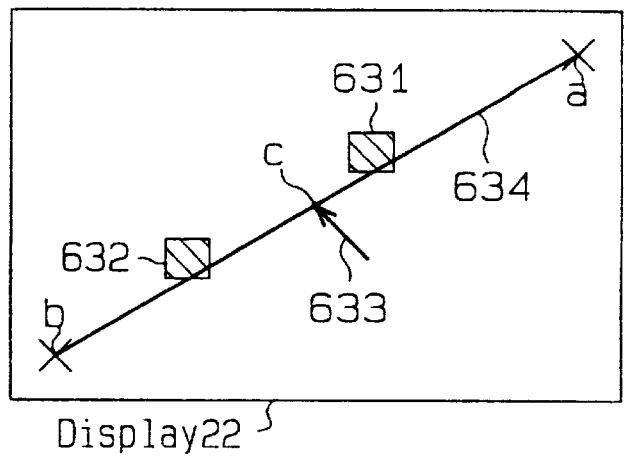

When the mouse 24 is moved, the input section 603 reads in the magnitude of its movement as data, and outputs the data to the data processing section 604. When the button 24a is released, the input section 603 outputs the selected signal to the data processing section 604. When the button 24a is released, the input section 603 outputs a preset signal to the data processing section 604. The file access section 605 connects with a disk system 609. The disk system stores the pattern data and placing data, etc., of the logical cells (obstacles 631, 632 as shown in FIG. 100). An endpoint coordinate table shown in FIG. 100 is allocated in the disk system 609. This table stores a reference fixed point which is set during the manual connecting operations and coordinate data of the fixed point.

The access section 605 reads out the pattern data and placing data of the logical cell from the disk system 609, and outputs the read out data to the data processing section 604. The access section 605 reads out the coordinate data of the fixed point from the table 640. The access section 605 adds the coordinate data of new fixed points to the table 640, or changes the specific coordinate data.

The data processing section 604 outputs the input pattern data and placing data of the logical cell from the access section 604 to the display section 602. Further, the data processing section 604 outputs the data for displaying the pointer 633 to the display section 602. Furthermore, when the data processing section 604 inputs the data of the changed magnitude from the input section 603, the section 604 outputs the data to the display section 602.

The display section 602 makes the display 22 display the obstacles 631, 632, two points a,b, pointer 633 according to the input data from the data processing section 604. When the display section 602 inputs the data of the changed magnitude, the section 602 makes the pointer 633 move and display accordingly.

Figure 99:
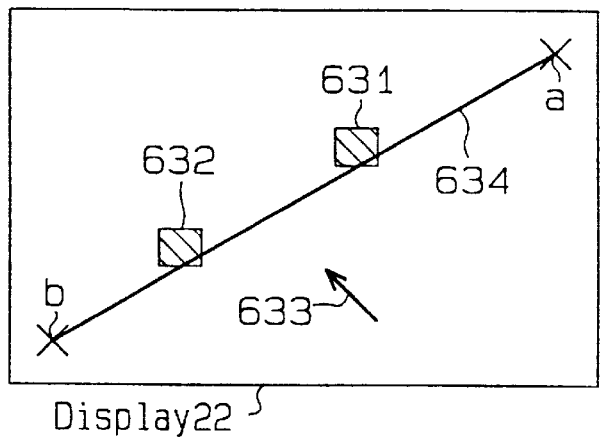

When two points a, b are set on the display 22 during the connecting wiring operation, e.g., shown in FIG. 99, the data processing section 604 generates data for displaying the rubber band 634, and outputs the data to the display section 602. The display section 602 makes the display 22 display the rubber band 634 according to the data.

As the pointer 633 is on the rubber band 634, the selected signal according to the manipulation of pressing the button 24a in input from the input section 603. Accordingly, the data processing section 604 generates data for displaying the cursors 635a, 635b which pass through the indicating point by the pointer 633, and outputs the data to the display section 602. The display section 602 makes the display 22 display the cursors 635a, 635b which pass through the indicating point by the pointer 633 according to the generated data.

Figure 105:
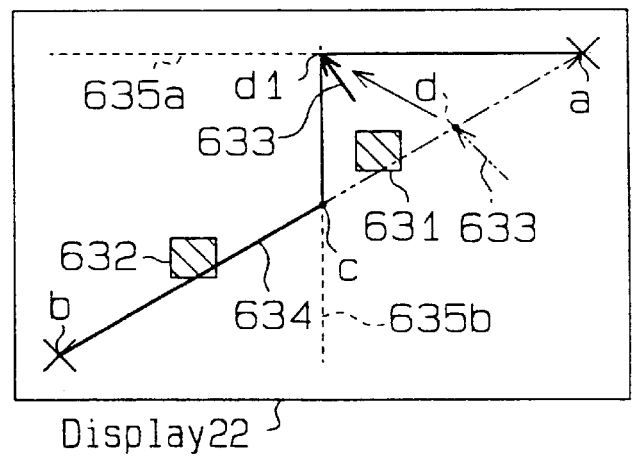

When the cursors 635a, 635b are displayed, the data of the changed magnitude according to the movement of the mouse 24 is input from the input section 603 to the data processing section 604. The data processing section 604 then generate data for re-displaying the rubber band 634 which includes the indicating point by the pointer 633 time to time, as shown in FIG. 105, and outputs the data to the display section 602. The display section 602 makes the display 22 re-display the rubber band 634 according to the data. The data processing section 604 generates data for displaying the movement of the cursors 635a, 635b according to the data indicated by the changed magnitude which is input from the data input section 603, and outputs the generated data to display section 602. The display section 602 makes the display 22 display the movement of the cursors 635a, 635b according to the input data.

When the cursors 635a, 635b are displayed, the preset signal according to the releasing manipulation of the button 24a is input from the input section 603 to the data processing section 604. The data processing section 604 sets the indicating point by the pointer at this time as a new fixed point, and reads in the coordinate data of the fixed point from the display section 602. The data processing section 604 stops outputting the cursor displaying data for displaying the cursors 635a, 635b. The display section 602 erases the cursors 635a, 635b according to the stoppage of the cursor displaying data.

Further, just before the new fixed point is to be set, the indicating point of the pointer 633 displayed on the cursor over the rubber band 634 may occasionally not match with the reference fixed point or fixed point which are stored in the table 640. In this case, the data processing section 604 outputs the control data which is used to place a new fixed point between the fixed points that are located at both ends of the line segment including the indicating point of the pointer 633, and the coordinate data of the new fixed point to the access section 605. The access section 605 stores the coordinate data of the new fixed point in the endpoint coordinate table 640 according to the input control data from the data processing section 604.

Just before the new fixed point is to be set, assume for purpose of illustration that the indicating point of the pointer 633 is indicated by the cursor on the rubber band 634. In this case, the data processing section 604 outputs the control data which converts the coordinate data of the fixed point to the coordinate data of the new fixed point, and the new converted coordinate data to the access section 605. The access section 605 stores the coordinate data of the new fixed point in the table 640 according to the input control data.

Figure 96:
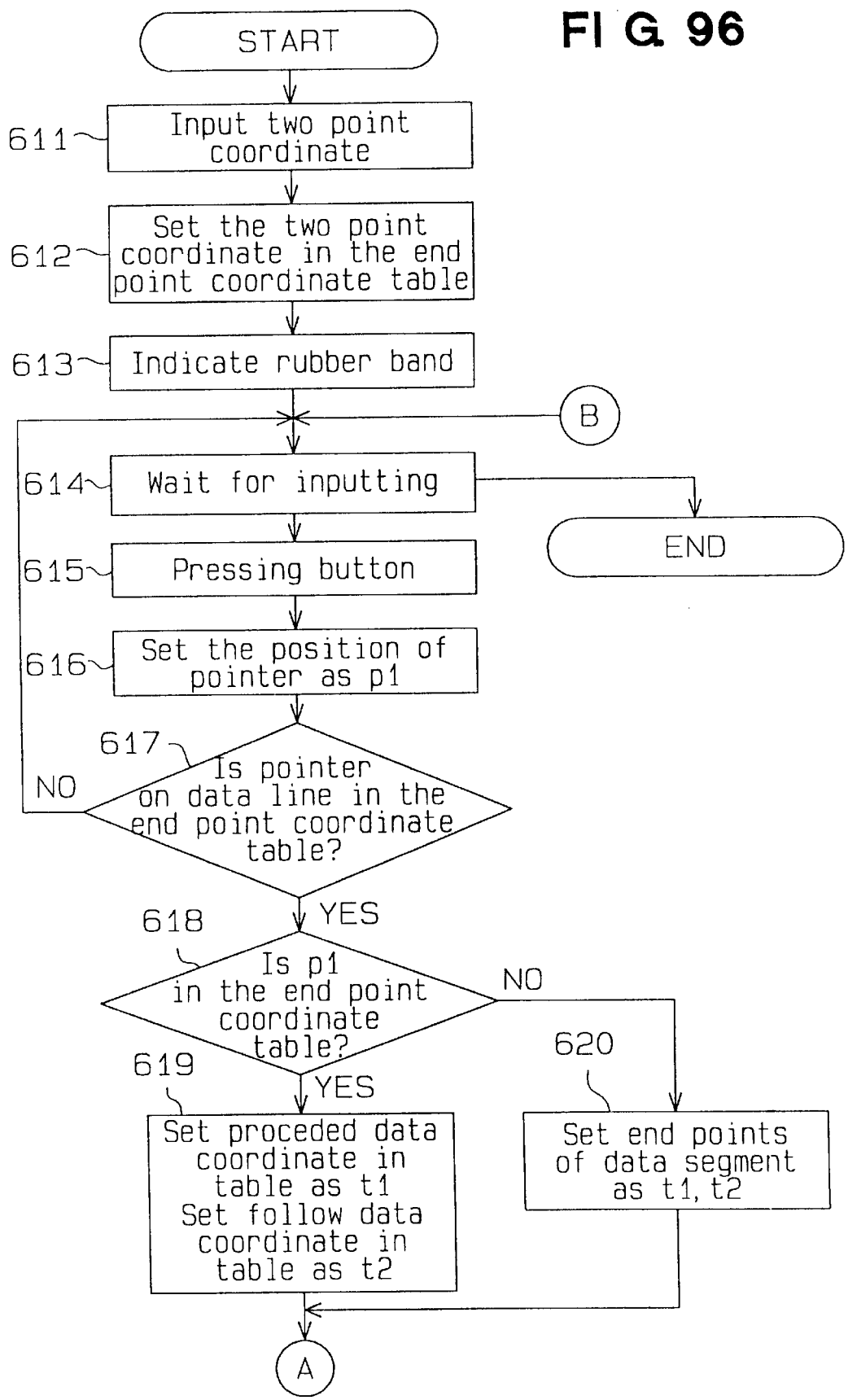
FIG. 96 and 97 are flowcharts showing the operations of the layout editor.
Figure 97:
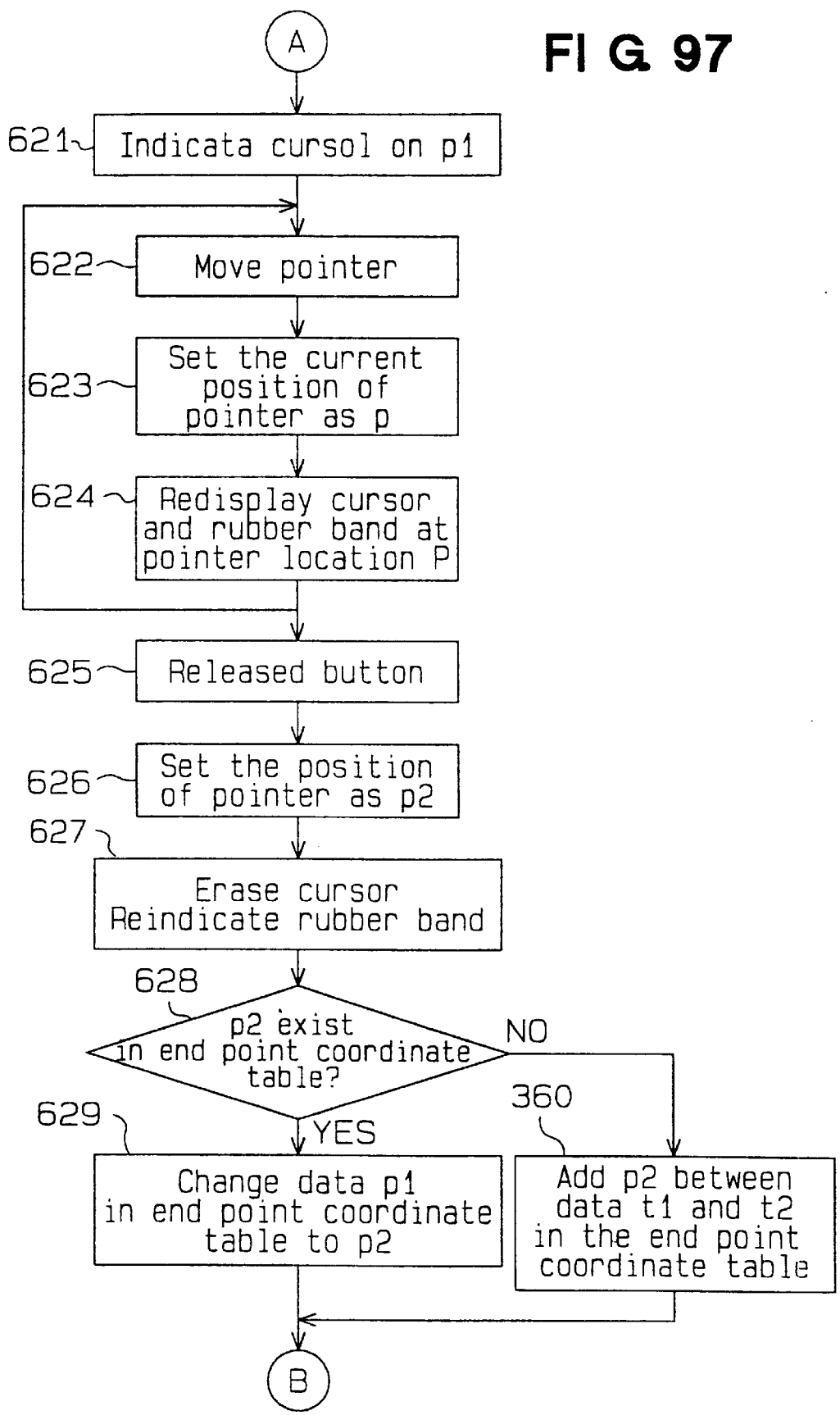

The connecting wiring operation for the layout editor 602, which has the above-described constitution, will now be described referring to FIGS. 96, 97.

The coordinate data of two points which will be connected on the display are input to the editor 601 by manipulating the mouse 24 or key board 23 in order to set the reference fixed points (step 611). The coordinate data of the two points are set in the table 640 (step 612). The rubber band is displayed according to the coordinate data stored in the table 640 (step 613).

The editor 601 is then prepared to receive input through the button 24a of the mouse 24 (step 614). When the click button 24a is pressed while the pointer is on the rubber hand (step 615), the location of the pointer at that time is set as the location p1 step (616).

The editor 601 determines then whether or not the pointer location p1 is on the data line in the table 640 (step 617). The data line is defined by the line segment which connect the pair of coordinate data disposed front-and-rear manner in the table 640. As the editor 601 determines that the pointer location p1 is not on the data line at 617, the editor 601 returns to step 614. As the editor 601 determines that the pointer location p1 is on the data line at step 611, the editor 601 determines whether or not the location p1 is in the table 640 (step 618).

As the editor 601 determines that the location p1 is in the table 640 at step 610, the editor 601 advances to step 619. As the editor 601 determines that tho location p1 is not in the table 640, the editor 601 advances to step 620. The editor 601 sets the coordinate data which are located at front and rear of the coordinate data equal to that of the pointer location p1 as t1, t2, respectively, among the data in the table 640 (step 619). The editor 601 sets the coordinate data of both end points of the data line including the pointer location p1 as t1, t2, among the data in the table 640 (step 620).

A pair of horizontally and vertically extending cursors which are passing through the pointer location p1 are displayed (step 621).

When the pointer is moved (step 622), the editor 601 sets the current location as the location p (step 623). A pair of horizontally and vertically extending cursors which are passing through the pointer location p, and the rubber band including the pointer location p are re-displayed (step 624). The rubber band where either two points t1, t2 set at step 619, or two points t1, t2 set at step 620 are connected with the pointer location p, is re-displayed.

When the button 24a is released (step 624), the editor 601 sets the pointer location at that time as the location p2 (step 626). The cursors displaying at the pointer location p2 are erased, and the rubber band including the pointer location p2 is re-displayed (step 627).

The editor 601 determines whether or not the pointer location p1 at step 616 is in the table 640 (step 628).

As the editor 601 determines the location p1 in the table 640 at step 628, the editor 601 advances to step 629. As the editor 601 determines the location p1 is not in 76-the table 640, the editor 601 advances to step 630. The coordinate data p1 in the table 640 is changed into the coordinate data p2 (step 629). The editor 601 adds the coordinate data p2 between the endpoint coordinate data t1, t2 set at step 620 among the data in the table 640 (step 630).

The editor 601 returns to step 614 after the operation of either step 629 or 630 completed. The editor 601 then becomes the stand-by condition for input. If no input, the editor 601 terminates the operation.

Figure 98:
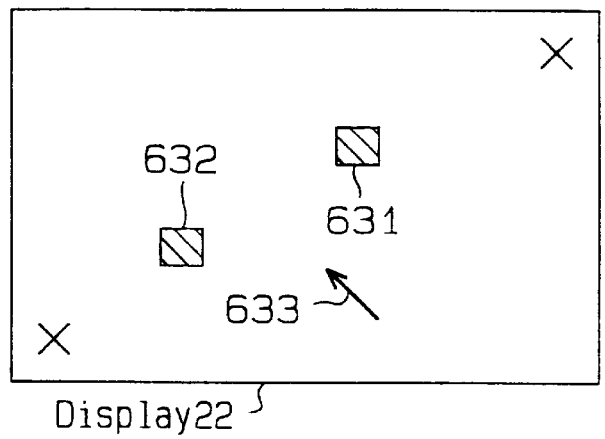
FIGS. 98 through 107 are explanatory diagrams showing the lining steps.
Figure 108:
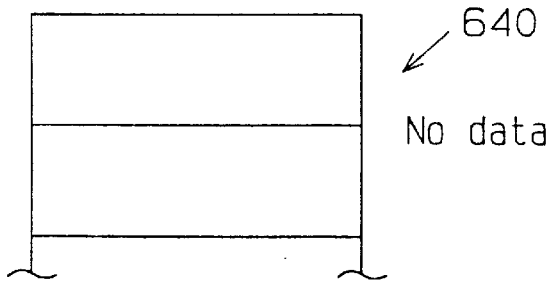
FIGS. 108 through 113 are explanatory diagrams showing line segment endpoint movement during the operations for setting the line paths according to the exchange in the line endpoint coordinates.

For example, assume that the obstacles 631, 632, and the pointer 633 are displayed on the display 22 before the connection wiring operation is carried out, as shown in FIG. 98. In this case, the table 640 holds no coordinate data as shown in FIG. 108.

Figure 109:
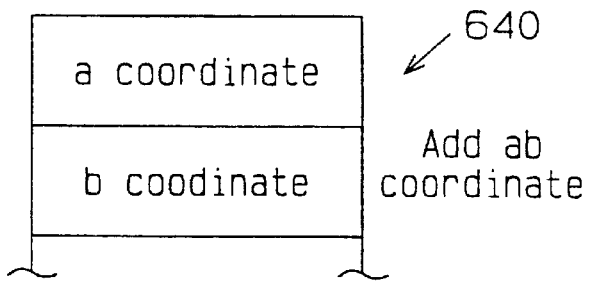

As shown in FIG. 99, as two points a, b, are set on the display 22 as the reference fixed points, the rubber band 634, connecting the points a and b, is displayed. At the same time, as shown in FIG. 109, the coordinate data of the points a and b, are set in the table 640.

As shown in FIG. 100 the pointer 633 is moved to a point c on the rubber band 634, and the button 24a is pressed. The horizontally and vertically extending cursors 635a, 635b which are passing through the point c are displayed.

Figure 110:
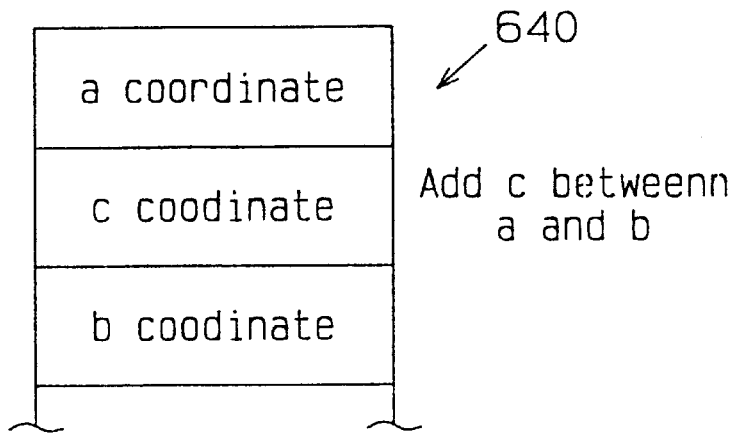

At the above-described condition, as the button 24a is released, the point c is set as the fixed point, and the cursors 635a, 635b are simultaneously erased. As the point c in on the line segment ab when the button 24a is pressed, the editor 601 adds a point c between the points a, b, and stores the coordinate data of the point c in the table 640 as shown in FIG. 110.

Figure 102:
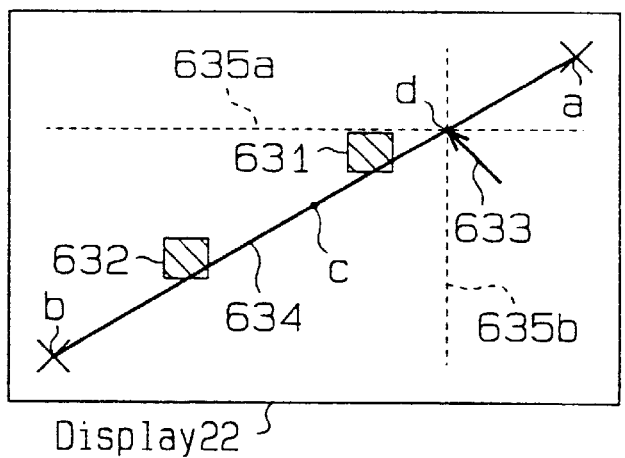

As shown in FIG. 102, as the pointer 633 is moved to a point d on the rubber band 634 and the button 24a is pressed, the horizontally and vertically extending cursors 635a, 635b which are passing through the point d are displayed.

Figure 103:
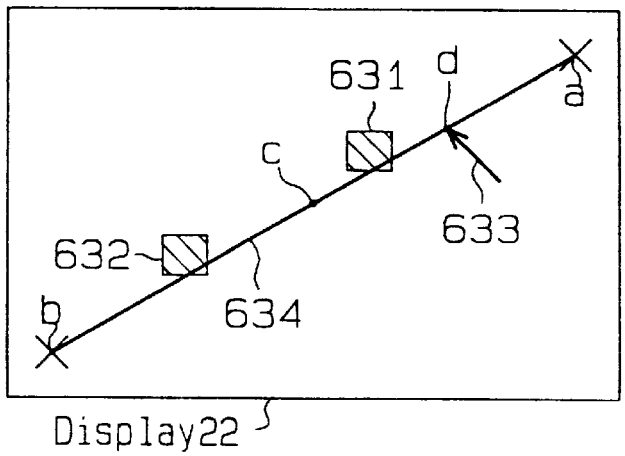
Figure 111:
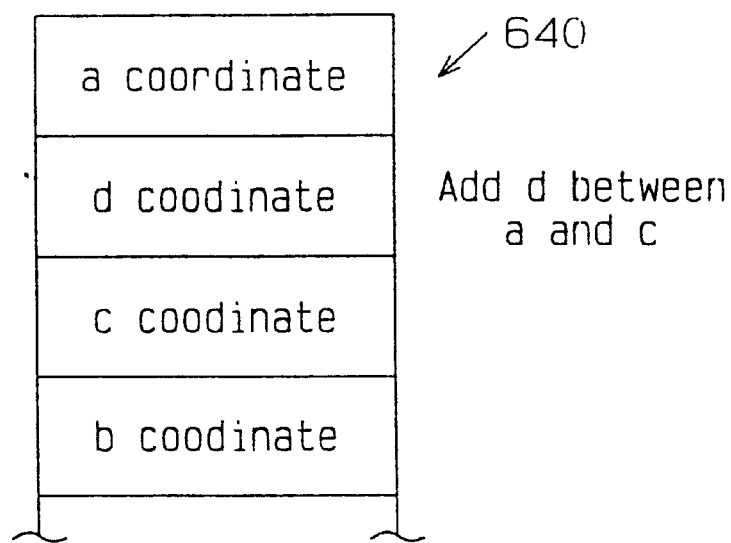

As the button 24a is released from the above-described condition, the editor 601 sets the point d as the fixed point, and the cursors 635a, 635b are erased at the same time, as shown in FIG. 103. When the point d is on the line segment ac as the button 24a is pressed, the editor 601 adds the point d between the points a and c, and stores the coordinate data of the point d in the table 640, as shown in FIG. 111.

Figure 104:
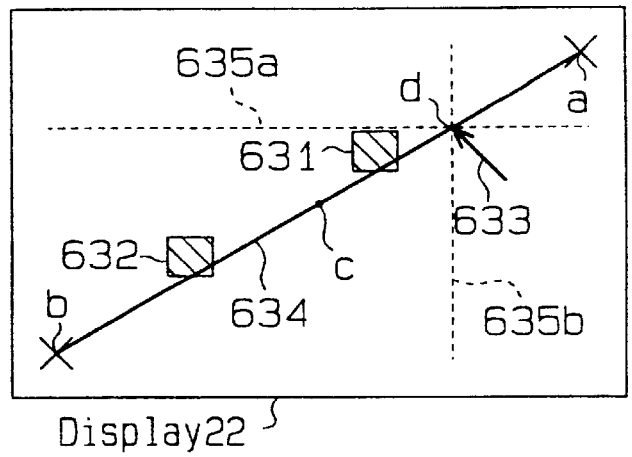

As shown in FIG. 104, the pointer 633 is moved to the point d on the rubber band 634 and the button 24a is pressed, the horizontally and vertically extending cursors 635a, 635b which are passing through the point d are displayed.

Figure 112:
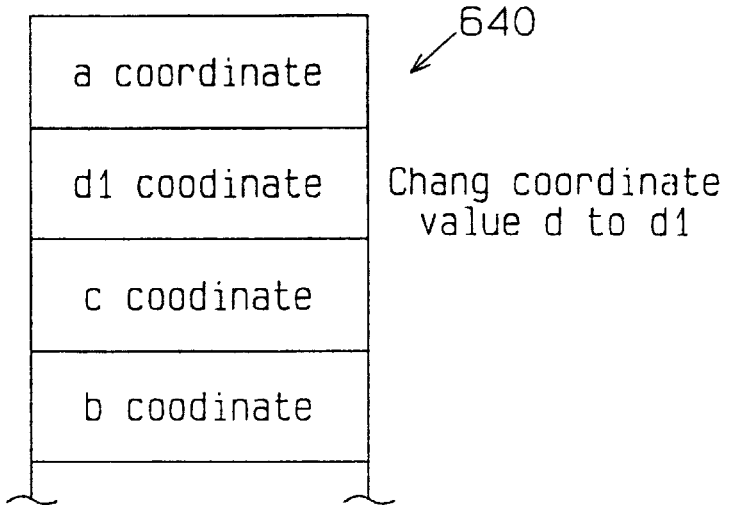

When the mouse 24 is moved while the button 24a is in the pressed condition from the above-described condition as shown in FIG. 105, the pointer 633 is moved along the motion of the mouse 24. Accordingly, the cursors 635a, 635b are also moved along the motion of the pointer 633. The rubber band 634 including the pointer location is re-displayed. As the pointer 633 is moved to the point d and the button 24a is release d, the editor 601 sets the point d as the fixed point, and simultaneously erases the cursors 635a, 635b. When the point d is in the table 640 as the button 24a pressed, the coordinate data of the point d in the table 640 is changed to the coordinate data of the point d1, as shown in FIG. 112. The-rubber band 634 where the points a and d1, and the points d1 and c are connected is re-displayed.

Figure 106:
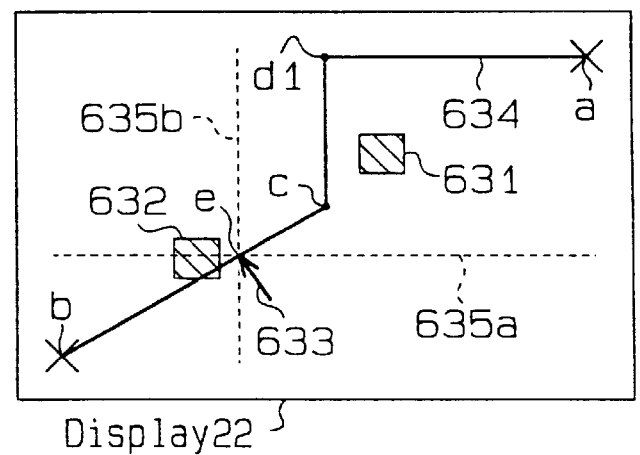

As shown in FIG. 106, when the pointer 633 is moved to a point e on the rubber band 634 and the button 24a is pressed, the horizontally and vertically extending cursors 635a, 635b which are passing through the point e are displayed.

Figure 107:
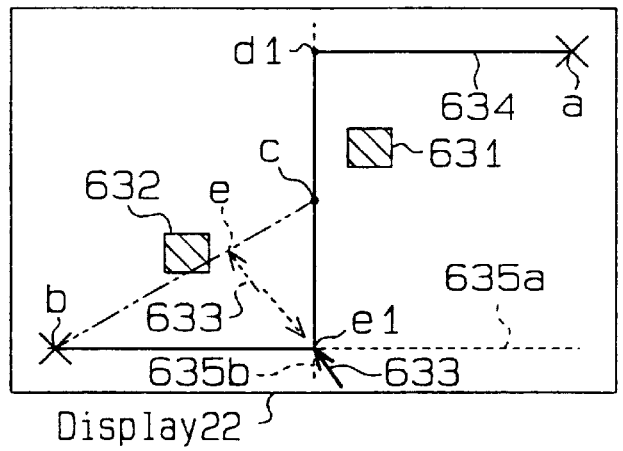
Figure 113:
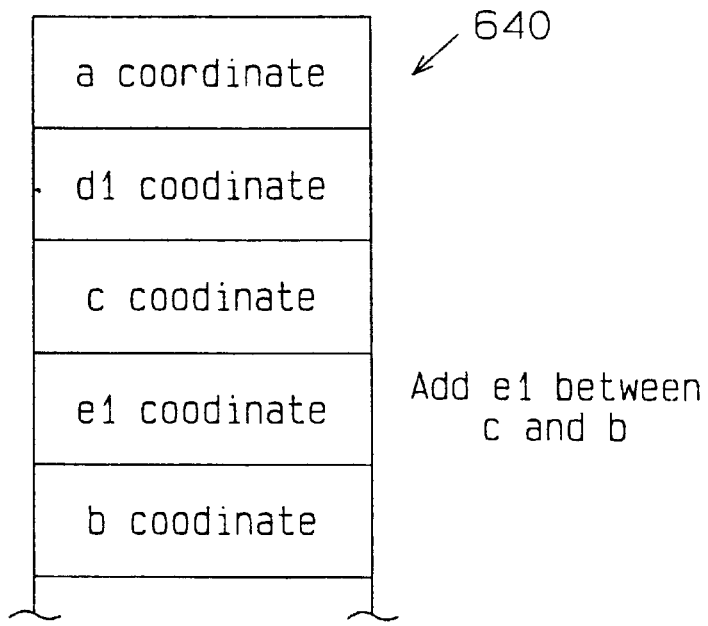

As the mouse 24 is moved while the button 24a is in the pressed condition from the above-described condition as shown in FIG. 107, the pointer 633 is also moved along the motion of the mouse 24. The cursors 635a, 635b are moved along the motion of the pointer 633. The rubber band 633 including the pointer location is re-displayed. When the pointer 633 is moved to a point e1 and the button 24a is released, the editor 601 sets the point e1 as the fixed point, and the cursors 635a, 635b are simultaneously erased. As the point e1 is on the line segment cb when the button 24a is pressed, the point e1 is added between the points c and b, and is stored as a coordinate in the table 640, as shown in FIG. 113. The rubber band 634 where the points c and e1, and the points e1 and b are connected is then re-displayed.

Accordingly, in this embodiment, while the cursors are displayed and the pointer to moved, the editor redisplays the rubber band. The point where the cursors coincide with the rubber band is set as a fixed point. Accordingly, a part of the rubber band is divided into the horizontal and vertical portions. As these operations are repeatedly carried out, the divided points are connected by the horizontal and vertical lines. During the connecting wiring operation, when the re-displayed rubber band overlaps the obstacles, one point of the rubber band on the obstacle is selected by the pointer, the pointer is moved and the rubber band which does not overlap the obstacles is re-displayed. The point which the rubber band does not overlap the obstacle is set as the fixed point. Therefore, the parted two points are connected by the horizontal and vertical lines. Accordingly, the canceling manipulation for the horizontal and vertical lines is eliminated to reduce the number of useless lines. As a result, even when two point to be connected are parted for each other, or a number of obstacles exist between two points to be connected, work efficiency of the connecting wiring operation can be improved.

Figure 114:
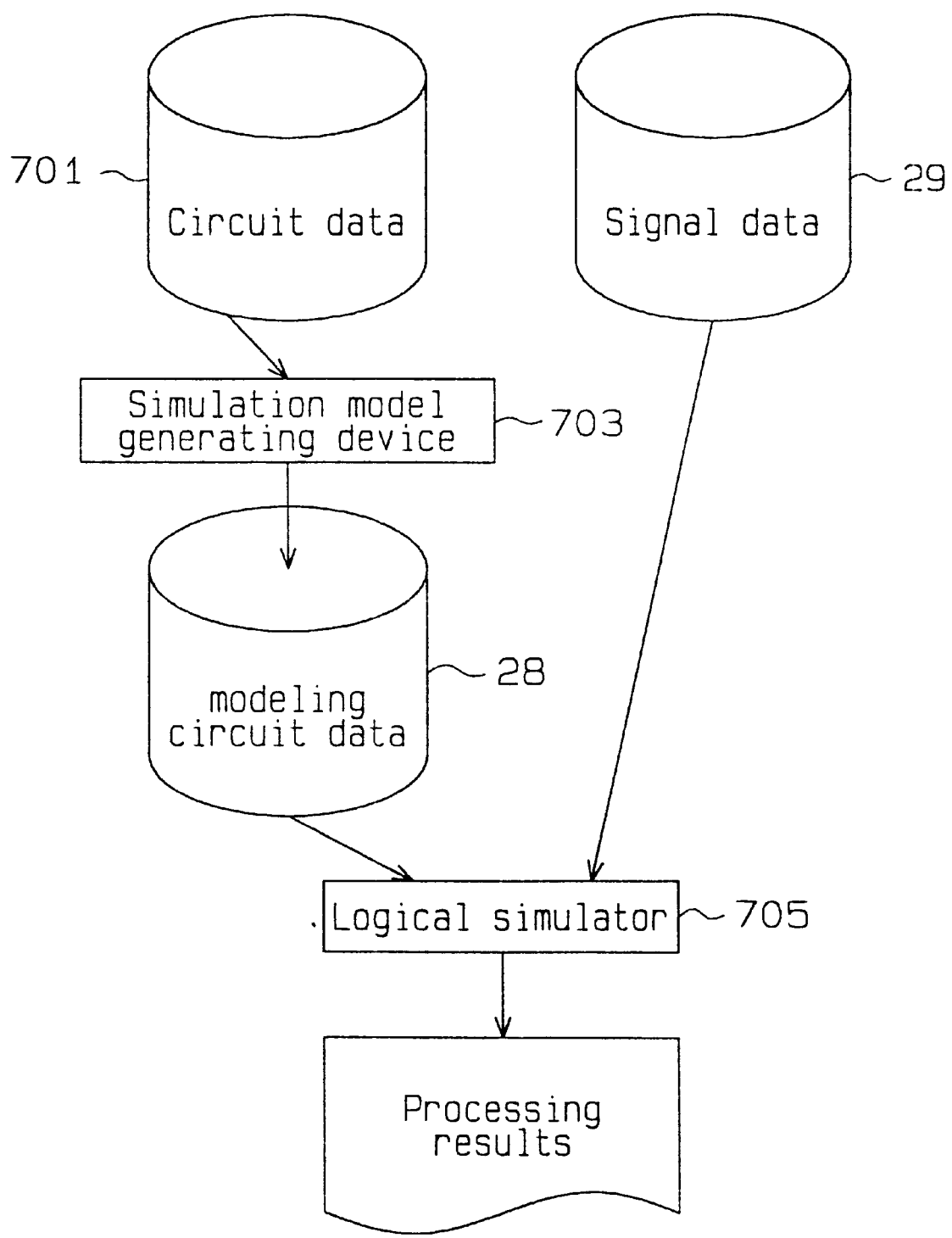
FIG. 114 is a schematic showing a logic simulator.

FIGS. 114 through 122 show one preferred example of the generation of simulation model for a logical simulation of an LSI. FIG. 114 shows the schematic constitution of a logic simulation apparatus which includes a circuit data file 701, a signal data file 29, a simulation model generating device 703, a modeling circuit data file 28 and a logic simulator 705.

Figure 117:
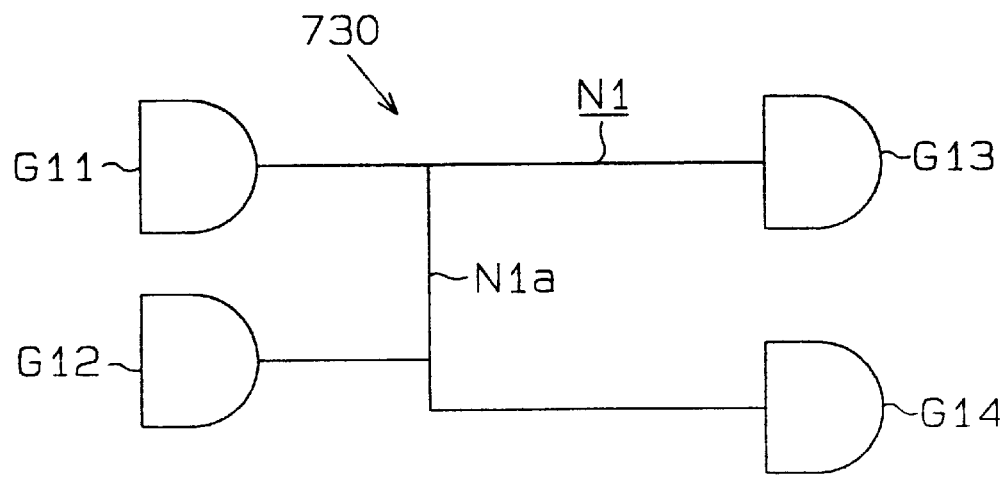
FIG. 117 is a circuit diagram of a logic circuit illustrating a dot wiring net.
Figure 121:
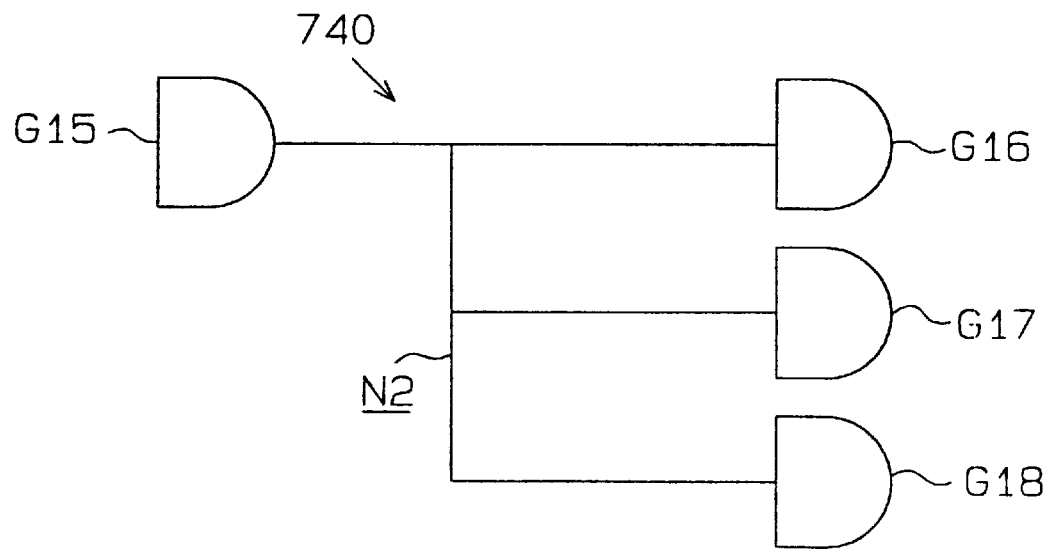
FIG. 121 is a circuit diagram showing the wiring configuration of a logic circuit.

Stored in the circuit data file 701 is data of a real circuit which includes of many logic gates, nets, etc. which form an LSI. FIGS. 117 and 121 respectively illustrate real circuits 730 and 740 which are examples of real circuit data stored in the circuit data file 701. The real circuit 730 shown in FIG. 117 includes data of output logic gates G11 and G12, input logic gates G13 and G14, and a net N1 which connects the output terminals of the logic gates G11 and G12 to the input terminals of the logic gates G13 and G14. The real circuit 740 shown in FIG. 121 includes data of an output logic gate G15, input logic gates G16 to G18, and a net N2 which connect the output terminal of the logic gate G15 to the input terminals of the logic gates G16 to G18. Stored in the signal data file 29 is signal data which is to be input to this LSI to check the operation thereof.

Figure 115:
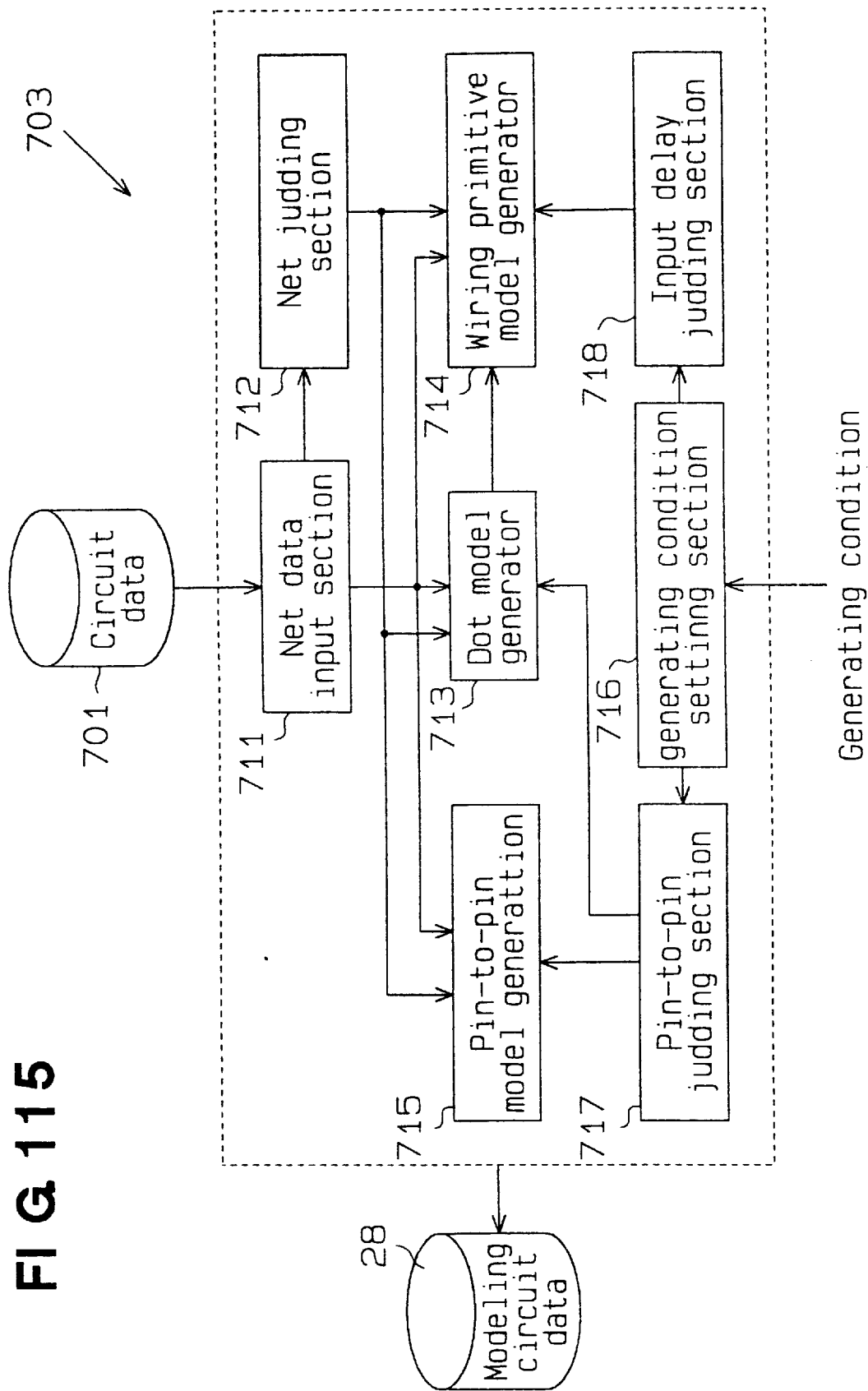
FIGS. 115 is a block diagram showing a simulation model generator.

The simulation model generating device 703 includes a net data input section 711, a net judging section 712, a dot model generator 713, a wiring primitive model generator 714, a pin-to-pin model generator 715, a generating condition setting section 716, a pin-to-pin judging section 717 and an input delay judging section 718, as shown in FIG. 115.

The net data input section 711 receives data of, for example, the real circuit 730 as shown in FIG. 117 from the circuit data file 701. The net data input section 711 outputs the receives real circuit data to the net judging section 712, the dot model generator 713, the wiring primitive model generator 714 and the pin-to-pin model generator 715.

The net judging section 712 judges whether or not the net input from the net data input section 711 is a dot net for connecting a plurality of output terminals. With regard to the real circuit 730 shown in FIG. 117, therefore, the net N1 is judged as a dot net. With regard to the real circuit 740 shown in FIG. 121, therefore, the net N2 is not judged as a dot net.

Generating conditions for modeling each net are set in the generating condition setting section 716 from the logic simulator 705. The generating conditions include a delay condition to specify whether a delay can be set to the input terminals of the simulation model and whether or not a pin-to-pin generating condition is to be set. The pin-to-pin generating condition specifies the generation of a single simulation model having a plurality of input terminals and a plurality of output terminals when the net is a dot net. For each input terminal or each output terminal of this simulation model, a delay between the input terminal and the output terminal can be set.

The pin-to-pin judging section 717 determines if the generating condition setting section 716 sets a pin-to-pin generating condition, and outputs the result to the dot model generator 713 and the pin-to-pin model generator 715.

The input delay judging section 718 determines if the generating condition setting section 716 sets a delay to an input terminal, and outputs the result to the wiring primitive model generator 714.

The dot model generator 713 receives the judgement result from the net judging section 712, the judgement result from the pin-to-pin judging section 717, and the net data from the net data input section 711. When the net is a dot net and the generating condition is not a pin-to-pin generating condition, the dot model generator 713 generates a plurality of dot models corresponding to the net data. Each dot model has a plurality of input terminals associated with the individual output terminals of the dot net, and one output terminal. Each dot model is designed to permit a circuit delay to be set to the output terminal and permit a wiring delay to be set to the individual input terminals.

The wiring primitive model generator 714 receives the result from the net judging section 712, the result from the input delay judging section 718 and net data from the net data Input section 711. When no delay is given to the input terminals of the simulation model, the wiring primitive model generator 714 generates a wiring primitive model corresponding to the net data. This wiring primitive model has one input terminal and a plurality of output terminals, and is designed to permit a delay to be set to each output terminal.

The pin-to-pin model generator 715 receives the result from the net judging section 712, the judgement result from the pin-to-pin judging section 717, and net data from the net data input section 711. When the net is a dot net and a pin-to-pin generating condition is set, the pin-to-pin model generator 715 generates a pin-to-pin dot model corresponding to the net data. This pin-to-pin dot model has a plurality of input terminals and a plurality of output terminals, and designed to permit a circuit delay between each input terminal and each output terminal to be set to each input terminal or each output terminal.

The logic simulator 705 receives modeling circuit data from the modeling circuit data file 28 and signal data from the signal date file 29. Based on both data, the logic simulator 705 runs a logic simulation and outputs the processing result.

Figure 116:
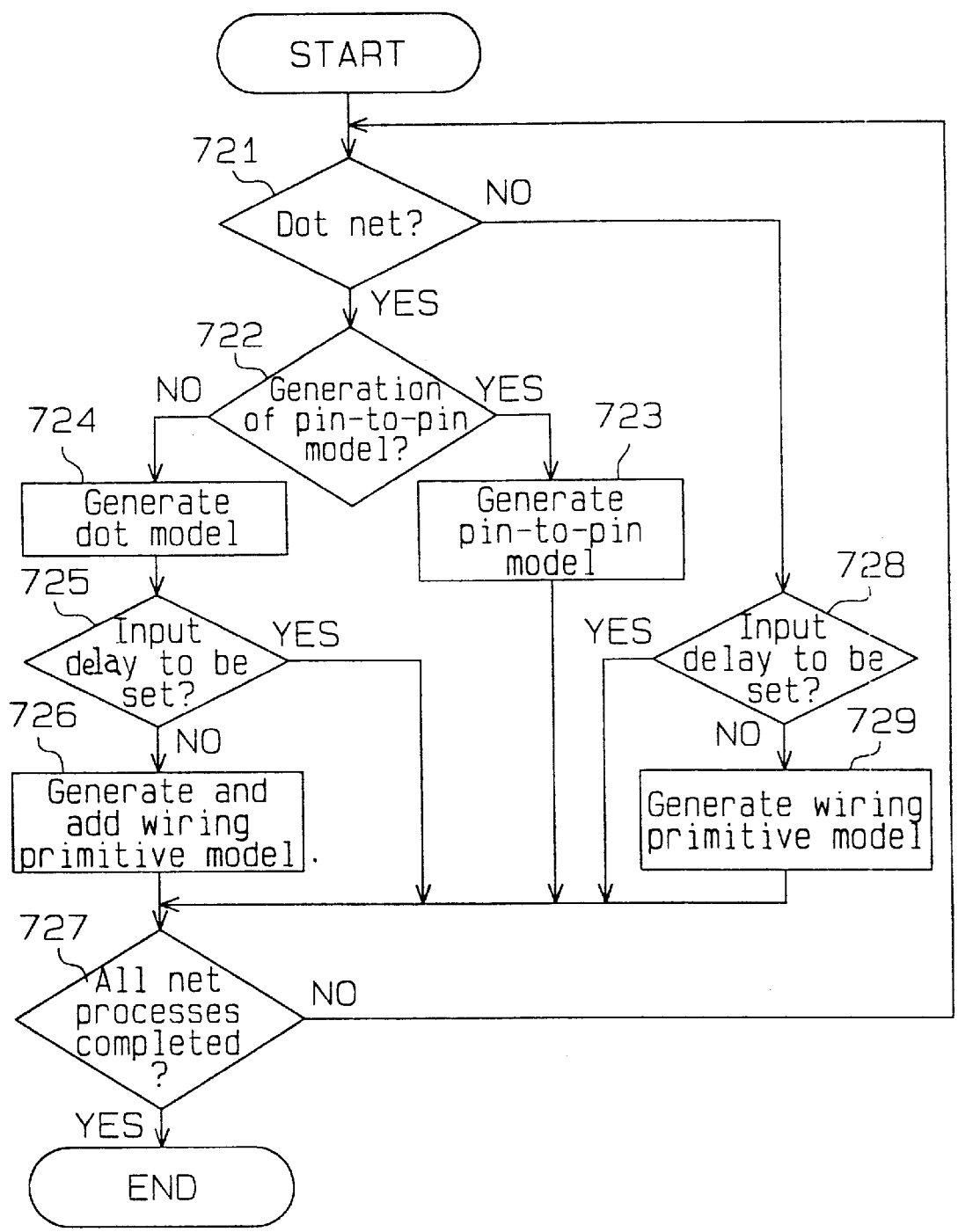
FIG. 116 is a flowchart showing the operations of the simulation model generator.

A description will now be given of the process the simulation model generating device 703 executes, with reference to FIG. 116.

First, in step 721, the wiring net judging section 712 judges whether or not the input net data is a dot net. When it is the dot net, the flow advances to step 722 where the pin-to-pin judging section 717 judges whether or not the generating condition for a simulation model is a pin-to-pin generating condition is set, the pin-to-pin model generator 715 generates a pin-to-pin dot model, and the flow then advances to step 727.

If it is not judged in step 722 that a pin-to-pin generating condition is not set, the dot model generator 713 generates a dot model in step 724.

In subsequent step 725, the input delay determining section 718 determines if the simulation model should deal with a delay for the input terminals. When it is judged in the step 725 that a delay is set for the input terminals, the flow advances to step 727. When it is determined in step 725 that no delay is to be set for the input terminals, on the other hand, the flow advances to step 726. In step 726, the wiring primitive model generator 714 generates a wiring primitive model, which is added to the dot model generated in step 724.

When it is determined in step 721 that the input net data is not a dot net, the flow goes to step 728 where the input delay determining section 718 determines whether or not the simulation model to be generated should involve a delay for the input terminals. When it is decided in this step 728 that a delay for the input terminals should be set, the flow advances to step 727. When it is judged in step 728 that no delay for the input terminals is to be set, the wiring primitive model generator 714 generates a wiring primitive model in step 729 before the flow advances to step 727.

In step 727, it is judged if all the nets in the circuit data of the LSI have been processed. If there is any unprocessed net, the above-described sequence of processes starting from step 721 is repeated. When it is judged in step 727 that all the nets have been processed, the processing will be terminated.

Figure 118:
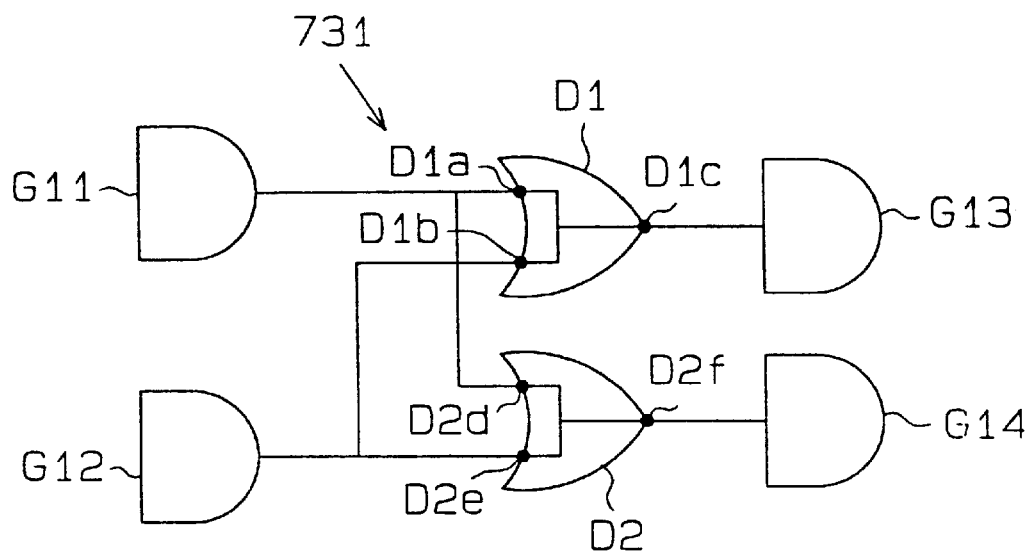
FIGS. 118 through 120 are diagrams showing logic circuits illustrating a dot model wiring configuration, pin to pin connected configuration, and primitive circuit model, respectively.

Suppose that the real circuit 730 shown in FIG. 117 is input as net data and the condition for generating a simulation model is not for a pin-to-pin model. In this case, as the net N1 is a dot net, the dot model generator 713 generates two dot models D1 and D2, and the real circuit 730 becomes modeling circuit data 731 as shown in FIG. 118. The dot model D1 has two input terminal D1$a$ and D1$b$, which are respectively connected to the output terminals of the logic gates G11 and G12, and one output terminal D1$c$ to be connected to the input terminal of the logic gate G13. The dot model D2 has two input terminals D2$d$ and D2$e$ to be respectively connected to the output terminals of the logic gates G11 and G12, and one output terminal D2$f$ to be connected to the input terminal of the logic gate G14.

Figure 119:
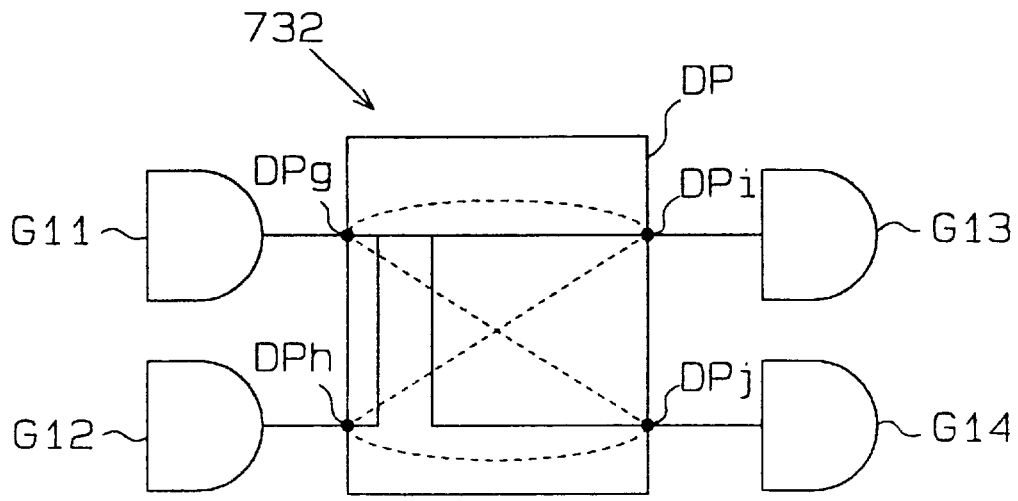

Suppose that the real circuit 730 shown in FIG. 117 is input as net data and the condition for generating a simulation model is for a pin-to-pin model. In this case, when the net N1 is a dot net, the pin-to-pin model generator 715 generates a single pin-to-pin dot model DP, and the real circuit 730 becomes modeling circuit data 732 as shown in FIG. 119. The pin-to-pin dot model DP has two input terminals Dpi and Dpj, connected to the output terminals of the logic gates G11 and G12 respectively, and two output terminals D1$i$ and D1$j$ connected to the input terminals of the logic gates G13 and G14 respectively.

Figure 122:
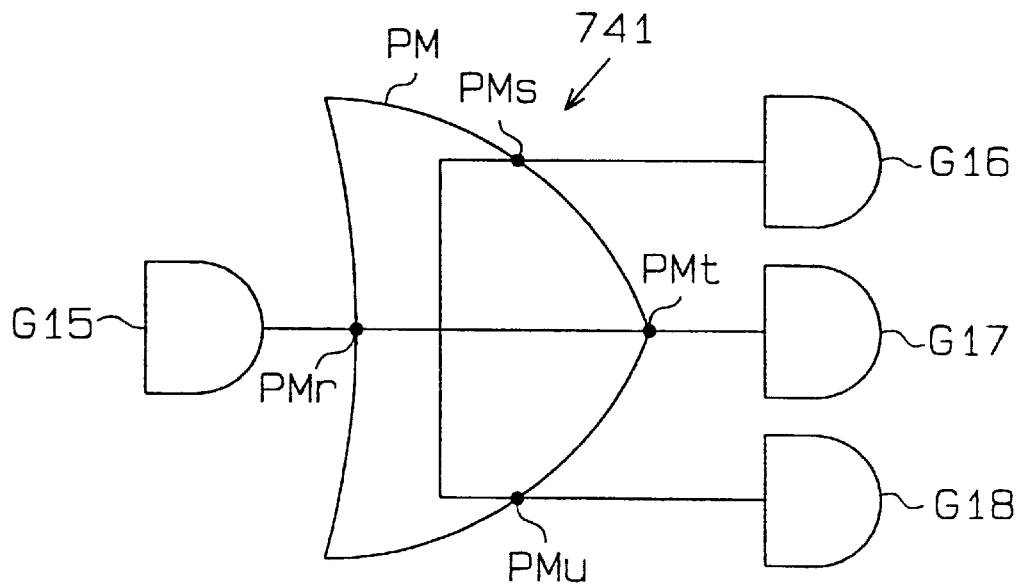
FIG. 122 is a diagram showing a primitive circuit model.

Suppose that the real circuit 740 shown in FIG. 121 is input as net data, the condition for generating a simulation model does not involve the setting of a delay to the input terminals. A pin-to-pin model may be or may not be selected for another condition for generating the simulation model. In this case, when the net N2 is not a dot net, the wiring primitive model generator 714 generates a single wiring primitive model F, and the real circuit 740 becomes modeling circuit data 741 as shown in FIG. 122. The wiring primitive model P has one input terminal PMr to be connected to the output terminal of the logic gate G15 and three output terminals PMs, PMt and PMu to be respectively connected to the input terminals of the logic gates G16, G17 and G18.

Suppose that the real circuit 730 shown in FIG. 117 is input as net data, and that the condition for generating a simulation model is not for a pin-to-pin model and does not involve the setting of a delay. In this case, the dot model generator 713 generates two dot models D1 and D2 while the wiring primitive model generator 714 generates two wiring primitive models PM1 and PM2, and the real circuit 730 is modeled with circuit data 733 at shown in FIG. 120. The wiring primitive model PM1 has one input terminal PM1$k$ to be connected to the output terminal of the logic gate G11 and two output terminals PM1$l$ and PM1$m$ to be respectively connected to the input terminals D1$a$ and D2$d$ of the dot models D1 and D2. The wiring primitive model PM2 has one input terminal PM2$n$ to be connected to the output terminal of the logic gate G12 and two output terminals PM2$o$ and PM2$p$ to be respectively connected to the input terminals D1$b$ and D2$e$ of the dot models D1 and D2.

The wiring in the net N1 of the real circuit 730 shown in FIG. 117 has different lengths for different connections of the logic gates, i.e., the wiring lengths from the logic gate G11 to the logic gate G13, from the logic gate G11 to the logic gate G14, from the logic gate G12 to the logic gate G13, and from the logic gate G12 to the logic gate G14 differ from one another. Further, the output from logic gates G11 and G12 have different driving powers, and the input to logic gates G13 and G14 have different input capacitances. Thus, the wiring delay would be:

$$G11 \rightarrow G13 \neq G11 \rightarrow G14 \neq G12 \rightarrow G13 \neq G12 \rightarrow G14$$

where
- G11→G13: delay value of the wiring from the logic gate G11 to the logic gate G13,
- G11→G14: delay value of the wiring from the logic gate G11 to the logic gate G14,
- G12→G13: delay value of the wiring from the logic gate G12 to the logic gate G13, and
- G12→G14: delay value of the wiring from the logic gate G12 to the logic gate G14.

Likewise, the wiring in the net N2 of the real circuit 740 shown in FIG. 121 have different lengths for different connections of the logic gates, i.e., the wiring lengths from the logic gate G15 to the logic gate G16, from the logic gate G15 to the logic gate G17, and from the logic gate G15 to the logic gate G18 differ from one another. Further, the output logic gates G16, G17 and G18 have different input capacitances. Thus, the wiring delay would be:

G15→G16≠G15→G17≠G15→G18 where

G15→G16: delay value of the wiring from the logic gate G5 to the logic gate G16, G15→G17: delay value of the wiring from the logic gate G15 to the logic gate G17, and G15→G18: delay value of the wiring from the logic gate G15 to the logic gate G18.

Thus, the logic simulator; which permits circuit delays to be set to the output terminals of the logic gates or simulation models and which permits a wiring delay to be set to the input terminals thereof, is defined as a primitive full input/output terminal delay simulator. The primitive full input/output terminal delay simulator cannot therefore distinguish from which input terminal a signal has been sent.

This primitive full input/output terminal delay simulator generates the modeling circuit data 731 shown in FIG. 118 corresponding to the real circuit 730 shown in FIG. 117. If the values of the individual wiring delays G11→G13, G11→G14, G12→G13 and G12→G14 in the real circuit 730 are set to the individual input terminals D1$a$, D1$b$, D2$d$ and D2$e$ of the dot models D1 and D2, the delays can be expressed route by route.

More specifically, the delays are set as follows.

D1$c$=0

D2$c$=0 input terminal of G13=0 input terminal of G14=0

D1$a$=G11→G13

D1$b$=G12→G13

D2$d$=G11→G14

D2$e$=G12→G14 where

D1$a$: is the delay value of input terminal a of model D11,

D1$b$: is the delay value of input terminal b of model D11,

D1$c$: is delay value of input terminal c of model D11,

D2$d$: is the delay value of input terminal d of model D12,

D2$e$: is delay value of input terminal e of model D12, and

D2$f$: is the delay value of input terminal f of model D12.

Further, the logic simulator, which permits circuit delays to be set to the output terminals of the logic gates or simulation models, is defined as a primitive output terminal delay simulator. The primitive output terminal delay simulator cannot therefore distinguish from which input terminal a signal has been sent.

This primitive output terminal delay simulator generates the modeling circuit data 741 shown in FIG. 122 corresponding to the real circuit 740 shown in FIG. 121. If the values of the individual wiring delay G15→G16, G15→G17, and G15→G18 in the real circuit 740 are set to the individual output terminals PMs, PMt and PMu of the wiring primitive model P, the delays can be expressed route by route.

More specifically, the delays are set as follows:

PMs=G15→G16

PMt=G15→G17

PMu=G15→G18 where

PMs: is the delay value of output terminal PMs of wiring primitive model PM,

PMt: is the delay value of output terminal PMt of wiring primitive model PM, and PMu: is the delay value of output terminal PMu of wiring primitive model PM.

Figure 120:
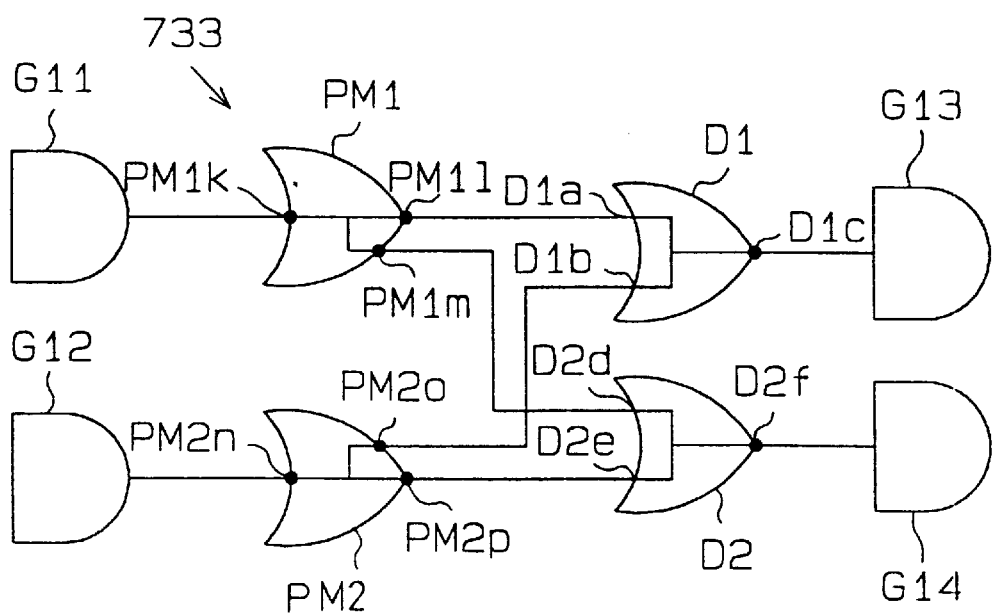

The primitive output terminal delay simulator also generates the modeling circuit data 733 shown in FIG. 120 corresponding to the real circuit 730 shown in FIG. 117, If the values of the individual wiring delays G11→G13, G11→G14, G12→G13 and G12→G14 in the real circuit 730 are set to the individual output terminals PM1$l$, PM1$m$, PM2$o$ and PM2$p$ of the wiring primitive models PM1 and PM2, the delays can be expressed route by route.

More specifically, the delays are set as follows:

PM1$l$=G11→G13

PM1$m$=G11→G14

PM2$o$=G12→G13

PM2$p$=G12→G14

D1$c$=0

D2$f$=0 where

PM1$l$: is the delay value of output terminal PM1$l$ of wiring primitive model PM1

PM1$m$: is the delay value of output terminal PM1$m$ of wiring primitive model PM1, PM2$o$: is the delay value of output terminal PM1$o$ of wiring primitive model PM2

PM2$p$: is the delay value of output terminal PM1$p$ of wiring primitive model PM2, D1$c$: is the delay value of output terminal c of dot model D1, and D2$f$: is the delay value of output terminal f of dot model D2.

Further, the logic simulator, which permits a circuit delay between each input terminal and each output terminal of the logic gates or simulation models, is defined an a pin-to-pin delay simulator. The pin-to-pin delay simulator can therefore distinguish from which input terminal a signal has been sent.

For a dot net, which can permit a delay to be set to each input terminal, the pin-to-pin delay simulator generates a pin-to-pin dot model which has a plurality of input terminals and a plurality of output terminals. For instance, this simulator generates the modeling circuit data 732 shown in FIG. 117. When the values of the individual wiring delays G11→G13, G11→G14, G12→G 13 and G12→G14 in the real circuit 730 are expressed by pin-to-pin delays of pin-to-pin dot models DP, the delays can be expressed route by route.

More specifically, the delays are set an follows:

DPg=0

DPh=0 delay of input terminal of G13=0 delay of input terminal of G14=0

DPgi=G11→G13

DPhi=G12→G13

DPgj=G11→G14

DPhj=G12→G14 where

DPgi: in the delay value between input terminal DPg and output terminal DPi,

DPhi: is the delay value between input terminal DPh and output terminal Dei,

DPgj: is the delay value between input terminal DPg and output terminal DPj,

DPhj: is the delay value between input terminal DPh and output terminal DPj,

DPg: is the delay value of input terminal DPg, and

DPh : is the delay value of input terminal DPh.

For a net other than a dot net, which cannot allow a delay to be set to each input terminal, the pin-to-pin delay simulator generates a single wiring primitive model (see FIG. 122) which has a single input terminal and a plurality of output terminals. Accordingly, route-by route delays can be expressed.

As described above, the simulation model generating device according to this embodiment can generate a proper simulation model which allows delay values to be set to every combination of the input terminals and output terminals of a net, i.e., route by route, in accordance with the type of the logic simulator. Therefore, real logic simulation can be performed using this simulation model, thus improving the precision of LSI circuits.

What is claimed is:

1. An apparatus for manufacturing a semiconductor integrated circuit device comprising:

a data input means for generating a general wiring net data for connection of a plurality of input and output terminals of a plurality of logic cells and for generating delay time data relating to signals from the output terminals to the input terminals, said general wiring net data comprising a first wiring net data for connecting the plurality of output terminals to at least one of the input terminals and a second wiring net data for connecting a single output terminal to the plurality of input terminals, said first wiring net data being combined with said delay time data for generating a first simulation design model, said first wiring net data being used for generating a second simulation design model, and said second wiring net data being used for generating a third simulation design model;

a first determining means for distinguishing which one of said first and second wiring net data is input from said data input means;

a selecting means for selecting one of said simulation design models in accordance with a determination of said first determining means;

a first model generating means for generating said first simulation design model based on said first wiring net data and said delay time data when said selecting means selects said first simulation design model;

a second model generating means for generating said second simulation design model based on said first wiring net data when said selecting means selects said second simulation design model; and a third model generating means for generating said third simulation model based on said second wiring net data when said first determining means determines that said wiring net data is said second wiring net data.

2. An apparatus for manufacturing a semiconductor integrated circuit device according to claim 1, wherein said first model generating means comprises:

an intermediate gate generating means for generating an intermediate gate between said output terminals and input terminals of said plurality of logic cells, said intermediate gate having the same number of gate input terminals as said output terminals of said logic cells and having the same number of gate output terminals as said input terminals of said logic cells; and wherein said delay time data from said output terminals to input terminals of said logic cells is set between said gate input terminals and gate output terminals.

3. An apparatus for manufacturing a semiconductor integrated circuit device according to claim 1, wherein said second model generating means comprises:

an intermediate gate generating means for generating the same number of intermediate gates as the input terminals of said logic cells, each intermediate gate having a single gate output terminal and the same number of gate input terminals as said output terminals of said logic cells; and wherein said delay time data from said output terminals and input terminals of said logic cells is set for said gate input terminals and gate output terminals of said intermediate gates.

4. An apparatus for manufacturing a semiconductor integrated circuit according to claim 1, wherein said third model generating means comprises:

an intermediate gate generating means for generating an intermediate gate, said intermediate gate having the same number of gate output terminals as said input terminals of said logic cells and the same number of gate input terminals as the output terminals of at least one of said logic cells; and wherein said gate output terminals set delay time data between said output terminals of at least one of said logic cells and said input terminals of said logic cells.

5. A method for disposing a plurality of logic cells included in a semiconductor integrated circuit device on a semiconductor chip based on a net wiring list including a plurality of wiring nets for connecting output terminals and input terminals of said logic cells to each other, the method comprising the steps of:

setting a wiring length between any pair of said terminals among said input and output terminals within a specific wiring net to a predetermined wiring length;

providing a bypass route having a specified length between said pair of terminals when the actual wiring length between said pair of terminals is less than said predetermined wiring length, the length of said bypass route corresponding to said predetermined wiring length;

disposing a dummy cell in said bypass route, said dummy cell having intermediate terminals connected with said pair of terminals; and disposing the plurality of logic cells including said dummy cell, onto said semiconductor chip in accordance with said predetermined wiring length.

6. The method according to claim 5, further comprising the steps of:

defining predetermined allocate regions for the plurality of logic cells;

computing the distance between the predetermined allocate regions and each of the plurality of logic cells; and limiting allocating each of the plurality logic cells to each of the predetermined allocate regions in accordance with the computation results.

7. The method according to claim 6, further comprising the step of determining whether each of the plurality of logic cells includes a definite coordinate value prior to the computing step, wherein the computing step includes computing the distance between the definite coordinate value and each of the predetermined allocate regions.

8. The method according to claim 5, further comprising the step of resetting a wiring length to a predetermined wiring length in the logic cells associated with at least one logic cell previously placed on the semiconductor integrated circuit.

9. The method according to claim 5, further comprising the step of updating the net wiring list when the dummy cell is disposed.

* * * * *